United States Patent
Sano et al.

(10) Patent No.: US 11,942,869 B2
(45) Date of Patent: Mar. 26, 2024

(54) POWER MODULE AND ELECTRIC POWER CONVERSION DEVICE

(71) Applicant: DENSO CORPORATION, Kariya (JP)

(72) Inventors: Tomohisa Sano, Kariya (JP); Ryota Tanabe, Kariya (JP); Yuta Hashimoto, Kariya (JP); Kazuma Fukushima, Kariya (JP); Mamoru Kuwahara, Kariya (JP)

(73) Assignee: DENSO CORPORATION, Kariya (JP)

( * ) Notice: Subject to any disclaimer, the term of this patent is extended or adjusted under 35 U.S.C. 154(b) by 570 days.

(21) Appl. No.: 17/155,174

(22) Filed: Jan. 22, 2021

(65) Prior Publication Data

US 2021/0143747 A1 May 13, 2021

Related U.S. Application Data

(63) Continuation of application No. PCT/JP2019/022918, filed on Jun. 10, 2019.

(30) Foreign Application Priority Data

Jul. 25, 2018 (JP) .................................. 2018-139476
Jan. 24, 2019 (JP) .................................. 2019-010387
(Continued)

(51) Int. Cl.
*H02M 7/00* (2006.01)
*H01L 25/18* (2023.01)
*H02M 7/537* (2006.01)

(52) U.S. Cl.
CPC ............ *H02M 7/003* (2013.01); *H01L 25/18* (2013.01); *H02M 7/537* (2013.01)

(58) Field of Classification Search
CPC ........ H02M 7/003; H02M 7/537; H01L 25/18
See application file for complete search history.

(56) References Cited

U.S. PATENT DOCUMENTS 9,231,466 B2 * 1/2016 Hayashiguchi ....... H02M 7/537
9,651,581 B2 5/2017 Ausserlechner
(Continued)

FOREIGN PATENT DOCUMENTS

JP 5170888 B2 3/2013
JP 2013-169075 A 8/2013
(Continued)

OTHER PUBLICATIONS

U.S. Appl. No. 17/154,697, filed Jan. 21, 2021 in the name of Ryota Tanabe et al.
(Continued)

*Primary Examiner* — Rafael O De Leon Domenech
(74) *Attorney, Agent, or Firm* — Oliff PLC

(57) ABSTRACT

A power module is applied to an electric power conversion device in which multiple upper-lower arm circuits are connected to an electric power line in parallel. The power module includes the multiple upper-lower arm circuits; a capacitor connected to each of the multiple upper-lower arm circuits in parallel; an upper wiring that connects an upper arm and a positive electrode terminal of the capacitor; a lower wiring that connects a lower arm and a negative electrode of the capacitor; an upper electric power wiring that is an electric power wiring connected to the electric power line and connects a high potential line of the electric power line and the upper wiring; and a lower electric power wiring that is an electric power wiring connected to the electric power line and connects a lower potential line of the electric power line and the lower wiring.

13 Claims, 40 Drawing Sheets

(30) Foreign Application Priority Data

Feb. 14, 2019 (JP) .................................. 2019-024703
Mar. 14, 2019 (JP) .................................. 2019-047418

(56) References Cited

U.S. PATENT DOCUMENTS

| | | | |
|---|---|---|---|
| 2010/0116571 A1* | 5/2010 | Suzuki | B60L 53/16 |
| | | | 903/951 |
| 2013/0119525 A1* | 5/2013 | Tsuyuno | H01L 24/37 |
| | | | 438/122 |
| 2014/0003111 A1 | 1/2014 | Ichijo et al. | |
| 2014/0160822 A1* | 6/2014 | Kuwano | B60L 50/40 |
| | | | 363/141 |
| 2014/0226376 A1 | 8/2014 | Hayashiguchi | |
| 2015/0049533 A1* | 2/2015 | Nishikimi | H05K 7/20127 |
| | | | 363/141 |
| 2019/0098777 A1* | 3/2019 | Nakatsu | H05K 5/0043 |
| 2019/0252993 A1* | 8/2019 | Uneme | H02M 7/003 |

FOREIGN PATENT DOCUMENTS

| | | |
|---|---|---|
| JP | 2013-222885 A | 10/2013 |
| JP | 2014-045035 A | 3/2014 |
| JP | 2015-012639 A | 1/2015 |
| JP | WO2014/208450 A1 | 2/2017 |
| WO | 2020/021843 A1 | 1/2020 |

OTHER PUBLICATIONS

U.S. Appl. No. 17/155,729, filed Jan. 22, 2021 in the name of Tomohisa Sano et al.

* cited by examiner

POWER MODULE AND ELECTRIC POWER CONVERSION DEVICE

CROSS REFERENCE TO RELATED APPLICATIONS

The present application is a continuation application of International Patent Application No. PCT/JP2019/022918 filed on Jun. 10, 2019, which designated the U.S. and claims the benefit of priority from Japanese Patent Application No. 2018-139476 filed on Jul. 25, 2018, Japanese Patent Application No. 2019-010387 filed on Jan. 24, 2019, Japanese Patent Application No. 2019-024703 filed on Feb. 14, 2019, and Japanese Patent Application No. 2019-047418 filed on Mar. 14, 2019. The entire disclosures of all of the above applications are incorporated herein by reference.

TECHNICAL FIELD

The present disclosure relates to a power module and an electric power conversion device.

BACKGROUND

An inverter (electric power conversion device) converts a direct voltage into an alternating voltage. This electric power conversion device includes an upper-lower arm circuit of each phase connected in parallel to an electric power line of the direct current and a smoothing capacitor smoothing a voltage of the electric power line.

SUMMARY

A power module may be applied to an electric power conversion device in which multiple upper-lower arm circuits may be connected to an electric power line in parallel. The power module may include the multiple upper-lower arm circuits; a capacitor connected to each of the multiple upper-lower arm circuits in parallel; an upper wiring that may connect an upper arm and a positive electrode terminal of the capacitor; a lower wiring that may connect a lower arm and a negative electrode of the capacitor; an upper electric power wiring that may be an electric power wiring connected to the electric power line and connects a high potential line of the electric power line and the upper wiring; and a lower electric power wiring that may be an electric power wiring connected to the electric power line and connects a lower potential line of the electric power line and the lower wiring.

BRIEF DESCRIPTION OF DRAWINGS

The above and other aspects, features and advantages of the present disclosure will become more apparent from the following detailed description made with reference to the accompanying drawings. In the accompanying drawings.

FIG. 21 is seen from an A direction;

FIG. 21 is seen from a B direction;

FIG. 21 is seen from a C direction;

FIG. 39 is seen from a D direction;

DETAILED DESCRIPTION

Figure 1:
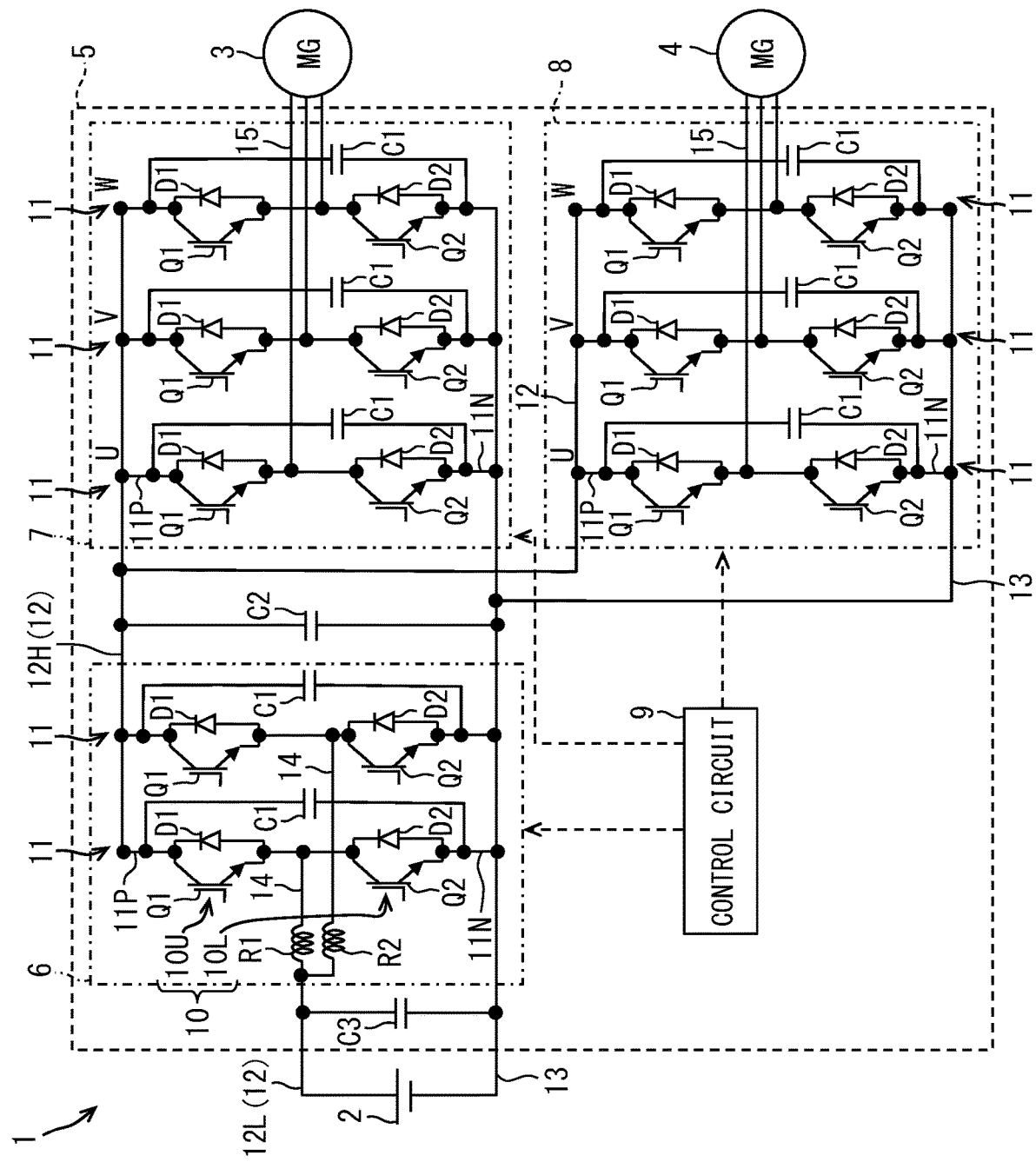
FIG. 1 is an equivalent circuit diagram showing a drive system to which an electric power conversion device according to a first embodiment is applied.

A surge voltage generated by switching of the upper-lower arm circuit increases as a current change amount (current change rate) per unit time increases or a wiring inductance increases. Then, in the electric power conversion device, electric charges required for switching the upper-lower arm circuit are supplied from a smoothing capacitor. Therefore, when a length of a wiring connecting the upper-lower arm circuit and the smoothing capacitor is shortened, it may be possible to reduce the wiring inductance related to the surge voltage and reduce the surge voltage.

For reducing an electric power loss in the electric power conversion device, the need for high-speed switching of the upper-lower arm circuit is increasing, and the need for reducing the surge voltage is also increasing. However, in a configuration of the conventional electric power conversion device, as described above, there is a limit in shortening the wiring length, and it may be difficult to further reduce the surge voltage.

One example of present disclosure provides a power module applied to an electric power conversion device, and the electric power conversion device that are capable of further reducing the surge voltage as compared with the conventional structure.

According to one example embodiment, a power module is applied to an electric power conversion device in which multiple upper-lower arm circuits are connected to an electric power line in parallel. The power module includes an upper-lower arm circuit having an upper arm and a lower arm, a capacitor connected to the upper-lower arm circuit in parallel, an upper wiring that connects the upper arm configuring the upper-lower arm circuit and a positive electrode terminal of the capacitor, a lower wiring that electrically connects the lower arm configuring the upper-lower arm circuit and a negative electrode of the capacitor, an electric power wiring connected to an electric power line, an upper wiring that connects an high potential line of the electric power line and the upper wiring, a lower electric power wiring that connects a lower potential line of the electric power line and the lower wiring, and an output wiring that connects at least one of the multiple main terminals of the upper arm and at least one of the multiple terminals of the lower arm. The output wiring includes a facing portion that faces at least one of the upper wiring or the lower wiring.

The power module forms the following closed loop circuit that does not include the electric power line. That is, in the closed loop circuit, the positive electrode terminal of the capacitor, the upper wiring, the upper-lower arm circuit, the lower wiring, the negative electrode terminal of the capacitor are connected in series in this order, and the electric power line is not included. Therefore, when the electric charge required for the switching of the upper-lower arm circuit is supplied from the capacitor, the electric charge supply path does include the electric power line. Therefore, it may be possible to shorten the wiring of the path. On the other hand, when, in the conventional structure of the prior art literature, the smoothing capacitor supplies the electric charge, an electric charge supply path from the smoothing capacitor to the upper-lower arm circuit includes the electric power line. Therefore, it may not be possible to sufficiently shorten the wiring of the path.

According to another example embodiment, as compared with the conventional structure, a power module can more easily shorten the wiring length that is one factor of the surge voltage occurrence. Accordingly, the wiring inductances related to the surge voltage can be reduced, and the surge voltage generated at the upper-lower arm circuit can be reduced. Moreover, since the closed loop circuit does not include the electric power line, it is difficult for the surge voltage to be superimposed on the self-surge voltage. Therefore, it may be possible to prevent the other upper-lower arm circuits from interfering with the surge voltage via the electric power line.

According to another example embodiment, an electric power conversion device includes an electric power line connected to multiple upper-lower arm circuits in parallel, and a power module placed for each phase. The power module placed in a first phase among the multiple phases is a first power module. The power module placed in a second phase among the multiple phases is a second power module. In the first power module, an impedance of an electric path from the positive electrode terminal to the upper arm is an in-phase upper impedance. An impedance of an electric path from the positive electrode terminal corresponding to the first power module to the upper arm corresponding to the second power module is an interphase upper impedance. The interphase upper impedance is higher than the in-phase upper impedance.

In the electric power conversion device, the power module is placed for each phase. Therefore, an effect of reducing the surge voltage by the closed loop circuit is provided for each power module of each phase. Further, an effect of preventing surge voltage interference with other upper-lower arm circuits via the electric power line is also provided for each power module of each phase.

Hereinafter, multiple embodiments will be described with reference to the drawings. In the embodiments, functionally and/or structurally corresponding parts are denoted by the same reference numerals.

First Embodiment

An electric power conversion device of the present embodiment can be applied to a vehicle such as, for example, an electric vehicle (EV) or a hybrid vehicle (HV). In the following, an example in which the electric power is applied to the hybrid vehicle will be described.

(Drive System)

A schematic configuration of a drive system to which an electric power conversion device is applied will be described with reference to FIG. 1.

As shown in FIG. 1, a drive system 1 of a vehicle includes a direct current power source 2, motor generators 3 and 4, an electric power conversion device 5 that converts electric power between the direct current power source 2 and the motor generators 3 and 4.

The direct current power source 2 is a secondary battery capable of charging and discharging such as a lithium ion battery or a nickel hydrogen battery. The motor generators 3 and 4 are three-phase alternating type rotation electric machines. The motor generator 3 functions as an electric generator alternator) that is driven by an engine (not shown) and generates electricity and functions as an electric motor (starter) that starts the engine. The motor generator 4 functions as a traveling drive source of the vehicle, that is, the electric motor. The motor generator 4 also functions as the electric generator during regeneration. The vehicle includes, as traveling drive sources, the engine and the motor generator 4.

The electric power conversion device 5 includes a converter 6, inverters 7 and 8, a control circuit portion 9, a smoothing capacitor C2, and a filter capacitor C3. The converter 6 and the inverters 7 and 8 correspond to electric power converters. The converter 6 corresponds to a DC-DC converter that converts a direct voltage into a direct voltage having a different value. The inverters 7 and 8 correspond to a DC-AC converter. Each of these electric power converter includes a parallel circuit 11 including an upper-lower arm circuit 10 and a capacitor C1

The upper-lower arm circuit 10 includes switching elements Q1 and Q2 and diodes D1 and D2. In the present embodiment, as the switching elements Q1 and Q2, a n-channel type IGBT is employed. An upper arm 10U includes the switching element Q1 and a freewheeling diode D1 connected in reverse parallel to the switching element Q1. A lower arm 10L includes the switching element Q2 and a freewheeling diode D2 connected in reverse parallel to the switching element Q2. The switching elements Q1 and Q2 are not limited to the IGBT. For example, a MOSFET can be employed. As the diodes D1 and D2, parasitic diodes can be employed.

The upper arm 10U is paced close to a VH line 12H. The upper arm 10U and the lower arm 10L are connected in series between the VH line and a N line 13. A P line 12 is an electric power line on the high potential side, and includes a VL line 12L in addition to the VH line 12H. The VL line 12L is connected to a positive electrode terminal of the direct current power source 2. Between the VL line 12L and the VH line 12H, the converter 6 is placed. A potential of the VH line 12H is equal to or higher than a potential of the VL line 12L. The N line 13 is connected to the negative electrode of the direct current power source 2, and is referred to as a ground line. In such a manner, the upper-lower arm circuit 10 includes the upper arm 10U and the lower arm 10L that are connected in series between the electric power lines. A semiconductor device 20 described later configures one arm.

A collector electrode of the switching element Q1 is connected to the VH line 12H. An emitter electrode of the switching element Q2 is connected to the N line 13. The emitter electrode of the switching element Q1 and the collector electrode of the switching element Q2 are connected.

A positive electrode terminal of the capacitor C1 is connected to the collector electrode of the switching element Q1 of the upper arm 10U. A negative electrode terminal of the capacitor C1 is connected to the emitter electrode of the switching element Q2 of the lower arm 10L. That is, the capacitor C1 is connected to the corresponding upper-lower arm circuit 10 in parallel. The parallel circuit 11 includes the upper-lower arm circuit 10 and the capacitor C1 that are connected in parallel. The parallel circuit 11 has common wirings 11P and 11N. A connection point between the upper arm 10U and the positive electrode terminal of the capacitor C1 is connected to the VH line 12H via the common wiring 11P. A connection point between the lower arm 10L and the negative electrode of the capacitor C1 is connected to the N line 13 via the common wiring 11N.

In the present embodiment, the capacitor C1 is placed separately from the smoothing capacitor C2 and the filter capacitor C3. The capacitor C1 may have a function of supplying electric charges required for switching of the switching elements Q1 and Q2 of the parallelly connected upper-lower arm circuit 10. Due to the switching, an energy loss occurs, and a voltage between both ends of the upper arm and the lower arm drops. Therefore, the insufficient electric charges are supplied from the parallelly connected capacitor C1. Therefore, the capacitance of the capacitor C1 is set to a value sufficiently smaller than the capacitance of the smoothing capacitor C2 or the filter capacitor C3. For example, the capacitance of the smoothing capacitor C2 is set to 1000 μF, and the capacitance of the capacitor C1 is set to 10 μF to 20 μF. A power module 110 described later configures one parallel circuit 11.

The filter capacitor C3 is connected between the VL line 12L and the N line 13. The filter capacitor C3 is connected to the direct current power source 2 in parallel. For example, the filter capacitor C3 removes a power source noise from the direct current power source 2. Since the filter capacitor C3 is placed on the lower voltage side as compared with the smoothing capacitor C2, the filter capacitor C3 is also referred to as a lower voltage capacitor. At least one of the N line 13 or the VL line 12L is provided with a system main relay (SMR) (not shown) between the direct current power source 2 and the filter capacitor C3.

The converter 6 has the parallel circuit 11 and a reactor. In the present embodiment, the converter 6 is configured as a multi-phase converter, specifically, a two-phase converter. The converter 6 has two sets of parallel circuits 11, and reactors R1 and R2 placed for each of the parallel circuits 11. The parallel circuits 11 are connected between the VH line 12H and the N line 13 in parallel. One end of each of the reactors R1 and R2 is connected to the VL line 12L. The other end is connected to a connection point between the upper arm 10U and the lower arm 10L in the corresponding parallel circuit 11 via the boost wiring 14. That is, the reactors R1 and R2 are placed between the VL line 12L and the connection point of the corresponding upper-lower arm circuit 10. The reactors R1 and R2 are connected between the VL line 12L and the N line 13 in parallel to each other.

The converter 6 converts the direct voltage into the direct voltage having the different value in accordance with a switching control by the control circuit portion 9. The converter 6 has a function of boosting the direct voltage supplied from the direct current power source 2. Further, the converter 6 has a drop function of charging the direct current power source 2 with use of the electric charges of the smoothing capacitor C2.

The smoothing capacitor C2 is connected between the VH line 12H and the N line 13. The smoothing capacitor C2 is placed between the converter 6 and the inverters 7 and 8. The converter 6 and the inverters 7 and 8 are connected in parallel. For example, the smoothing capacitor C2 smoothes the direct voltage boosted by the converter 6 and accumulates the electric charge of the direct voltage. A voltage between the ends of the smoothing capacitor C2 is a high direct voltage for driving the motor generators 3 and 4. The voltage between the ends of the smoothing capacitor C2 is set to be equal to or higher than a voltage between the ends of the filter capacitor C3. Since the smoothing capacitor C2 is placed on the higher voltage side as compared with the filter capacitor C3, the smoothing capacitor C2 is also referred to as a higher voltage capacitor.

The inverter 7 is connected to the converter 6 via the smoothing capacitor C2. The inverter 7 has three sets of parallel circuits 11. That is, the inverter 7 has the upper-lower arm circuits 10 for three phases. The connection point of the upper-lower arm circuit 10 in the U phase is connected to a U phase winding provided at a stator of a motor generator 3. Similarly, the connection point of the upper-lower arm circuit 10 in the V phase is connected to a V phase winding of the motor generator 3. The connection point of the upper-lower arm circuit 10 of the W phase is connected to a W phase winding of the motor generator 3. The connection point of the upper-lower arm circuit 10 in each phase is connected to the winding in accordance with the corresponding phase via an output wiring 15 placed for each phase.

The inverter 7 converts the direct voltage into a three-phase AC voltage in accordance with the switching control by the control circuit portion 9, and outputs the three-phase AC voltage to the motor generator 3. Thereby, the motor generator 3 is driven to generate a predetermined torque. In response to the output of the engine, the inverter 7 can convert the three-phase AC voltage generated by the motor generator 3 into the direct voltage in accordance with the switching control by the control circuit portion 9, and output the direct voltage to the VH line 12H. In such a manner, the inverter 7 performs bidirectional electric power conversion between the converter 6 and the motor generator 3.

Similarly, the inverter 8 is connected to the converter 6 via the smoothing capacitor C2. The inverter 8 has three sets of parallel circuits 11. That is, the inverter 8 has the upper-lower arm circuits 10 for three phases. The connection point of the upper-lower arm circuit 10 of the U phase is connected to a U phase winding provided at a stator of a motor generator 4. The connection point of the upper-lower arm circuit 10 of the V phase is connected to a V phase winding of the motor generator 4. The connection point of the upper-lower arm circuit 10 of the W phase is connected to a W phase winding of the motor generator 4. The connection point of the upper-lower arm circuit 10 in each phase is connected to the winding in accordance with the corresponding phase via the output wiring 15 placed for each phase.

The inverter 8 converts the direct voltage into a three-phase AC voltage in accordance with the switching control by the control circuit portion 9, and outputs the three-phase AC voltage to the motor generator 4. Thereby, the motor generator 3 is driven to generate a predetermined torque. At the time of regenerative braking of the vehicle, in response to the rotational force of the vehicle wheels, the inverter 8 can convert the three-phase AC voltage generated by the motor generator 4 into the direct voltage in accordance with the switching control by the control circuit portion 9, and output the direct voltage to the VH line 12H. In such a manner, the inverter 8 performs bidirectional electric power conversion between the converter 6 and the motor generator 4.

The control circuit portion 9 generates the drive instruction for operating the switching elements of the inverters 7 and 8, and outputs the drive instruction to a drive circuit portion (driver) (not shown). The control circuit portion 9 generates the drive instruction based on a torque request input from a higher-level ECU (not shown) or signals detected by various sensors.

The various sensors include a current sensor that detects a phase current flowing in the wiring of each phase of each of the motor generators 3 and 4, a rotation angle sensor that detects a rotation angle of the rotors of each of the motor generators 3 and 4, a voltage sensor that detects a both end voltage of the smoothing capacitor C2, that is, the voltage of the VH line 12H, a voltage sensor that detects a both end voltage of the filter capacitor C3, that is, the voltage of the VL line 12L, and a current sensor that is provided at a boost wiring 14 and detects the current flowing in the reactors R1 and R2. The electric power conversion device 5 has these sensors (not shown). Specifically, the control circuit portion 9 outputs a PWM signal as the drive instruction. The control circuit portion 9 includes, for example, a microcomputer.

The drive circuit portion generates the drive signal based on the drive instruction from the control circuit portion 9, and outputs the drive instruction to the gate electrode of switching elements Q1 and Q2 of the corresponding upper-lower arm circuit 10. Thereby, the switching elements Q1 and Q2 are driven, that is, turned on and off. In the present embodiment, the drive circuit portion is placed for each upper-lower arm circuit 10.

Next, before the electric power conversion device 5 is described, the semiconductor device 20 and the power module 110 including the semiconductor device 20 will be described. The semiconductor device 20 and the power module 110 are the components of the electric power conversion device 5.

(Semiconductor Device)

One example of the semiconductor device 20 applicable to the electric power conversion device 5 of the present embodiment will be described. The semiconductor device 20 described below configures one of the upper-lower arm circuit 10, that is, one arm. That is, the upper-lower arm circuit 10 are configured by the two semiconductor devices. Since such a semiconductor device 20 is packaged in element units configuring one arm, the semiconductor device 20 is also referred to as one-in-one package. The semiconductor device 20 has a basic configuration same as the upper arm 10U and the lower arm 10L, for example, can be the common part.

Figure 3:
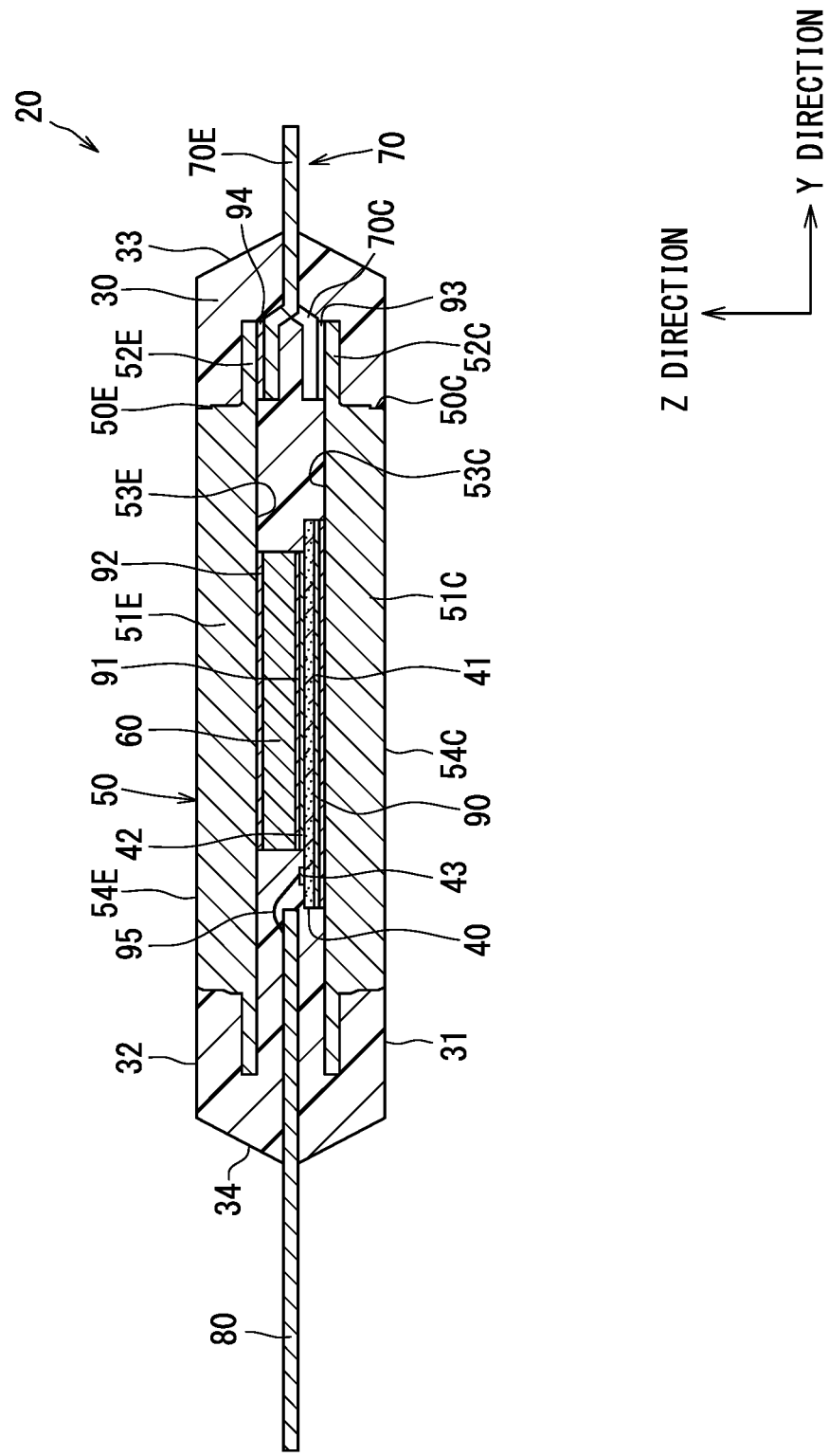
FIG. 3 is a cross-sectional view along a III-III line in FIG. 2.
Figure 4:
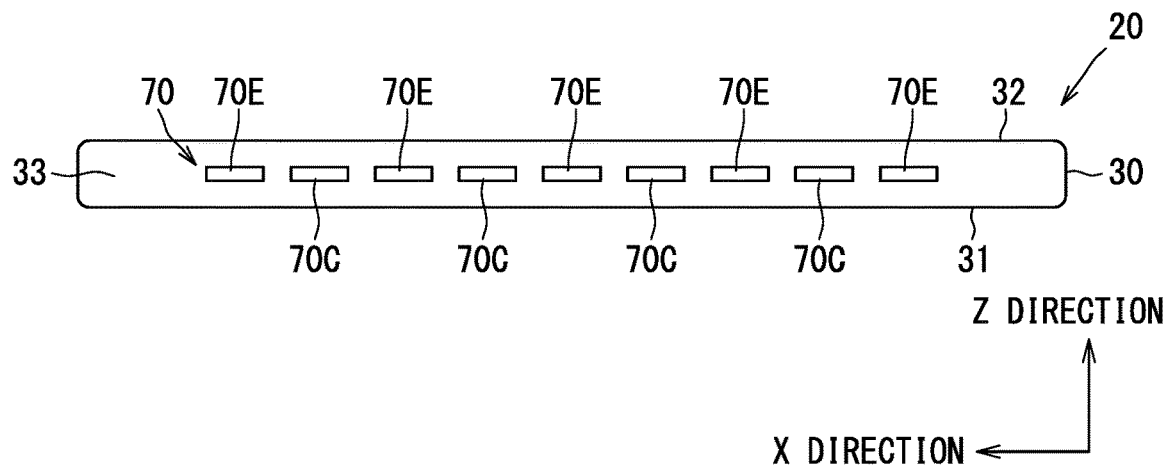
FIG. 4 is a plan view of the semiconductor device seen from a main terminal side.
Figure 5:
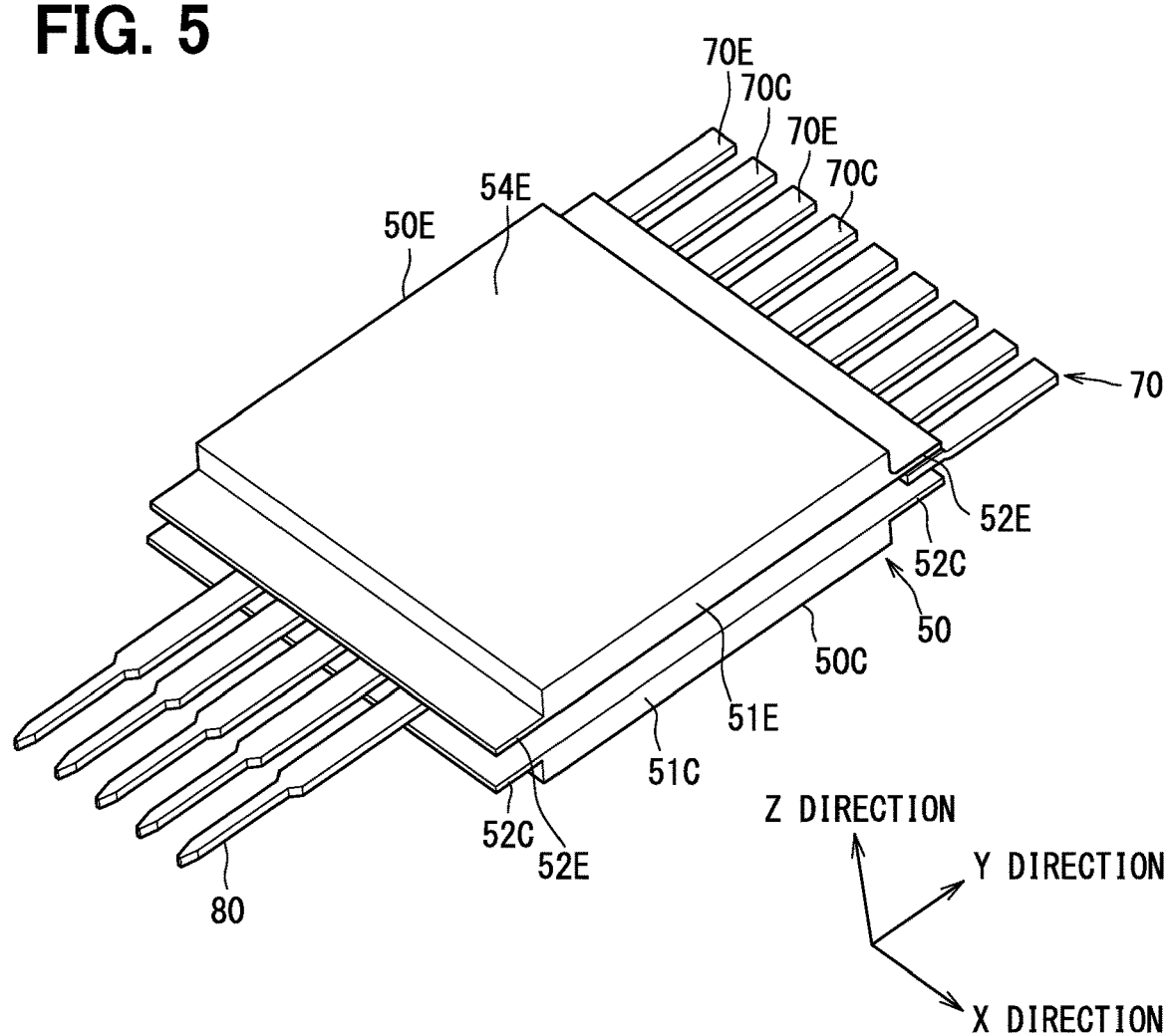
FIG. 5 is a view obtained by omitting a sealing resin body from FIG. 2.
Figure 6:
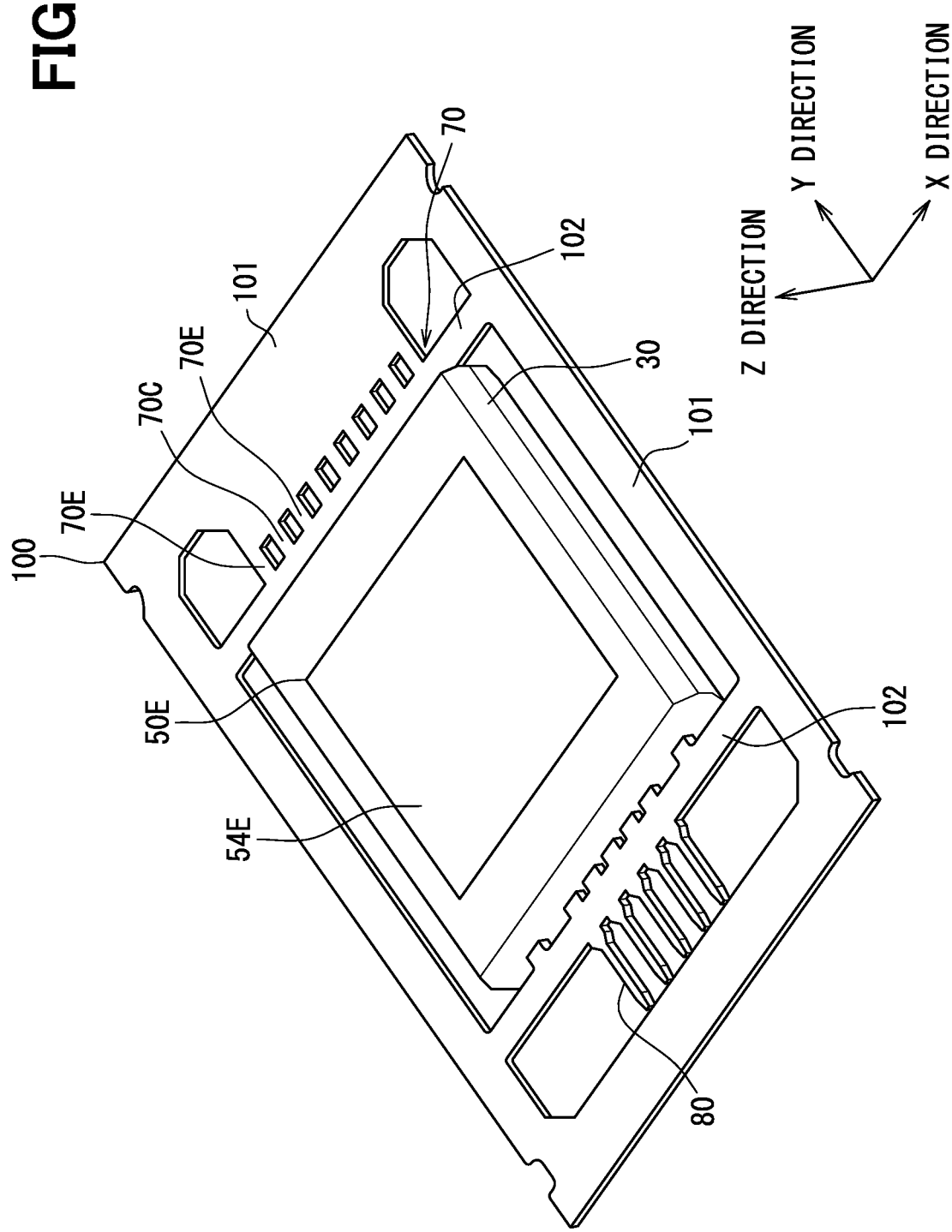
FIG. 6 is a perspective view before an unnecessary portion of a lead frame is cut.
Figure 7:
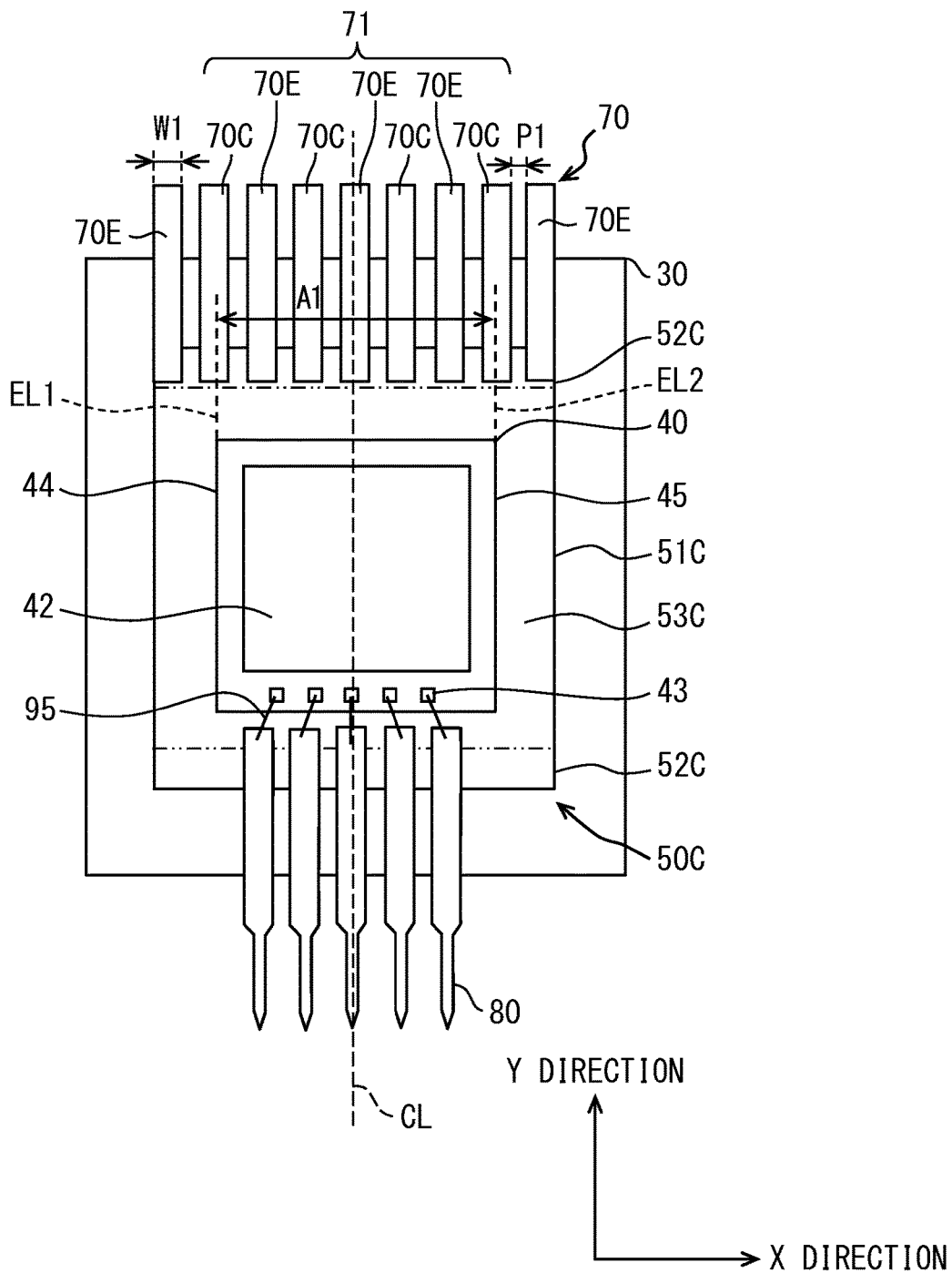
FIG. 7 is a plan view showing a positional relationship between an IGBT and the main terminal.

As shown in FIGS. 2 to 7, the semiconductor device 20 includes a sealing resin body 30, a semiconductor chip 40, a conductive member 50, a terminal 60, a main terminal 70, and a signal terminal 80. FIG. 5 is a view in which the sealing resin body 30 is omitted from FIG. 2. FIG. 6 shows a state where the sealing resin body 30 was molded and an unnecessary portion of a lead frame 100 is not removed. FIG. 7 is a plan view showing a positional relationship between the semiconductor chip 40 and the main terminal 70. In FIG. 7, a part of the sealing resin body 30, a conductive member 50E, and the terminal 60 are omitted.

In the following description, a plate thickness direction of the semiconductor chip 40 is shown as a Z direction and a direction orthogonal to the Z direction is shown as an X direction. Specifically, the arrangement direction of the main terminals 70 is shown as the X direction. A direction orthogonal to both of the Z direction and the X direction is shown as a Y direction. Unless otherwise specified, a shape along an XY plane defined by the X direction and the Y direction is a planar shape.

Figure 2:
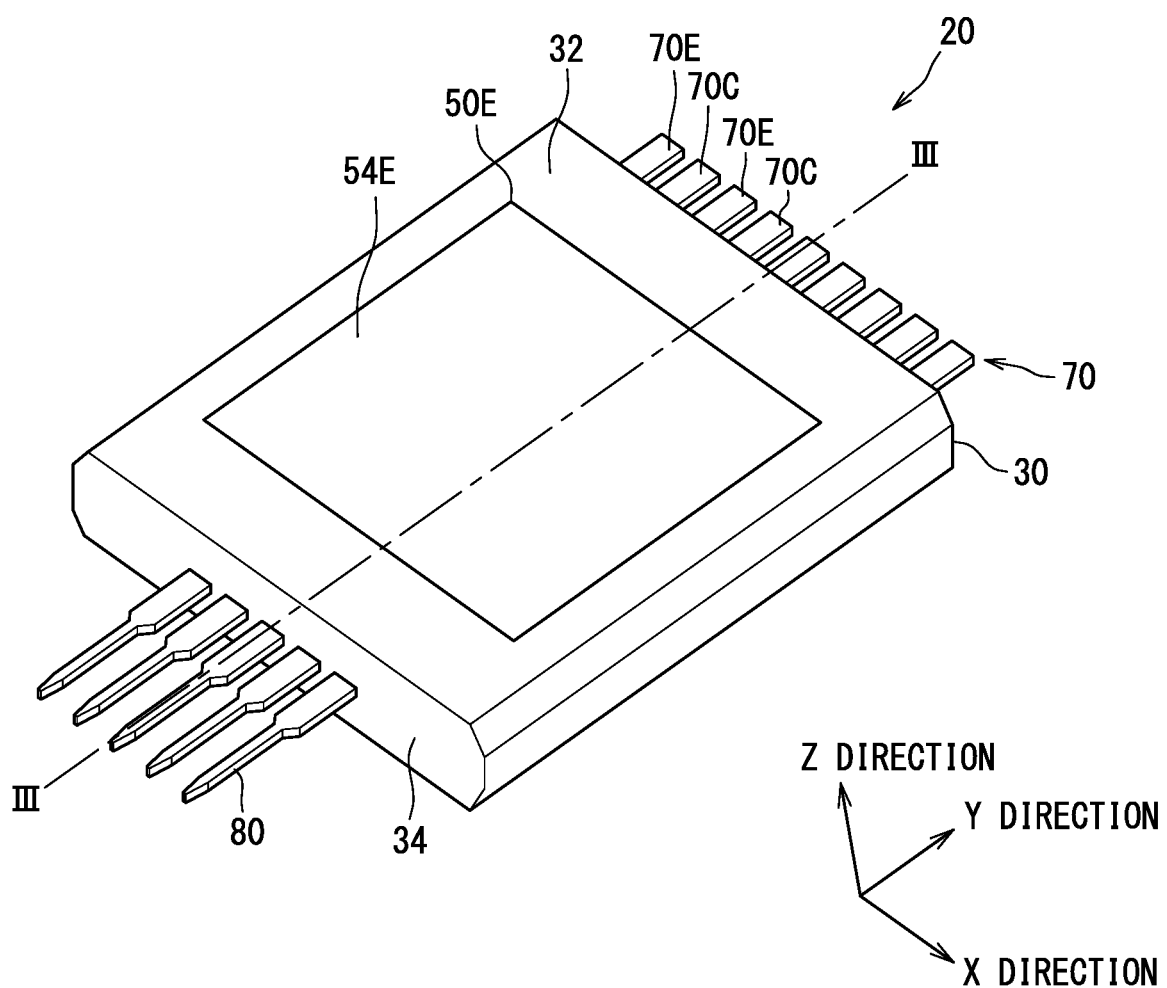
FIG. 2 is a perspective view showing a semiconductor device.

The sealing resin body 30 is made of, for example, an epoxy resin. The sealing resin body 30 is formed by, for example, a transfer molding method. As shown in FIGS. 2 to 4, the sealing resin body 30 has a first surface 31 and a second surface 32 opposite to the first surface 31 in the plate thickness direction of the semiconductor chip 40 in parallel to the Z direction. The first surface 31 and the second surface 32 are, for example, flat surfaces. The sealing resin body 30 has a lateral surface connecting the first surface 31 and the second surface 32. In the present example, the sealing resin body 30 has a substantially rectangular shape in a plan view.

The semiconductor chip 40 is provided by forming the element on a semiconductor substrate such as Si, SiC, or GaN. The semiconductor device 20 includes one semiconductor chip 40. On the semiconductor chip 40, elements (switching element and diode) configuring one arm is formed. That is, an RC (reverse conducting)-IGBT fi formed as the element. For example, when the element is used as the upper arm 10U, the element formed on the semiconductor chip 40 functions as the switching element Q1 and the diode D1. When the element is used as the lower arm 10L, the element formed on the semiconductor chip 40 functions as the switching element Q2 and the diode D2.

The element has a vertical structure so that the main current flows in the Z direction. The element has the gate electrode (not shown). The gate electrode has a trench structure. As shown in FIG. 3, the semiconductor chip 40 has a main electrode on each surface in the Z direction. Specifically, the semiconductor chip 40 has, as the main electrode, a collector electrode 41 on one surface, and has, as the main electrode, an emitter electrode 42 on a back surface opposite to the one surface. The collector electrode 41 also serves as a cathode electrode of the diode, and the emitter electrode 42 also serves as an anode electrode of the diode. The collector electrode 41 is formed on almost the entire of the one surface. The emitter electrode 42 is formed on a part of the back surface.

As shown in FIG. 3 and FIG. 7, the semiconductor chip 40 has a pad 43 that is an electrode for signal and is placed on the back surface where the emitter electrode 42 is formed. The pad 43 is formed at a position different from the emitter electrode 42. The pad 43 is electrically separated from the emitter electrode 42. The pad 43 is formed at an end on the side opposite to the formation region of the emitter electrode 42 in the Y direction.

In the present example, the semiconductor chip 40 has five pads 43. Specifically, the five pads 43 are provided for a gate electrode, a Kelvin emitter for detecting a potential of the emitter electrode 42, a current sense, an anode potential of a temperature sensor (temperature-sensitive diode) for detecting a temperature of the semiconductor chip 40, and a cathode potential. The five pads 43 are collectively formed on one end side in the Y direction in the semiconductor chip 40 having a substantially rectangular planar shape, and are formed side by side in the X direction.

The conductive member 50 electrically relays the semiconductor chip 40 and the main terminal 70. That is, the conductive member 50 functions as a wiring for the main electrode. In the present example, the conductive member also functions to radiate a heat of the semiconductor chip 40 (element) to the outside of the semiconductor device 20. Therefore, the conductive member 50 is also referred to as a heat sink. The conductive member 50 is formed of at least a metal material such as Cu for securing an electrical conductivity and a thermal conductivity.

The conductive members 50 are placed in pairs so as to sandwich the semiconductor chip 40. Each of the conductive members 50 is placed so as to encompass the semiconductor chip 40 in a projection view from the Z direction. The semiconductor device 20 has, as the pair of the conductive members 50, a conductive member 50C placed close to the collector electrode 41 of the semiconductor chip 40 and the conductive member 50E placed close to the emitter electrode 42. The conductive member 50C electrically relays the collector electrode 41 and a main terminal 70C described later. The conductive member 50E electrically relays the emitter electrode 42 and a main terminal 70E described later.

As shown in FIG. 3, FIG. 5, and FIG. 7, the conductive member 50C has a main portion 51C that is a thick portion in the Z direction and an extension portion 52C that is a portion thinner than the main portion 51C. The main portion 51C has a substantially planar shape having a substantially constant thickness. The main portion 51C has a mounting surface 53C close to the semiconductor chip 40 in the Z direction and a heat radiation surface 54C opposite to the mounting surface 53C. The extension portion 52C extends from the end of the main portion 51C in the Y direction. The extension portion 52C extends in the Y direction with the same length in the X direction, that is, the same width as the main portion 51C. A surface of the extension portion 52C close to the semiconductor chip 40 is substantially flush with the mounting surface 53C of the main portion 51C. An opposite surface far from the semiconductor chip 40 is sealed by the sealing resin body 30. The extension portion 52C may be provided at, at least, the end close to the arrangement position of the main terminal 70. In the present example, the extension portion 52C is placed at each of the both ends of the main portion 51C. In FIG. 7. a boundary between the main portion 51C and the extension portion 52C is shown by a long dashed double-dotted line.

As shown in FIG. 3 and FIG. 5, the conductive member 50E has a main portion 51E that is a thick portion in the Z direction and an extension portion 52E that is a portion thinner than the main portion 51E. The main portion 51E has the substantially planar shape having the substantially constant thickness. The main portion 51E has a mounting surface 53E close to the semiconductor chip 40 in the Z direction and a heat radiation surface 54E opposite to the mounting surface 53C. The extension portion 52E extends from the end of the main portion 51E in the Y direction. The extension portion 52E extends in the Y direction with the same length in the X direction, that is, the same width as the main portion 51E. A surface of the extension portion 52E close to the semiconductor chip 40 is substantially flush with the mounting surface 53E of the main portion 51E. An opposite surface far from the semiconductor chip 40 is sealed by the sealing resin body 30. The extension portion 52E may be provided at, at least, the end close to the arrangement position of the main terminal 70. In the present example, the extension portion 52E is placed at each of the both ends of the main portion 51E. In the present example, common parts are employed as the conductive members 50C and 50E.

The mounting surface 53C in the main portion 51C of the conductive member 50C is connected to the collector electrode 41 of the semiconductor chip 40 via a solder 90. The connection method is not limited to solder joining. Most of the conductive member 50C is covered with the sealing resin body 30. The heat radiation surface 54C of the conductive member 50C is exposed from the sealing resin body 30. The heat radiation surface 54C is substantially flush with the first surface 31. In the surface of the conductive member 50C, a portion other than a connection portion with the solder 90, the heat radiation surface 54C, and a portion that continues from the main terminal 70 is covered with the sealing resin body 30.

The terminal 60 is placed between the semiconductor chip 40 and the conductive member 50E. The terminal 60 has a substantially rectangular shape, and the planar shape (planar substantially rectangular shape) substantially conform with the emitter electrode 42. Since the terminal 60 is positioned in the middle of the electric conductive path between the emitter electrode 42 of the semiconductor chip 40 and the conductive member 50E and the thermal conductive path, the terminal 60 is formed of at least the metal material such as Cu for securing the electric conductivity and the thermal conductivity. The terminal 60 is placed to face the emitter electrode 42 and is connected to the emitter electrode 42 via a solder 91. The connection method is not particularly limited to solder joining. The terminal 60 may be configured as a part of the lead frame 100 described later.

The mounting surface 53E in the main portion 51E of the conductive member 50E is electrically connected to the emitter electrode 42 of the semiconductor chip 40 via a solder 92. Specifically, the conductive member 50E and the terminal 60 are connected via the solder 92. The emitter electrode 42 and the conductive member 50E are electrically connected via the solder 91, the terminal 60, and the solder 92. Most of the conductive member 50E are covered with the sealing resin body 30. The heat radiation surface 54E of the conductive member 50E is exposed from the sealing resin body 30. The heat radiation surface 54E is substantially flush with the second surface 32. In the surface of the conductive member 50E, a portion other than a connection portion with the solder 92, portions that continue from the heat radiation surface 54E and the main terminal 70 is covered with the sealing resin body 30.

The main terminals 70 are terminals via which the main current flows among external connection terminals for electrically connecting the semiconductor device 20 and an external device. The semiconductor device 20 includes the multiple main terminals 70. The main terminal 70 is connected to the corresponding conductive member 50. By processing the same metal member, the main terminal 70 may be integrally placed with the conductive member 50. The main terminal 70 as the different member may be connected, and thereby may continue from the conductive member 50. In the present example, as shown in FIG. 6, the main terminal 70 is configured as a portion of the lead frame 100 together with the signal terminal 80, and is a member different from the conductive member 50. As shown in FIG. 3, the main terminal 70 is connected to the corresponding conductive member 50 in the sealing resin body 30.

As shown in FIG. 3 and FIG. 4, each of the main terminals 70 extends from the corresponding conductive member 50 in the Y direction, and protrudes from one lateral surface 33 of the sealing resin body 30 to the outside. The main terminal 70 extends from the inside of the sealing resin body 30 to the outside. The main terminal 70 is a terminal electrically connected to the main electrode of the semiconductor chip 40. The semiconductor device 20 includes, as the main terminals 70, the main terminal 70C electrically connected to the collector electrode 41 and the main terminal 70E electrically connected to the emitter electrode 42. The main terminal 70C is also referred to as the collector terminal, and the main terminal 70E is also referred to as the emitter terminal.

The main terminal 70C is connected to the conductive member 50C. Specifically, the main terminal 70C is connected to a surface of one extension portion 52C via a solder 93, the one surface being close to the semiconductor chip 40. The connection method is not particularly limited to solder joining. The main terminal 70C extends in the Y direction from the conductive member 50C and protrudes outward from the lateral surface 33 of the sealing resin body 30. The main terminal 70E is connected to the conductive member 50E. Specifically, the main terminal 70C is connected to one surface of one extension portion 52E via a solder 94, the one surface being close to the semiconductor chip 40. The connection method is not particularly limited to solder joining. The main terminal 70E extends from the conductive member 50E in the Y direction that is the same direction as that of the main terminal 70C, and protrudes outward from the same lateral surface 33 as that of the main terminal 70C, as shown in FIGS. 3 and 4. Details of the main terminals 70C and 70E will be described later.

The signal terminals 80 are connected to the respective pads 43 of the semiconductor chip 40. The semiconductor device 20 includes the multiple signal terminals 80. In the present example, the multiple signal terminals are connected via a bonding wire 95. The signal terminal 80 is connected to the bonding wire 95 inside the sealing resin body 30. Five signal terminals 80 connected to the pads 43 extend in the Y direction, and protrude from the lateral surface 33 and a lateral surface 34 opposite to the lateral surface 33 in the sealing resin body 30 to the outside. The signal terminal 80 is configured as a part of the lead frame 100. The signal terminal 80 may be integrally placed with the conductive member 50C together with the main terminal 70C by processing the same metal member.

The lead frame 100 includes an outer peripheral frame portion 101 and a tie bar 102 in a state before cutting, as shown in FIG. 6. Each of the main terminals 70 and each of the signal terminals 80 are fixed to the outer peripheral frame portion 101 via the tie bar 102. After the sealing resin body 30 is molded, an unnecessary portion of the lead frame 100 such as the outer peripheral frame portion 101 or the tie bar 102 is removed. Thereby, the main terminal 70 and the signal terminal 80 are electrically separated. The semiconductor device 20 is obtained. As the lead frame 100, either a material having a constant thickness or a deformed material having a non-constant thickness can be employed.

In the semiconductor device 20 configured as described above, the sealing resin body 30 integrally seals a part of each of the semiconductor chip 40 and the conductive member 50 and a part of each of the terminal 60, the main terminal 70, and the signal terminal 80. That is, elements configuring one arm are sealed. Therefore, the semiconductor device 20 is also referred to as "1-in-1 package".

The heat radiation surface 54C of the conductive member 50C is substantially flush with the first surface 31 of the sealing resin body 30. The heat radiation surface 54E of the conductive member 50E is substantially flush with the second surface 32 of the sealing resin body 30. The semiconductor device 20 has a double-sided heat radiation structure in which the heat radiation surfaces 54C and 54E are both exposed from the sealing resin body 30. The semiconductor device 20 can be formed, for example, by cutting the conductive member 50 together with the sealing resin body 30. The heat radiation surfaces 54C and 54E can also be formed by molding the sealing resin body 30 so as to be in contact with a cavity wall surface of a mold for molding the sealing resin body 30.

Next, the main terminal 70 will be described in detail.

The main terminal 70 includes at least one of the main terminal 70C or the main terminal 70E. The main terminal 70C and the main terminal 70E are arranged in the X direction that is the plate width direction of the main terminal 70 so that plate surfaces of the main terminal 70C and the main terminal 70E do not face each other and lateral surfaces of the main terminal 70C and the lateral surface of the main terminal 70E face each other. The semiconductor device 20 includes multiple lateral surface facing portions formed by the adjacent main terminals 70C and 70E. The plate surface is a surface in the plate thickness direction of the main terminal 70 among the surfaces of the main terminal 70. The lateral surface is a surface that connects the plate surfaces and is along the extension direction of the main terminal 70. The remaining surfaces of the main terminal 70 are both end surfaces in the extension direction, that is, a protrusion tip surface and a rear end surface. At least a part of the lateral surfaces configuring the lateral surface facing portion may face with each other in the plate thickness direction of the main terminal 70. For example, the lateral surfaces may be placed so as to shift in the plate thickness direction. However, it is more effective to face each other all over. It is sufficient that, at least, the facing surfaces face each other. It is preferable that the surfaces are substantially parallel to each other. A completely parallel state is more preferable.

An area of the lateral surface of the main terminal 70 is smaller than that of the plate surface. The main terminals 70C and the 70E are placed so as to be adjacent to each other. By being adjacent to each other, the main terminal 70C and the main terminal 70E are alternately arranged in a configuration including the multiple main terminals 70C and 70E. The main terminals 70C and 70E are arranged in order.

As shown in FIG. 7, a main terminal group 71 includes three or more main terminals 70 continuously arranged in the X direction. The main terminals 70C and 70E are arranged next to each other, the main terminal group 71 includes both of the main terminals 70C and 70E, and at least one of the number of main terminals 70C or the number of main terminals 70E is two or more. At least a part of each main terminal 70 configuring the main terminal group 71 is placed in a predetermined region A1. The region A1 is a region between, in the X direction, an extension line EL1 virtually extending from one end surface 44 of the semiconductor chip 40 and an extension line EL2 virtually extending from an end surface 45 opposite to the end surface 44. In the X direction, a length between the extension lines EL1 and EL2 conforms with a width of the semiconductor chip 40, that is, an element width.

In the present example, the main terminals 70C and 70E extend in the same direction (Y direction) over their entire length. The main terminal 70 has a straight plane shape, and does not have an extension portion in the X direction. The thickness of the main terminal 70C is thinner than that of the main portion 51C, and, for example, is almost same as that of the extension portion 52C. The thickness of the main terminal 70E is thinner than that of the main portion 51E, and, for example, is almost same as that of the extension portion 52E. The thickness of the main terminal 70 is, overall, substantially constant, and the main terminals 70C and 70E have substantially the same thickness. A width W1 of the main terminals 70 is, overall, substantially constant, and the main terminals 70C and 70E have the same width.

An interval P1 between the adjacent main terminals 70 in the X direction is also the same for all the main terminals 70. The interval P1 is also referred to as an inter-terminal pitch.

Each of the main terminals 70 has two bent portions in the sealing resin body 30. Thereby, the main terminal 70 has a substantially crank shape in a ZY plane. In the main terminal 70, a portion close to the tip as compared with the bent portion has a flat plate shape, and a part of the flat plate shaped portion protrudes from the sealing resin body 30. In the protrusion portion from the sealing resin body 30, that is, the flat plate shaped portion, the main terminals 70C and 70E are placed at substantially the same positions in the Z direction, as shown in FIGS. 3 and 4. In the flat plate shaped portion, the thickness directions of the main terminals 70C and 70E substantially conform with the Z direction. Thereby, almost the entire region of the lateral surface of the main terminal 70C and almost the entire region of the lateral surface of the main terminal 70E face each other in the Z direction. Further, the extension lengths of the flat shaped portions of the main terminals 70C and 70E are substantially the same. The main terminals 70C and the main terminal 70E are placed at substantially the same positions in the Y direction. Thereby, almost the entire regions of the flat shaped portions of the lateral surfaces of the main terminals 70C and 70E face each other.

As shown in FIG. 2, FIGS. 5 to 7, the semiconductor device 20 includes an odd number of main terminals 70, specifically, nine main terminals 70. Four of the nine main terminals 70 are the main terminals 70C, and the remaining five are the main terminals 70E. The main terminals 70C and 70E are alternately placed in the X direction. Thereby, the semiconductor device 20 has eight lateral surface facing portions. At the both ends in the X direction, the main terminals 70E are placed, and the main terminal group 71 includes seven main terminals 70 other than the main terminal 70E placed at the both ends. The main terminal group 71 includes an odd number of (seven) main terminals 70, specifically, four main terminals 70C and three main terminals 70E. The entire region of each of the two main terminals 70E that does not configure the main terminal group 71 is placed outside the region A in the X direction. The number of main terminals 70 that configures the main terminal group 71 is larger than the number of main terminals 70 that does not configure the main terminal group 71.

Among the seven main terminals 70 included in the main terminal group 71, a part of each of the two main terminals 70C positioned at both ends is placed in the region A1 in the X direction. The entire region of each of the remaining five main terminals 70 is placed in the region A1 in the X direction. In such a manner, some of the main terminals 70 configuring the main terminal group 71 are entirely placed in the region A1, and the remaining main terminals 70 are partially placed in the region A1. In particular, in the present example, each of the multiple (five) main terminals 70 configuring the main terminal group 71 is entirely placed in the region A1.

The main terminals 70C and 70E have the same width W1, and the interval P1 between the main terminals 70C and 70E is also the same for all the main terminals 70. A center of the width of the main terminal 70E placed at the center in the X direction among the odd number of main terminals 70 is positioned on a center line CL passing through the center of the semiconductor chip 40. In such a manner, the main terminals 70C and 70E are placed symmetrically with respect to the center line CL passing through the center of the semiconductor chip 40 in the X direction. The multiple main terminals 70C are placed symmetrically with respect to the center line CL, and the main terminal 70E are placed symmetrically with respect to the center line CL. The odd number of main terminals 70 included in the main terminal group 71 are placed symmetrically with respect to the center line CL. The extension direction of the center line CL is orthogonal to the Z direction and the X direction.

Next, the effects of the semiconductor device 20 will be described.

In the semiconductor device 20, at least one of the number of main terminals 70C or the number of main terminals 70E are multiple, and the main terminals 70C and 70E are placed adjacent to each other in the X direction. The lateral surfaces of the adjacent main terminals 70C and 70E face each other. the direction of the main current at the main terminal 70C is opposite to that at the main terminal 70E. In the such a manner, the main terminals 70C and 70E are placed so as to cancel the magnetic fluxes generated when the main current flows. Therefore, it may be possible to reduce the inductance. In particular, in the present example, since the multiple lateral surface facing portions of the main terminals 70C and 70E are provided, it may be possible to effectively reduce the inductance. Since the multiple main terminals 70 having the same type are placed in parallel, it may be possible to reduce the inductance by parallelizing the lateral surface facing portions.

The main terminal group 71 includes at least three main terminals 70 continuously arranged. At least a part of each main terminal 70 configuring the main terminal group 71 is placed in the region A1 between, in the X direction, the extension lines EL1 and EL2 that extend from the both end surfaces 44 and 45 of the semiconductor chip 40. That is, the multiple lateral surface facing portions are placed in the region A1. Thereby, it may be possible to simplify the current path between the main terminal 70 configuring the main terminal group 71 and the main electrode of the semiconductor chip 40, specifically, shorten the current path. Therefore, it may be possible to reduce the inductance.

As described above, according to the semiconductor device 20, it may be possible to reduce the inductance of the main circuit wiring as compared with the conventional structure. The multiple main terminals 70 may be arranged in the X direction so that the lateral surfaces face each other. The main terminal group 71 may include at least three main terminals 70. The at least three main terminals 70 may include at least one of the multiple main terminals 70C or the main terminals 70E, and be continuously arranged. Partially, the main terminals 70 having the same type may be continuously arranged. Thereby, since at least one of the multiple main terminals 70C or the multiple main terminal 70E are placed in parallel, it may be possible to reduce the inductance. Since the main terminal group 71 is provided, it may be possible to simplify the current path between the main terminal 70 configuring the main terminal group 71 and the main electrode of the semiconductor chip 40. Thereby, it may be possible to reduce the inductance. Accordingly, the effects in accordance with the present example can be obtained. However, as shown in the present example, since the main terminals 70C and 70E are placed adjacent to each other, it may be possible to further reduce the inductance due to the effect of canceling the magnetic flux.

In the main terminal group 71, the main terminal 70 entirely placed in the region A1 in the X direction is more preferable in respect of the simplification of the current path as compared with the main terminal 70 partially placed in the region A1. In the present example, some of the main terminals 70 configuring the main terminal group 71 are entirely placed in the region A1, and the remaining main terminals 70 are partially placed in the region A1. Since the main terminal group 71 includes the main terminal 70 that is more effective for simplifying the current path, it may be possible to effectively reduce the inductance. In particular, in this example, the multiple main terminal 70 entirely placed in the region are included. Since the multiple main terminals 70 that are more effective for simplifying the current path are included, it may be possible to more effectively reduce the inductance.

In the present example, the number of main terminals 70 is odd. When the number is odd, it is easy to have symmetry in the X direction, and it may be possible to prevent the bias of the current path between the main terminal 70 and the semiconductor chip 40. The arrangement order of the main terminals 70 in the X direction is the same regardless of the viewpoint from the first surface 31 or the viewpoint from the second surface 32. Accordingly, it may be possible to improve freedom of placement of the semiconductor device 20.

In particular, in the present example, the main terminals 70C and 70E are placed symmetrically with respect to the center line CL of the semiconductor chip 40 in the X direction. Thereby, the main current of the semiconductor chip 40 symmetrically flows with respect to the center line CL. The main current flows almost evenly on the left side and the right side with respect to the center line CL. Accordingly, it may be possible to further reduce the inductance. In addition, it may be possible to suppress local heat generation.

Figure 8:
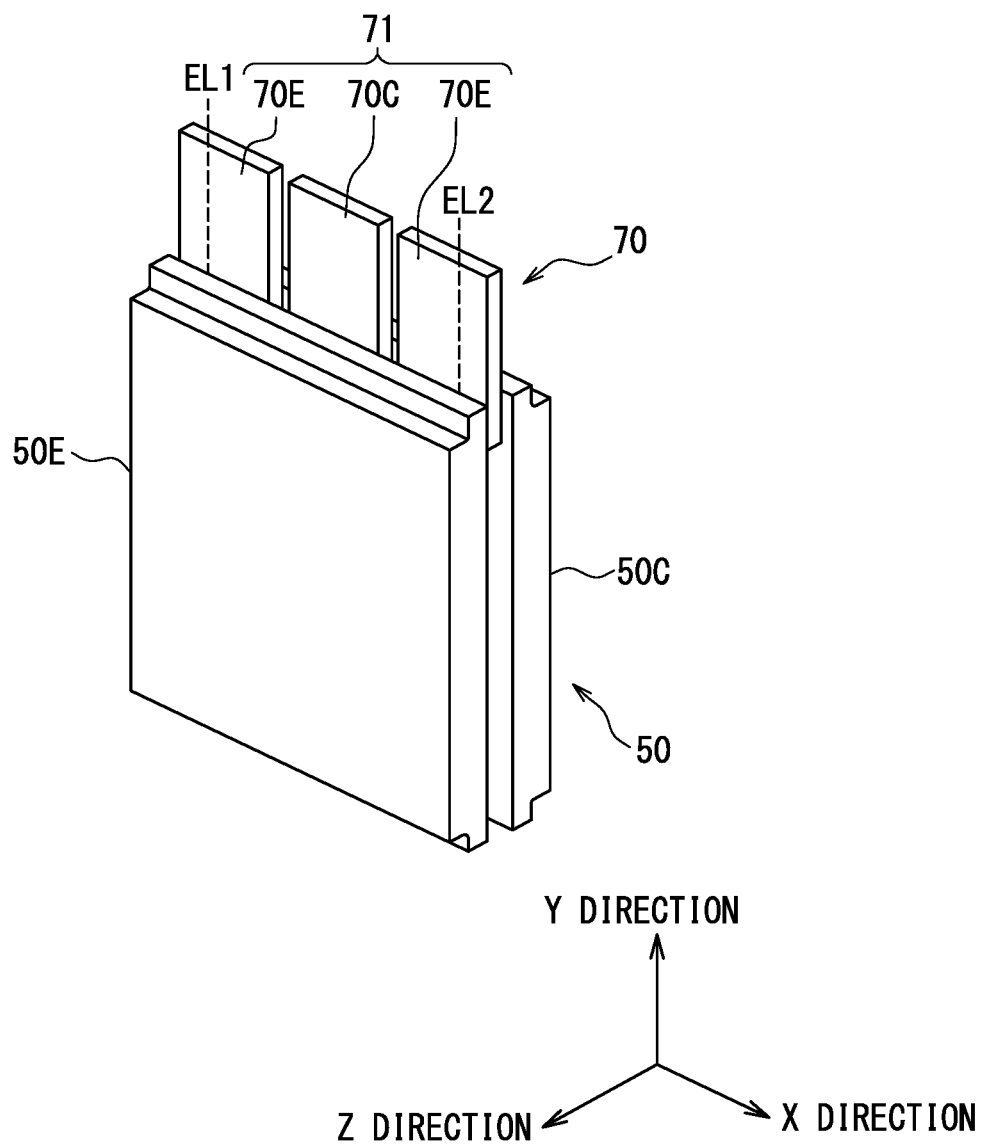
FIG. 8 is a perspective view showing another example of the semiconductor device.
Figure 9:
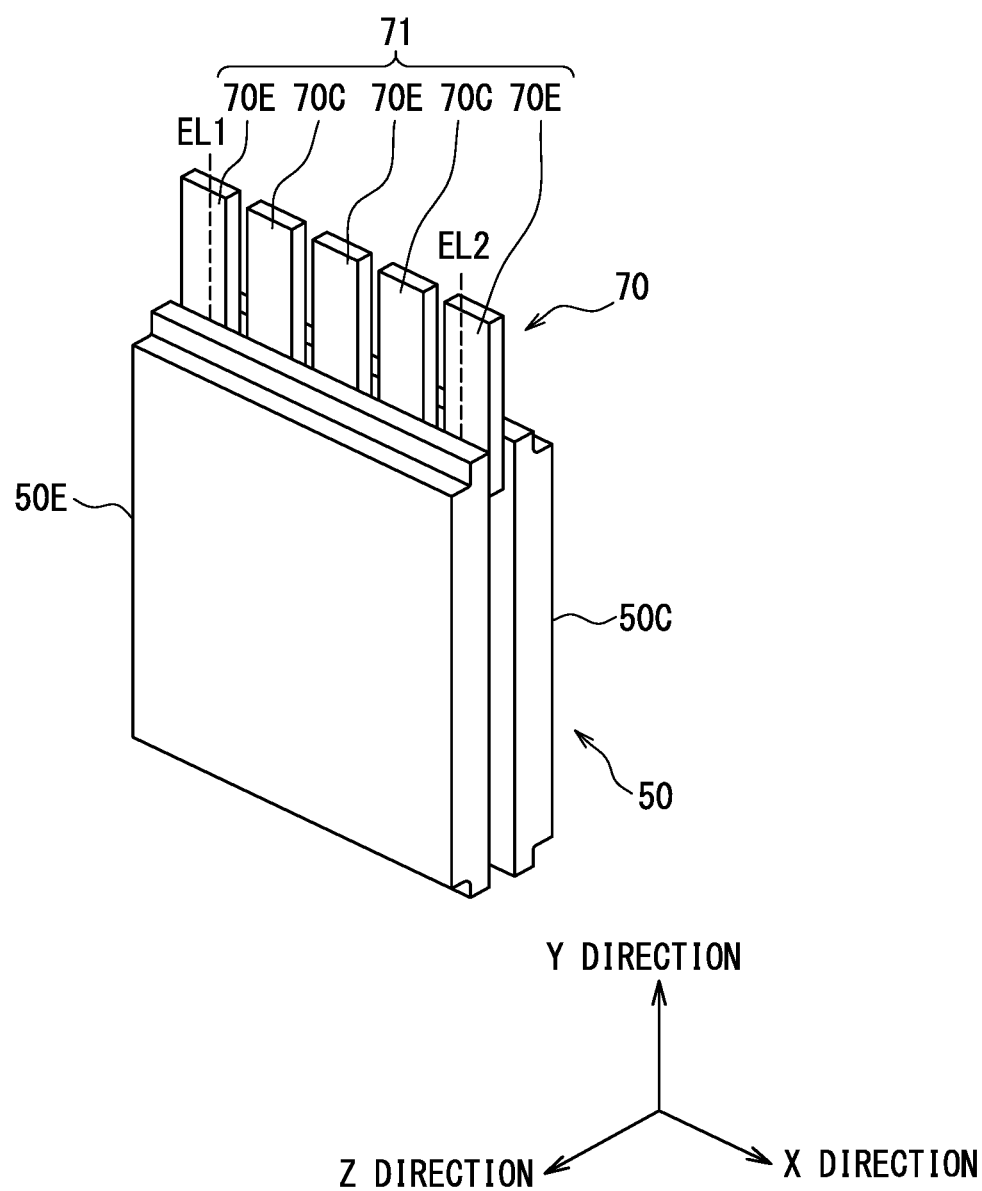
FIG. 9 is a perspective view showing another example of the semiconductor device.
Figure 10:
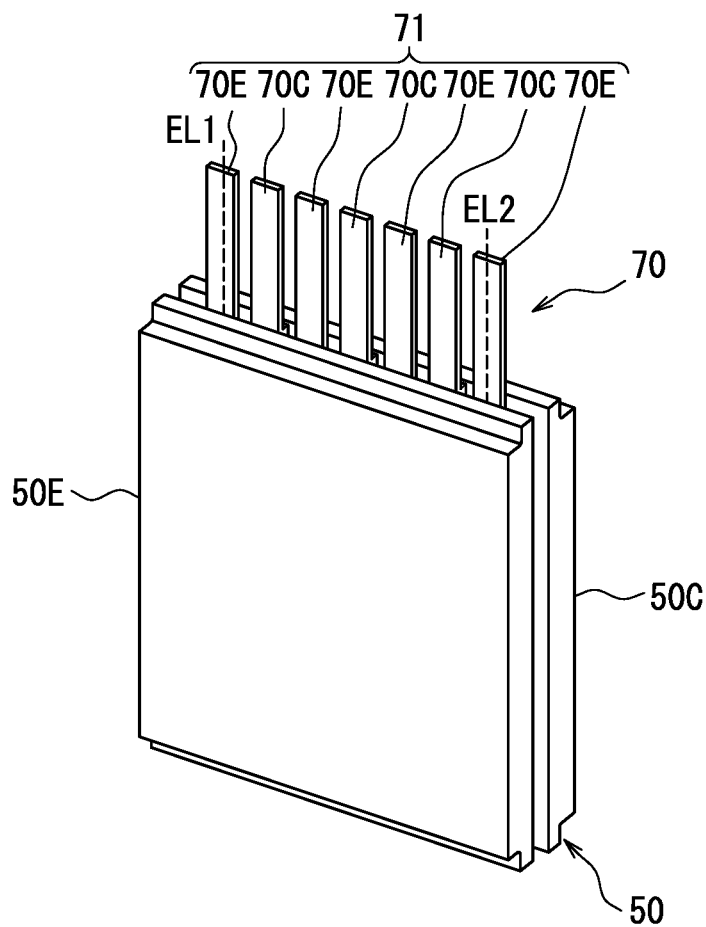
FIG. 10 is a perspective view showing another example of the semiconductor device.
Figure 10:
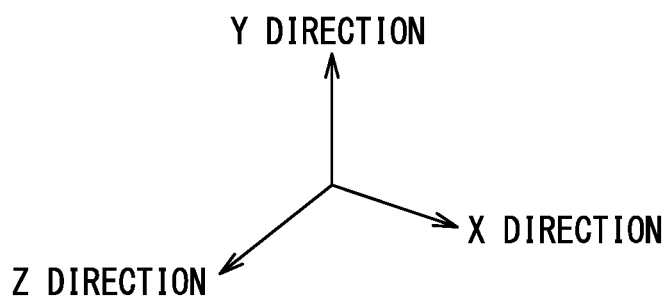

FIGS. 8 to 10 show another example. In FIGS. 8 to 10, for convenience, the sealing resin body 30 and the signal terminal 80 are not shown. In FIGS. 8 to 10, for convenience, the region A1 is not shown, and the extension lines EL1 and EL2 defining the region A1 are shown.

In FIG. 8, the semiconductor device 20 includes three main terminals 70, specifically, one main terminal 70C and two main terminals 70E. That is, the semiconductor device includes two lateral surface facing portions. The main terminal group 71 includes all the main terminals 70. The main terminal 70C placed at the center is entirely placed, in the X direction, in the region A1. The main terminals 70E at the both ends are partially placed in the region A1.

In FIG. 9, the semiconductor device 20 includes five main terminals 70, specifically, two main terminals 70C and three main terminals 70E. That is, the semiconductor device includes four lateral surface facing portions. The main terminal group 71 includes all the main terminals 70. Each of the main terminals 70E at both ends is partially placed in the region A1. Each of the remaining three main terminals 70 is entirely placed in the region A1.

In FIG. 10, the semiconductor device 20 includes seven main terminals 70, specifically, three main terminals 70C and four main terminals 70E. That is, the semiconductor device includes six lateral surface facing portions. The main terminal group 71 includes all the main terminals 70. Each of the main terminals 70E at both ends is partially placed in the region A1. Each of the remaining five main terminals 70 is entirely placed in the region A1.

Figure 11:
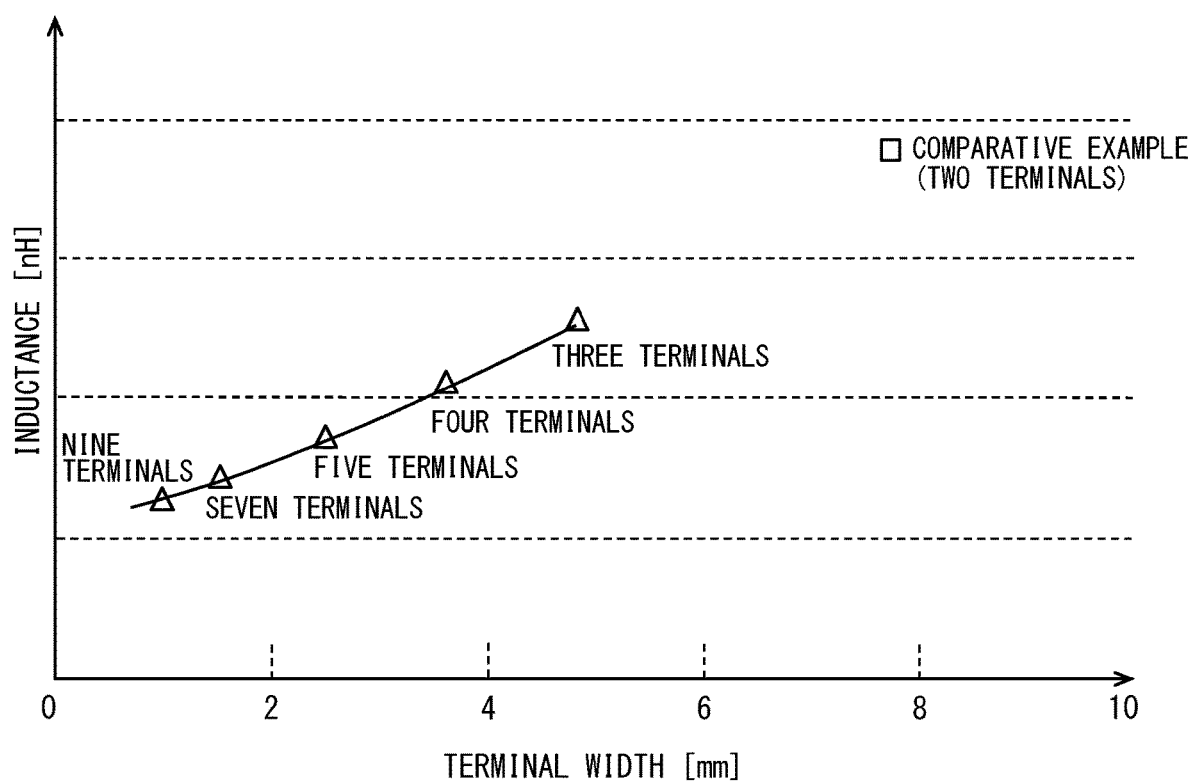
FIG. 11 is a diagram showing a magnetic analysis result of the total inductance of main terminals.

FIG. 11 a result obtained by performing a magnetic field analysis of a total inductance of the main terminals of the semiconductor device 20. In this magnetic field analysis (simulation), a length (width) of the conductive member 50 in the X direction was set to 17 millimeters, and the interval P1 of the main terminal 70 was set to 1.0 millimeter. In the main terminals 70 configuring the same semiconductor device 20, the widths W1 are set to be equal to each other.

For example, when three main terminals 70 are provided, it is shown as three terminals in FIG. 11 FIG. 11 shows, as a comparative example, a configuration (two terminals) including only two main terminals. The nine terminals is a result of the same arrangement as the configuration shown in FIG. 7. Similarly, the three terminals, the five terminals, and the seven terminals are results of the same arrangement as the configurations shown in FIGS. 8 to 10.

As the number of terminals increases, the width per terminal becomes narrower and the inductance (self-inductance) increases. However, the number of the lateral surface facing portions increases. The number of the main terminals 70 configuring the main terminal group 71 increases as the number of terminals increases up to the predetermined number of terminals. Therefore, it may be possible to reduce the inductance. As shown in FIGS. 8 to 10, when the number of terminals is three, five, or seven, the main terminal group 71 includes all the main terminal 70. That is, all the main terminals 70 are placed in the region A1. When the number of terminals is nine, as shown in FIG. 7, the main terminal group 71 includes seven main terminals 70.

From the results of FIG. 11, when the main terminal group 71 includes there or more main terminals 70, it is clear that the total inductance of the main terminals can be reduced as compared with the comparative example while the increase in the size is prevented. It is considered that, when the number of terminals is three or more, the effect of reducing the inductance exceeds the increase in inductance due to the decrease in the width, and the inductance is reduced. In particular, when the main terminal group 71 includes five or more main terminals 70, the inductance can be reduced by half or less as compared with the comparative example. That is, it is clearly effective in reducing the inductance.

The nine terminals include the seven main terminals 70 configuring the main terminal group 71 and the two main terminals 70 placed outside the region A1. Although the two main terminals 70 are placed outside the region A1 in such a manner, more main terminals 70 than main terminals 70 that do not configure the main terminal group 71, that is, most of the main terminals 70 are placed in the region A1. The number of lateral surface facing portions is also two more as compared with the seven terminals. Accordingly, the inductance lower than that of the seven terminals is shown.

In the example, the example of the configuration in which the main terminals 70E are placed at both ends, that is, the configuration in which the number of main terminals 70E is larger than the number of main terminals 70C has been shown. However, it is not limited to this. In the configuration of the odd number of main terminals 70, the number of main terminals 70C may be larger than the number of main terminals 70E.

The example in which the lengths of the protrusion portions of all the main terminal 70 from the sealing resin body 30 are same has been shown. However, it is not limited to this. In consideration of connectivity with the bus bar or the like, the protrusion portions of the adjacent main terminals 70C and 70E may be different from each other. In another example shown in FIG. 12, the main terminal 70C is longer than the main terminal 70E.

Figure 12:
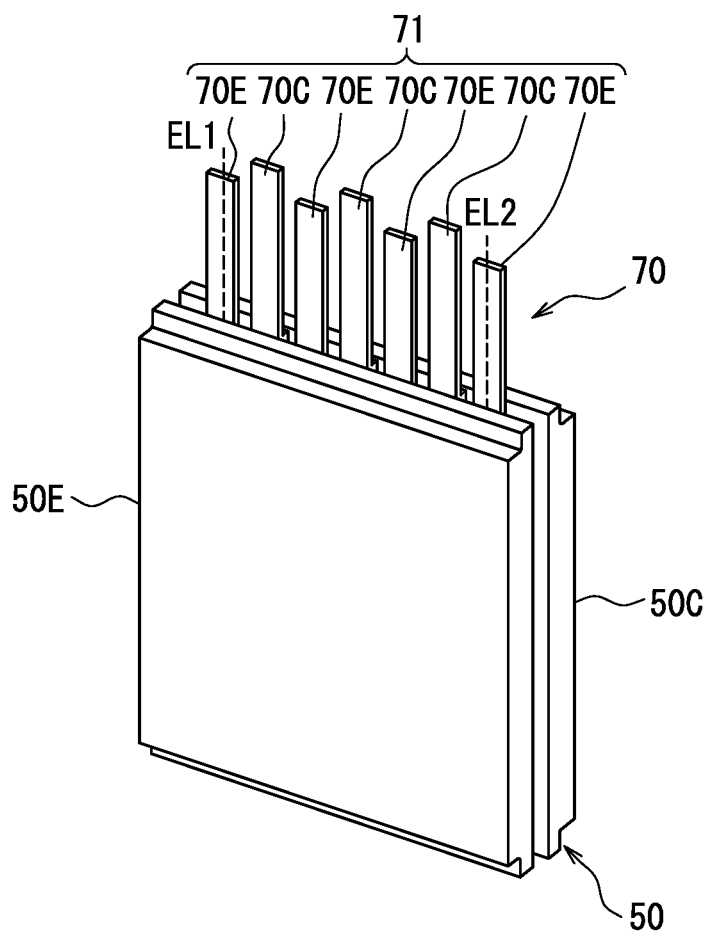
FIG. 12 is a perspective view showing another example of the semiconductor device.
Figure 12:
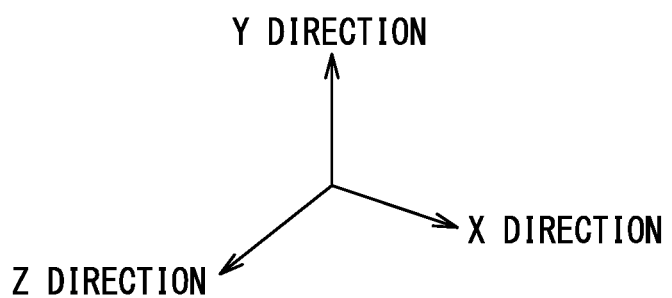
Figure 13:
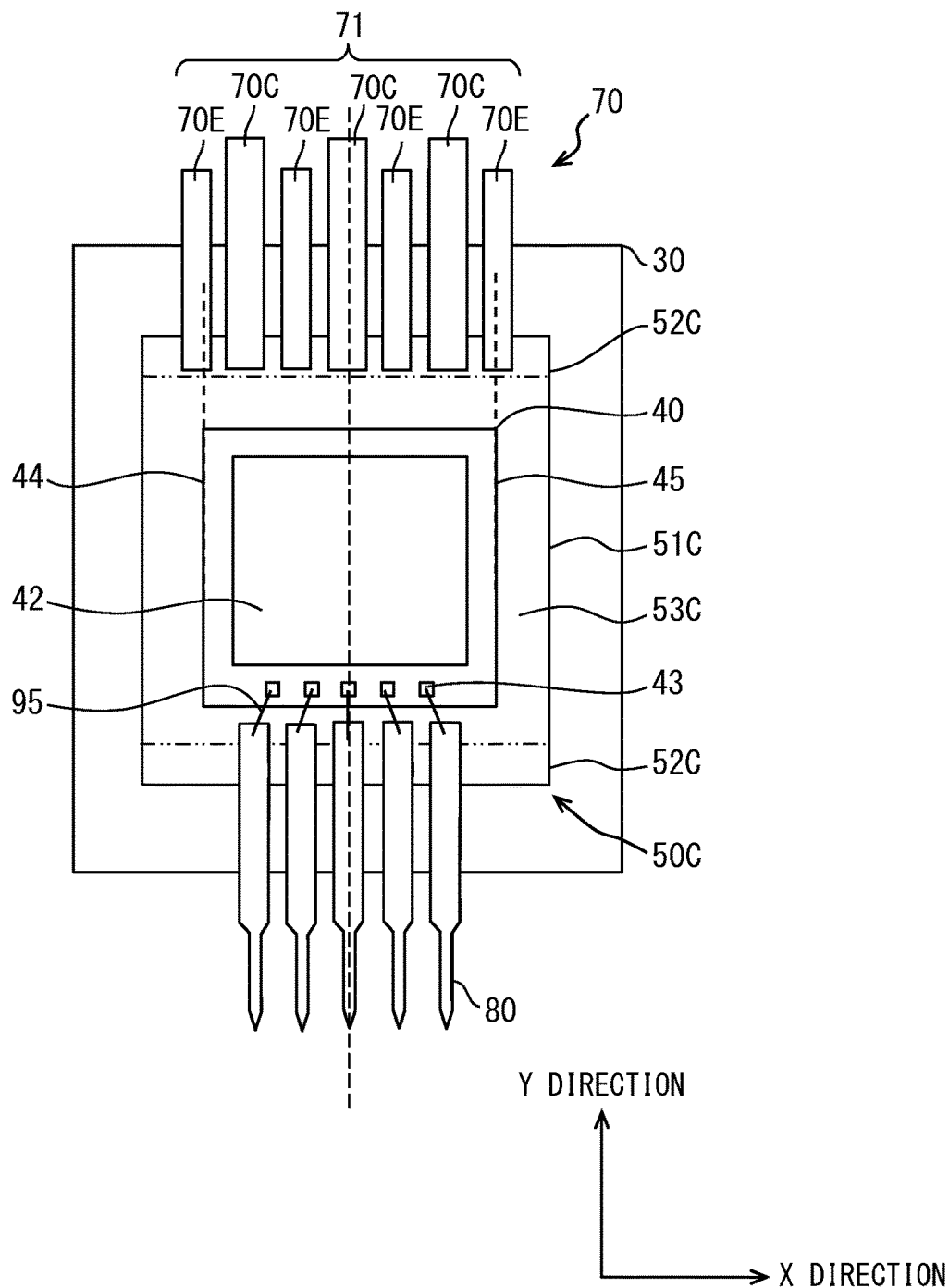
FIG. 13 is a plan view showing another example of the semiconductor device and corresponding to FIG. 7.

In another example shown in FIG. 13, the number of main terminals 70C is smaller than the number of main terminals 70E. A cross-sectional area of the main terminal 70C is larger than a cross-sectional area of the main terminal 70E. Thereby, the total impedance of the main terminal 70C and the total impedance of the main terminal 70E are substantially matched. Accordingly, it may be possible to suppress the heat generation of a small number of main terminals 70C. In FIG. 13, the cross-sectional area of the main terminal 70C is made larger than the cross-sectional area of the main terminal 70E by increasing the width. However, the thickness of the main terminal 70C may be thicker than that of the main terminal 70E. Both of the width and the thickness may be adjusted. In FIG. 13, the length of the small number of the main terminal 70C in the extension direction is longer than the length of the main terminal 70E. When the length is long, the cross-sectional area is large. Therefore, it may be possible to ensure the rigidity of the main terminal 70. FIG. 12 and FIG. 13 show the example of the seven terminals. However, it is not limited to this.

The example in which, at the protrusion portion from the sealing resin body 30, the adjacent main terminals 70C and 70E face each other entirely in the extension direction. However, it is not limited to this. At a part of the protrusion portion, the lateral surfaces may not face each other. For example, the protrusion tip portion of at least one of the main terminal 70C or the main terminal 70E is bent, and thereby the lateral surface may not face at the protrusion tip portion. Even when the extension lengths are the same, the connectivity with the bus bar or the like can be improved. However, the effect of reducing the inductance is reduced.

The example in which the number of main terminals 70 is odd and the number of main terminals 70 configuring the main terminal group 71 is odd has been shown. However, it is not limited to this. The main terminal group 71 may include an even number of (four or more) main terminals 70.

It is sufficient that the semiconductor device 20 includes at least one semiconductor chip 40. For example, in a configuration in which the semiconductor device 20 includes the multiple semiconductor chips 40 and these semiconductor chips 40 are connected in parallel between the main terminals 70C and 70E, the arrangement of the main terminals 70 may be applied to each semiconductor chip 40.

Figure 14:
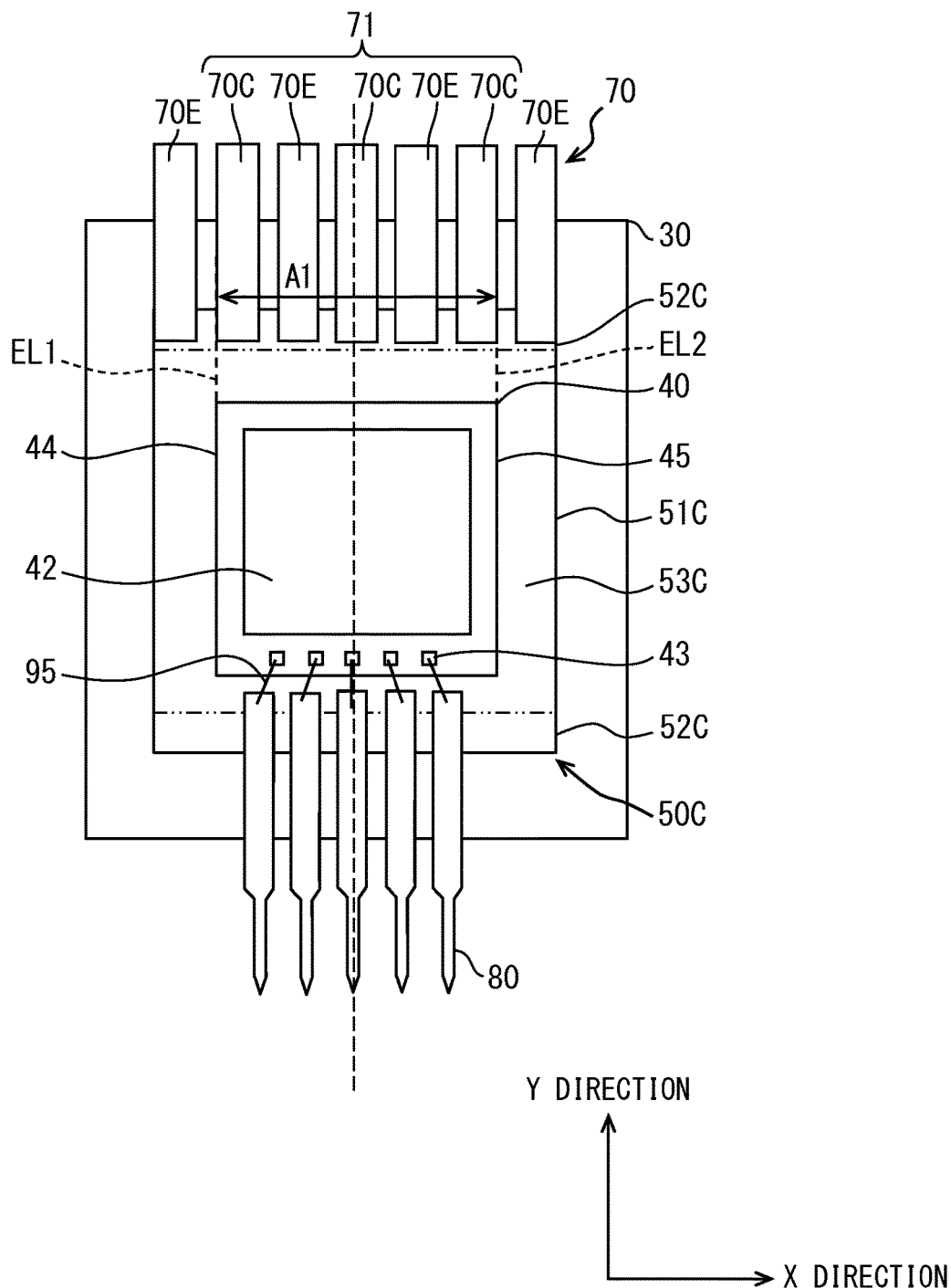
FIG. 14 is a plan view showing another example of the semiconductor device and corresponding to FIG. 7.

All the main terminals 70 configuring the main terminal group 71 are entirely in the region A1. In another example shown in FIG. 14, the main terminal group 71 includes five main terminals 70 among the seven main terminals 70. The five main terminals 70 configuring the main terminal group 71 are entirely placed in the region A1. Thereby, it may be possible to simplify the current path with the main electrode of the semiconductor chip 40.

An even number of (four or more) of main terminals 70 may be provided. In another example shown in FIG. 15, the semiconductor device 20 includes two main terminals 70C and two main terminal 70E. The main terminals 70C and the main terminals 70E are alternately placed. The width W1 and the thickness of the four main terminals 70 are equal to each other. That is, the cross sectional areas orthogonal to the extension direction are equal to each other. The extension length in the Y direction of the four main terminals 70 is also equal to each other. All the main terminals 70 configure the main terminal group 71. The two main terminals 70C and 70E placed at both ends are partially placed in the region A1 in the X direction. The two main terminals 70C and 70E at the center are entirely placed in the region A1 in the X direction.

Even in the configuration, the multiple lateral surface facing portions of the main terminals 70C and 70E are provided. Therefore, it may be possible to effectively reduce the inductance. Since the main terminal group 71 is provided, it may be possible to simplify the current path between the main terminal 70 configuring the main terminal group 71 and the main electrode of the semiconductor chip 40, and reduce the inductance. As described above, it may be possible to reduce the inductance of the main circuit wiring as compared with the conventional structure. FIG. 11 also shows the result of the four terminals. From the results of FIG. 11, even when the number of terminals is four, it is clear that the total inductance of the main terminals can be reduced as compared with the comparative example while the increase in the size is prevented.

Figure 15:
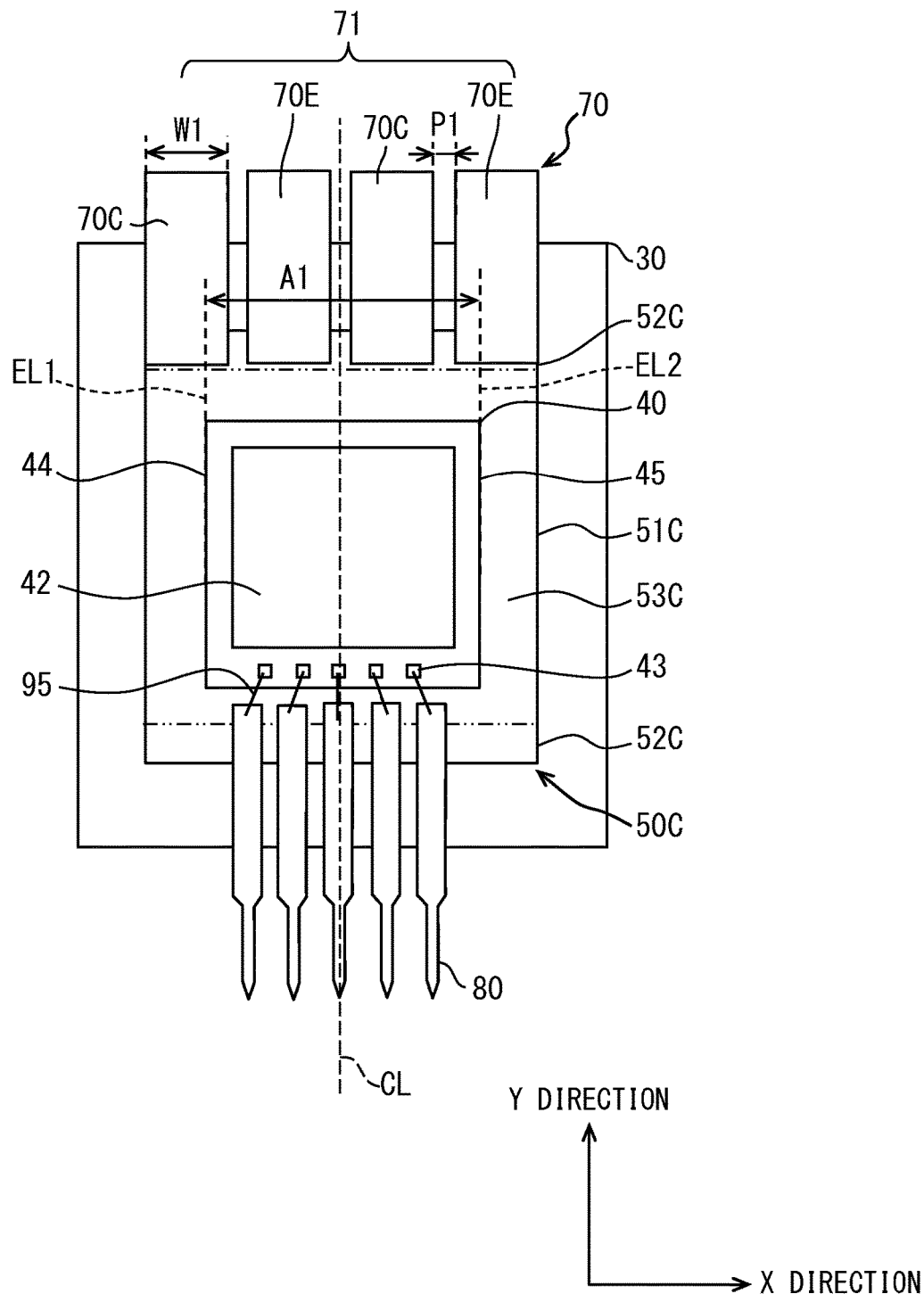
FIG. 15 is a plan view showing another example of the semiconductor device and corresponding to FIG. 7.

In FIG. 15, all the main terminals 70 configure the main terminal group 71. Therefore, it may be possible to effectively reduce the inductance. Even when the number of main terminals 70 is an even number, it is sufficient that three or more continuously arranged main terminals 70 configure the main terminal group 71. Accordingly, in the configuration including the four main terminals 70, three main terminals 70 configure the main terminal group 71, and the remaining one main terminal 70 may be placed outside the region A1. As described above, when the number of main terminal 70 is the even number, the odd number of (three or more) main terminals 70 may configure the main terminal group 71.

When the number of main terminals 70 is the even number, the number of main terminals 70C and the number of main terminals 70E are same. Therefore, the main currents flowing at the main terminals 70C and 70E become equal. Thereby, it may be possible to suppress the variation in heat generation. In the example shown in FIG. 15, the extension lengths of the main terminals 70C and 70E are equal, and the cross-sectional areas are equal. Thereby, the impedances of the main terminals 70C and 70E are substantially same. Accordingly, it may be possible to effectively prevent the variation in heat generation.

The even number is not limited to four. The even number may be four or more. For example, a configuration including six main terminals 70 or a configuration including eight main terminals 70 may be employed. Similarly to the odd number, the protrusion portions may be different between the adjacent main terminals 70C and 70E. Further, the cross-sectional area of a main terminal having the longer protrusion portion among the main terminals 70C and 70E may be larger than the cross-sectional area of a main terminal having the shorter protrusion portion. Thereby, it may be possible to ensure the rigidity. Further, the impedances of the main terminal 70C and the main terminal 70E can be set to be equal to each other. At a part of the protrusion portion, the lateral surfaces may not face each other.

Figure 16:
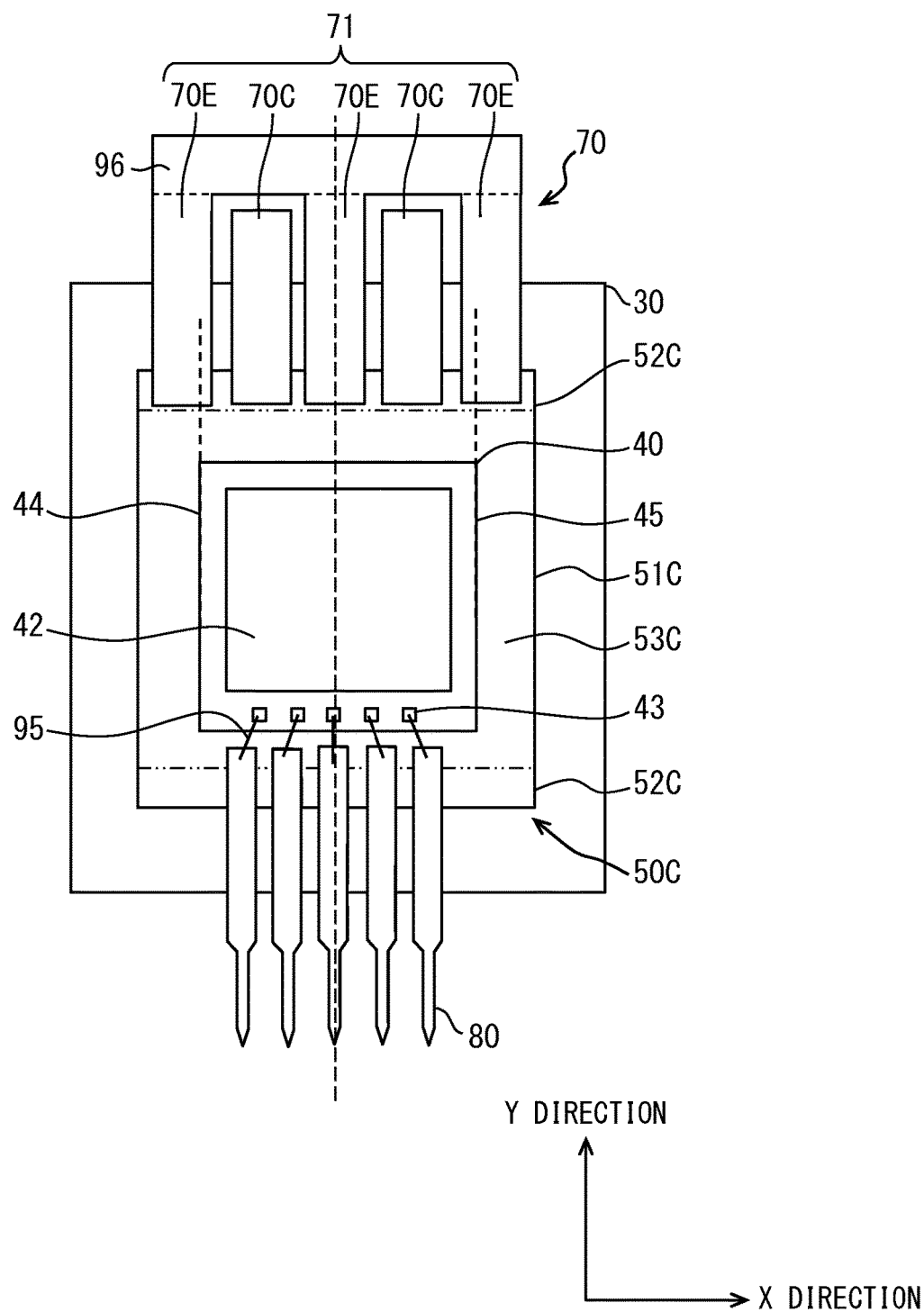
FIG. 16 is a plan view showing another example of the semiconductor device and corresponding to FIG. 7.

As a part of the lead frame, a connection portion is further provided with at least one of the main terminal 70C or the main terminal 70E. At least one of the main terminals 70C or 70E, the same main terminals may be connected to each other by the connection portion. In another example shown in FIG. 16, the semiconductor device 20 includes five main terminals 70, specifically, two main terminals 70C and three main terminals 70E. The lead frame 100 has a connection portion 96 that connects the main terminals 70E to each other. The protrusion length in the main terminal 70E from the sealing resin body 30 is longer than that in the main terminal 70C. The connection portion 96 connects the protrusion tip portion of the main terminal 70E. The connection portion 96 extends in the X direction, and is placed apart from the main terminal 70C in the Y direction. The connection portion 96 is placed at the same position as that of the protrusion portions of the main terminals 70C and 70E in the Z direction.

In such a manner, the main terminal 70 (main terminal 70E) at the same potential is connected by the connection portion 96, and thereby it may be possible to reduce the number of connection points with the bus bar. That is, it may be possible to improve the connectivity. In particular, in FIG. 16, a large number of main terminals 70E are connected. Thereby, in the configuration in which the same lead frame 100 is provided with the main terminals 70C and 70E and the connection portion 96, it may be possible to reduce the connection point. Instead of the main terminal 70E, the main terminal 70C may be connected to the connection portion 96. Of the main terminals 70C and 70E, the small number of terminals may be connected. The number of main terminals 70 and the arrangement are not limited to the example shown in FIG. 16. When the connection portion 96 is provided with one of the main terminal 70C and the main terminal 70E, the connection portion 96 can be placed so as to continue from the protrusion portion of the main terminals 70C and the 70E. It may be combined with a configuration including the even number of main terminals 70.

Each of the main terminals 70C and 70E may be connected by the connection portion. In another example shown in FIG. 17 and FIG. 18, the conductive members 50C and 50E include the main portion 51C and does not include the extension portion 52C, and the conductive member 50E includes the main portion 51E and does not include the extension portion 52E. On the same lead frame, the conductive member 50C, the main terminal 70C, and the signal terminal 80 are placed. At a lead frame different from the lead frame including the main terminal 70C, the conductive member 50E and the main terminal 70E are configured. The main terminal 70C extends from the conductive member 50C, and the main terminal 70E extends from the conductive member 50E. FIG. 18 is a cross-sectional view of the semiconductor device 20 along the XVIII-XVIII of FIG. 17.

Figure 17:
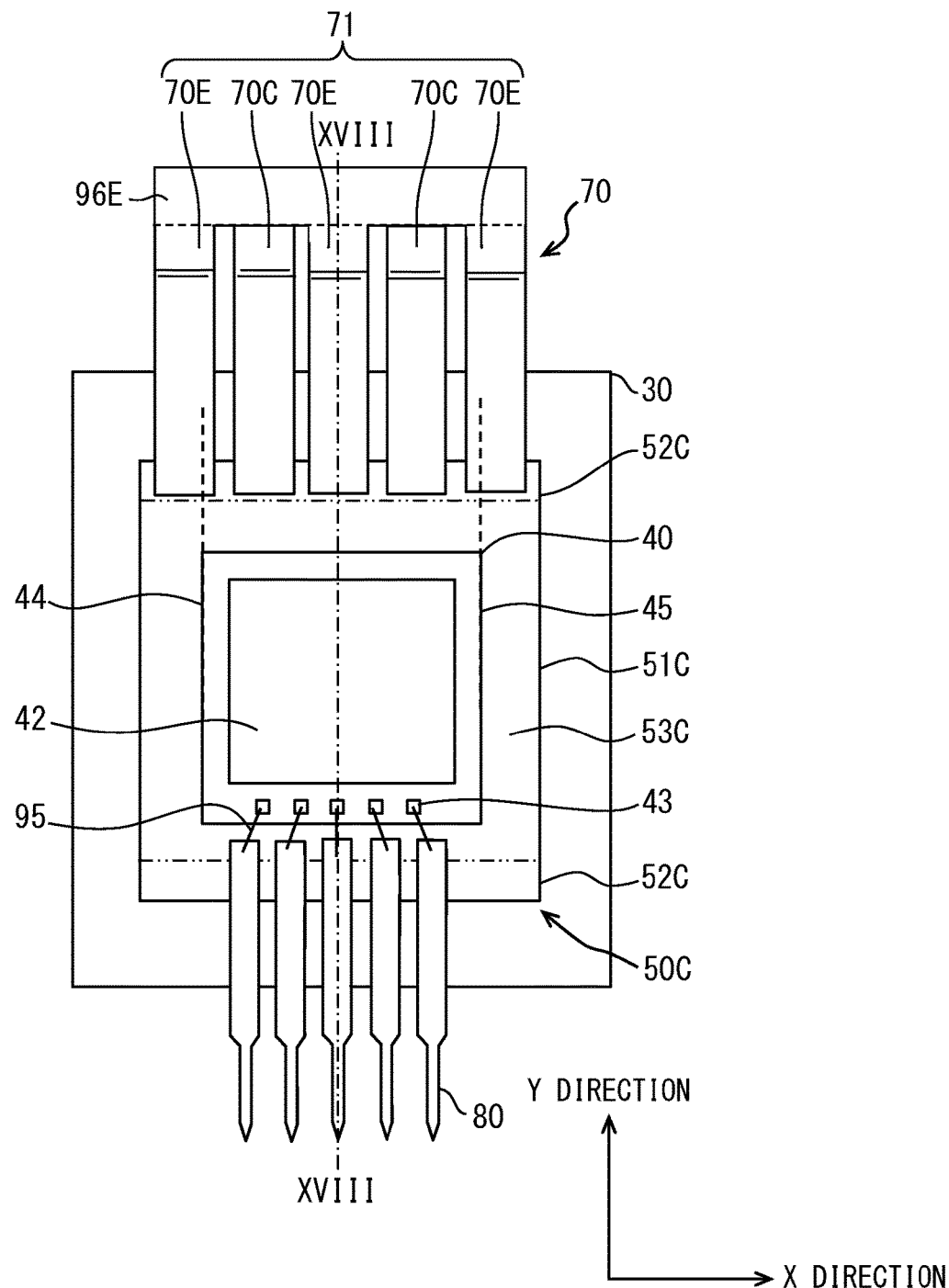
FIG. 17 is a cross-sectional view showing another example of the semiconductor device and corresponding to FIG. 3.
Figure 18:
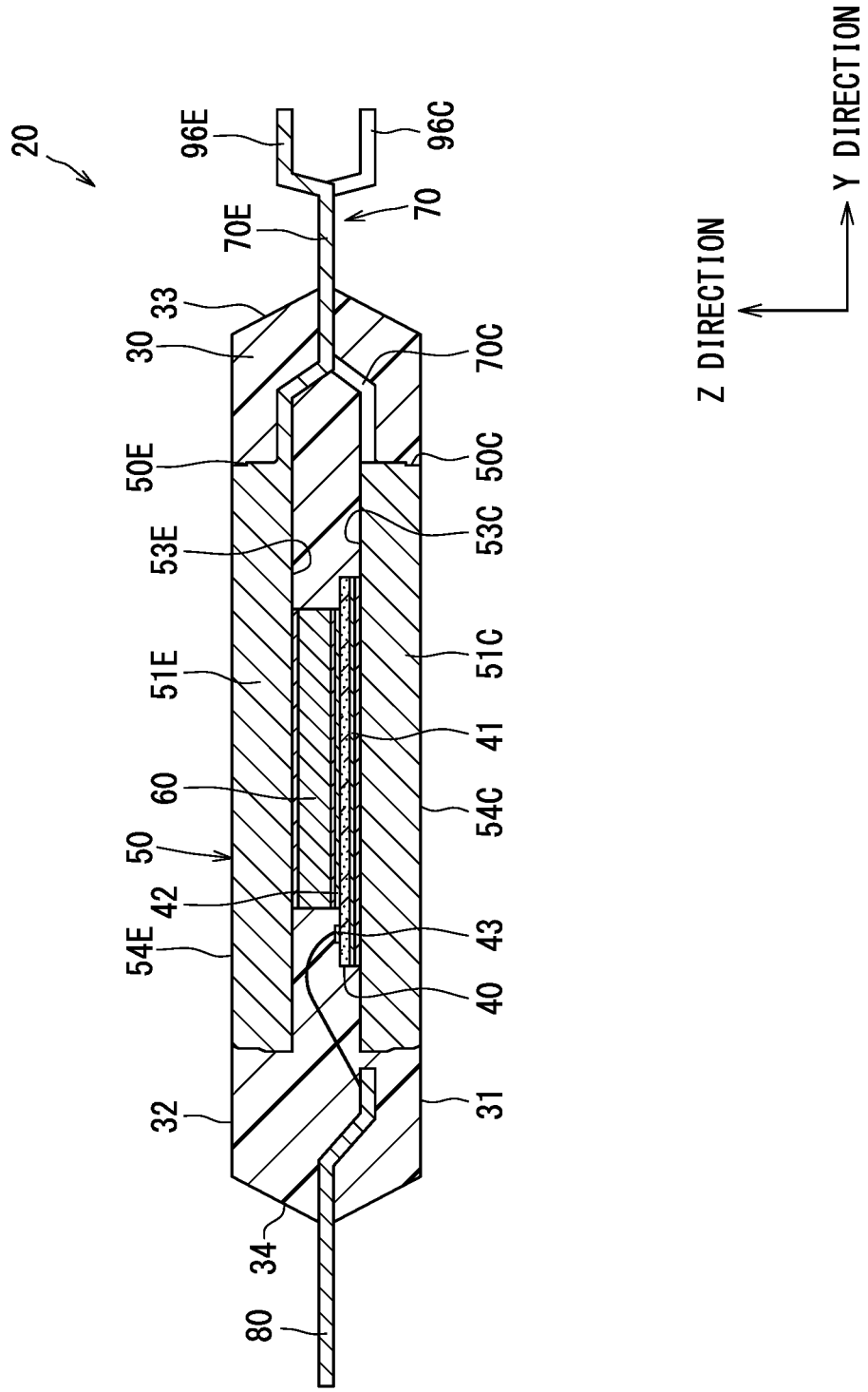
FIG. 18 is a cross-sectional view taken along a XVIII-XVIII line of FIG. 17.

In FIG. 17 and FIG. 18, a connection portion 96C is placed on the lead frame close to the main terminal 70C, and a connection portion 96E is placed on the lead frame close to the main terminal 70E. The connection portion 96C connects the main terminals 70C to each other at the protrusion tip portions. The connection portion 96E connects the main terminals 70E to each other at the protrusion tip portions. The protrusion portion of each of the main terminals 70C and 70E has a bent portion. Thereby, the connection portions 96C and 96E are separated from each other in the Z direction. That is, the connection portions 96C and 96E are placed at different positions in the Z direction. Accordingly, even when the extension lengths are same, the main terminals 70C and the main terminal 70E are respectively connected by the connection portions 96C and 96E. It may be possible to further reduce the number of connection points.

Figure 19:
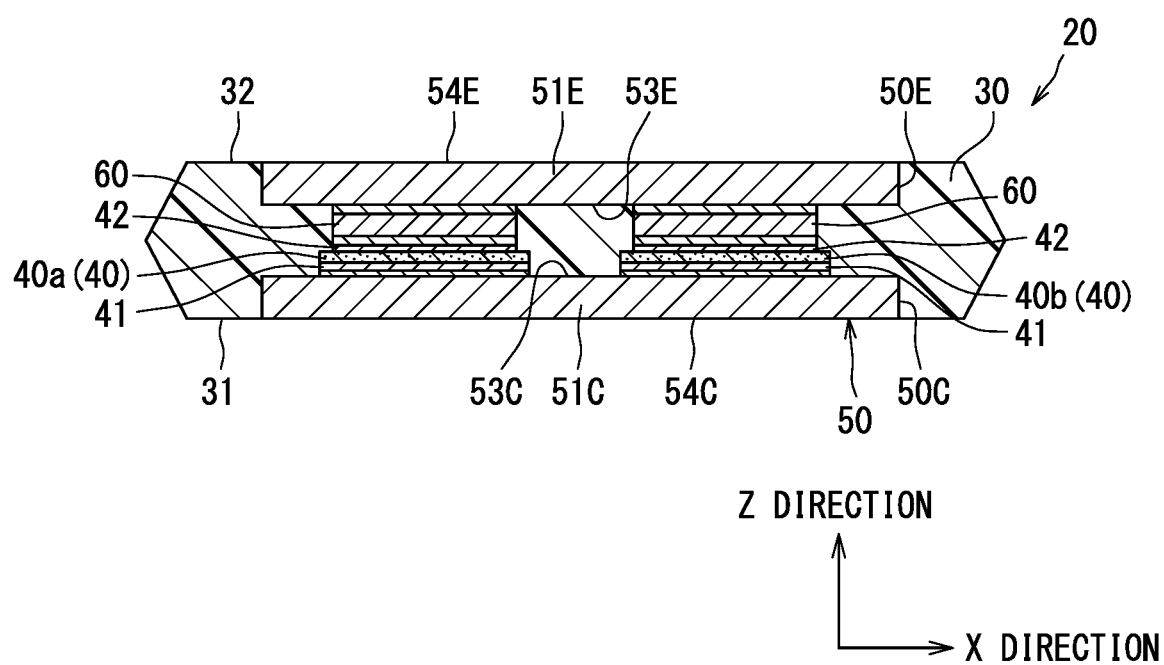
FIG. 19 is a cross-sectional view showing another example of the semiconductor device.
Figure 20:
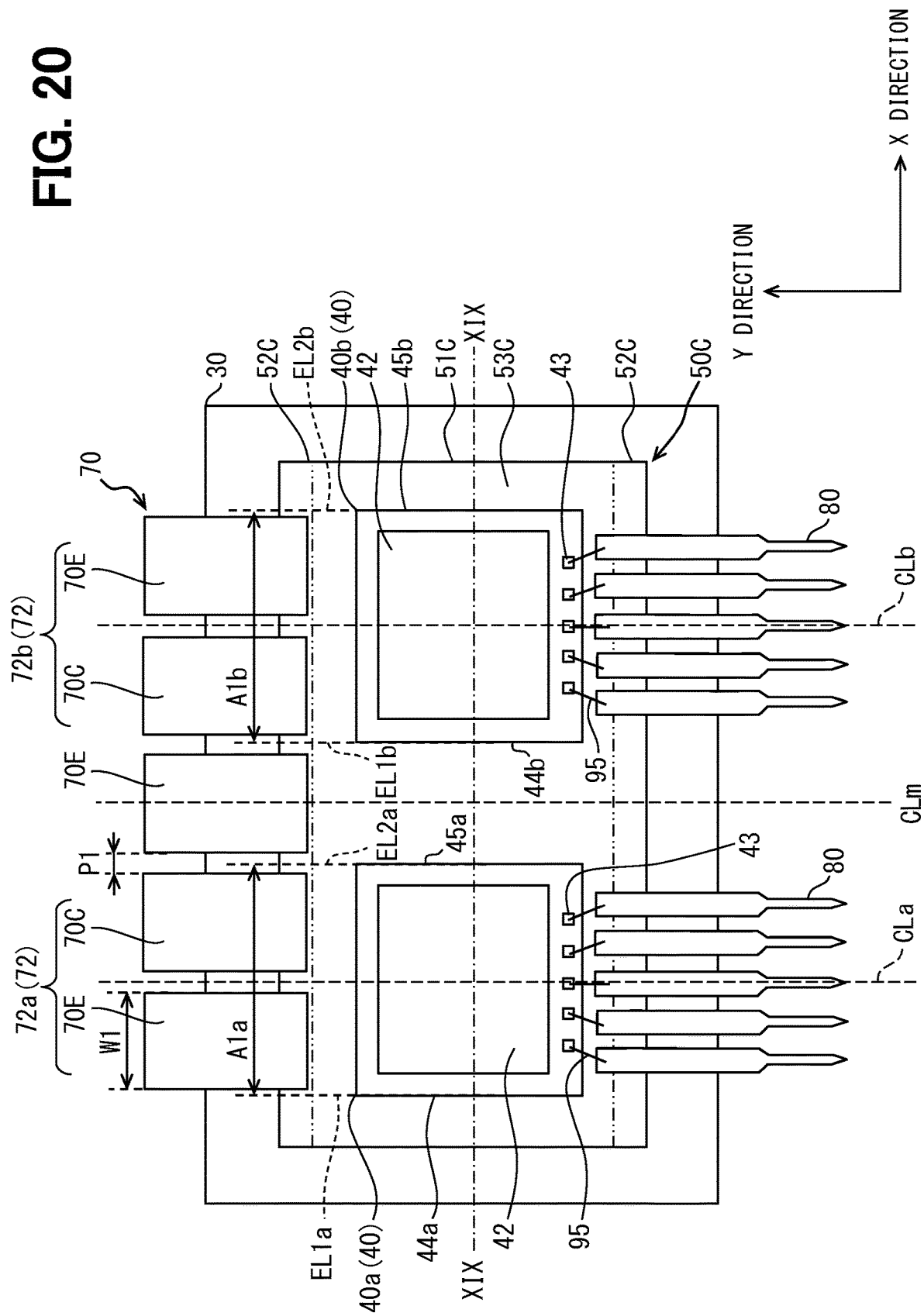
FIG. 20 is a plan view showing a positional relationship between the IGBT and the main terminal and corresponding to FIG. 7.

In another example shown in FIG. 19 and FIG. 20, the semiconductor device 20 includes multiple semiconductor chips 40 connected to each other in parallel. Specifically, the semiconductor device 20 includes, as the semiconductor chip 40, a semiconductor chip 40a and a semiconductor chip 40b. FIG. 19 is a cross sectional view of the semiconductor device 20 corresponding to an XIX-XIX line shown in FIG. 20.

The collector electrodes 41 of the semiconductor chips 40a and 40b are connected to the mounting surface 53C of the same conductive member 50C. The emitter electrodes 42 of the semiconductor chips 40a and 40b are connected to the mounting surface 53E of the same conductive member 50E via the individually placed terminal 60. In the present embodiment, two semiconductor chips 40a and 40b have substantially the same planar shape, specifically, the substantially rectangular planar shape, and has the same size and the same thickness. The semiconductor chips 40a and 40b are positioned at substantially the same height in the Z direction, and placed horizontally in the X direction.

As shown in FIG. 20, a main terminal group 72 includes two or more main terminals 70 continuously arranged in the X direction. The semiconductor device 20 includes, as the main terminal group 72, a main terminal group 72a corresponding to the semiconductor chip 40a and a main terminal group 72b corresponding to the semiconductor chip 40b. At least a part of each main terminal 70 configuring the main terminal group 72a is placed in an region A1a between, in the X direction, extension lines EL1a and EL2a that extend from both end surfaces 44a and 45a of the semiconductor chip 40a. At least a part of each main terminal 70 configuring the main terminal group 72b is placed in an region A1b between, in the X direction, extension lines EL1b and EL2b that extend from both end surfaces 44b and 45b of the semiconductor chip 40b.

The semiconductor device 20 includes five main terminals 70. Specifically, the five main terminals 70 are two main terminals 70C and three main terminals 70E. The widths W1 of the main terminals 70 are equal to each other, the thicknesses of the main terminals 70 are equal to each other, and the intervals P1 of the main terminals 70 are equal to each other. The main terminal 70E in the middle is placed outside the regions A1a and A1b. The main terminal group 72a includes two main terminals 70C and 70E placed closer to the semiconductor chip 40a than the main terminal 70E in the middle in the X direction. The main terminal group 72b includes two main terminals 70C and 70E placed closer to the semiconductor chip 40b than the main terminal 70E in the middle.

Further, the main terminals 70C and 70E configuring the main terminal group 72a are entirely placed in the region A1a. Similarly, the main terminals 70C and 70E configuring the main terminal group 72b are entirely placed in the region A1b. The five main terminals 70 are symmetrically placed with respect to a center line CLm passing through an elemental center of the two semiconductor chips 40. The elemental center is a center position between the centers in the arrangement direction of the semiconductor chips 40a and 40b, the center line CLm is a virtual line that is orthogonal to the arrangement direction and passes through the elemental center line CL.

In such a manner, in the semiconductor device 20 connected to the multiple semiconductor chips 40 in parallel, the main terminal 70C and the main terminal 70E are alternately arranged. The lateral surfaces of the adjacent main terminals 70C and 70E face each other. In such a manner, the multiple lateral surface facing portions of the main terminals 70C and 70E, specifically, four multiple lateral surface facing portions are provided. Therefore, it may be possible to effectively reduce the inductance. At least a part of each of the main terminals 70C and 70E configuring the main terminal group 72a is placed in the region A1a. Accordingly, it may be possible to simplify the current path between the main terminals 70C and 70E configuring the main terminal group 72a and the main electrode of the semiconductor chip 40a, and thereby reduce the inductance. Similarly, at least a part of each of the main terminals 70C and 70E configuring the main terminal group 72b is placed in the region A1b. Accordingly, it may be possible to simplify the current path between the main terminals 70C and 70E configuring the main terminal group 72b and the main electrode of the semiconductor chip 40b, and thereby reduce the inductance. As described above, it may be possible to reduce the inductance of the main circuit wiring as compared with the conventional structure.

The odd number of main terminals 70 are symmetrically placed with respect to the center line CLm of the two semiconductor chips 40. In other words, the lateral surface facing portions are symmetrically placed with respect to the center line CLm. Therefore, the main currents of the semiconductor chips 40a and 40b symmetrically flow with respect to the center line CLm. That is, the inductance for the semiconductor chip 40a and the inductance for the semiconductor chip 40b are substantially equal. In such a manner, since the inductances are equal to each other, it may be possible to prevent current imbalance.

Although the example in which the two semiconductor chips 40 are connected in parallel, it is not limited to this. It can be also applied to a configuration in which three or more semiconductor chip 40 are connected in parallel. The number of main terminals 70 is also not limited. It is sufficient that each main terminal group 72 includes two or more main terminals 70 including the main terminals 70C and 70E. For example, seven main terminals 70 may be provided, and each of the main terminal groups 72a and 72b may include three main terminals 70. The connection portion 96 (86C, 86E) shown in FIGS. 16 to 18 may be combined.

The example in which the switching element and the diode are integrally formed on the same semiconductor chip 40 has been shown. However, it is not limited to this. The switching element and the diode may be formed on different tips. As the semiconductor device 20 having a both surface heat radiation structure, the example including the terminal 60 has been shown. However, it is not limited to this. A configuration that does not include the terminal 60 may be employed. For example, instead of the terminal 60, a protrusion portion protruding toward the emitter electrode 42 may be provided on the conductive member 50E. In addition, the example in which the heat radiation surfaces 42C and 42E are exposed from the sealing resin body 30 has been shown. However, the heat radiation surfaces 54C and 54E may not be exposed from the sealing resin body 30. For example, the heat radiation surfaces 54C and 54E may be covered with an insulation member (not shown). The sealing resin body 30 may be molded in a state where the insulation material is attached to the heat radiation surfaces 54C and 54E.

(Power Module)

One example of the power module 110 applicable to the electric power conversion device 5 of the present embodiment will be described. The power module 110 configures a set of parallel circuits 11.

Figure 26:
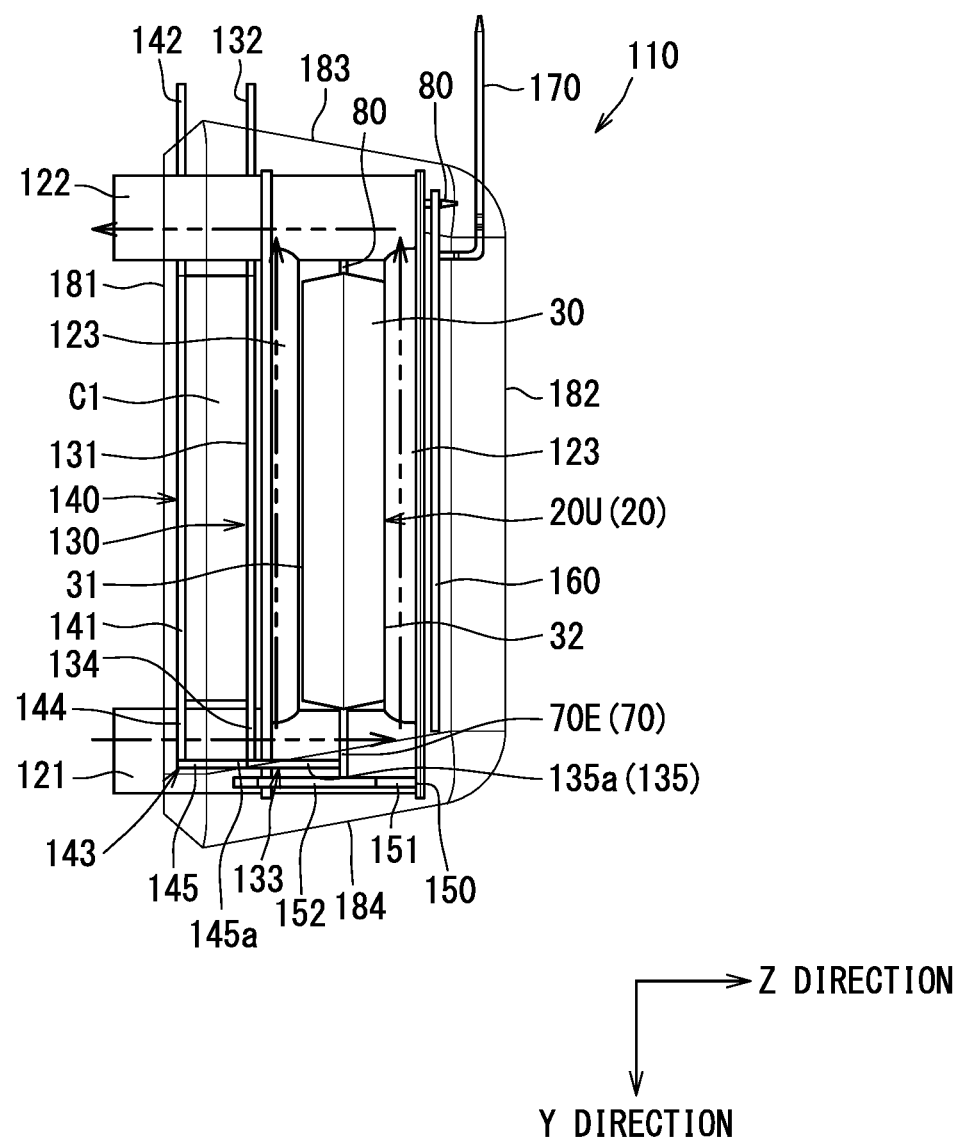
FIG. 26 is a plan view when
Figure 27:
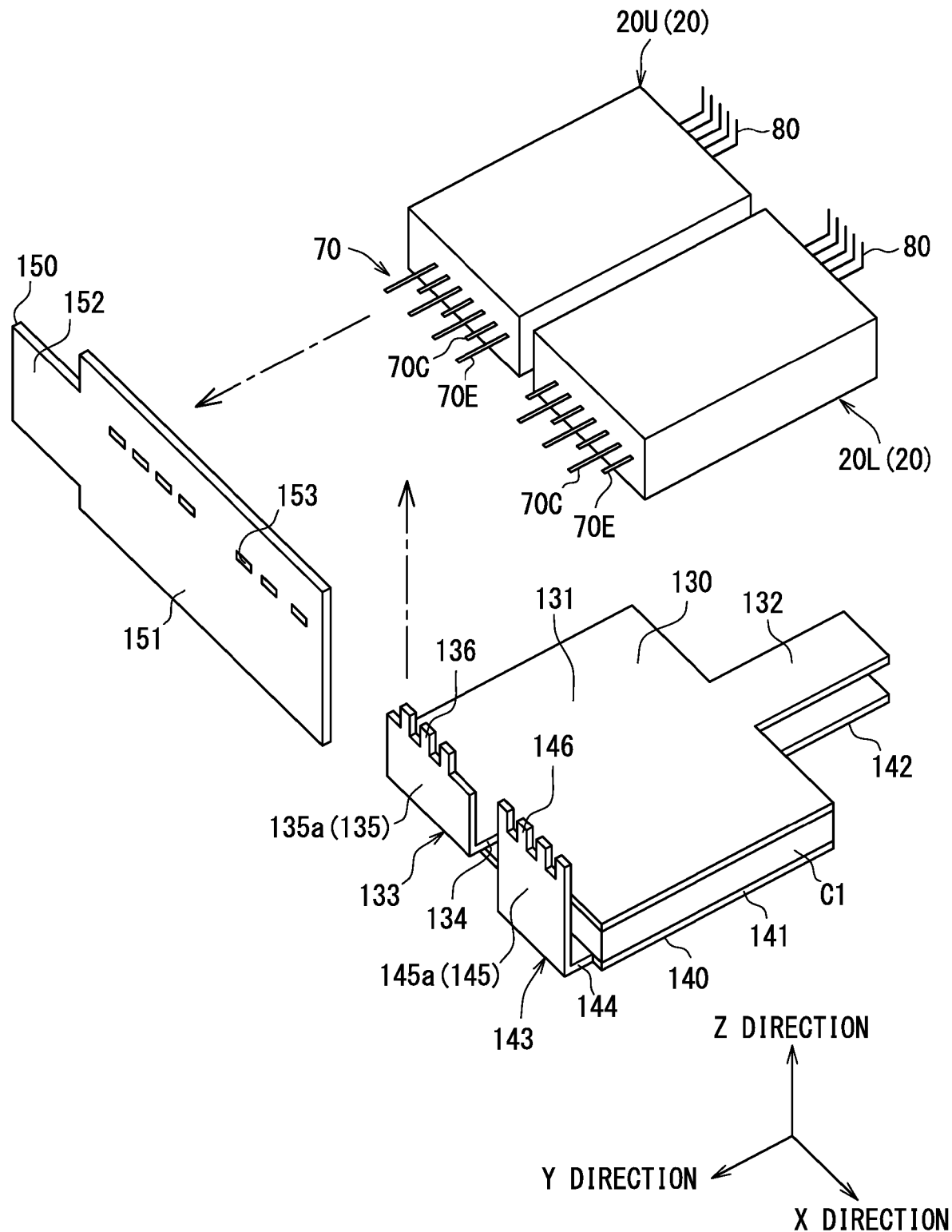
FIG. 27 is a view for illustrating connection among the semiconductor device, a smoothing capacitor, and each bus bar.

As shown in FIGS. 21 to 27, the power module 110 includes the semiconductor device 20, a cooler 120, the capacitor C1, a P bus bar 130, an N bus bar 140, an output bus bar 150, a drive substrate 160, and an external connection terminal 170, and a protective member 180. Although FIG. 21 and FIGS. 23 to 26 are plan views, internal elements are shown by solid lines in order that the internal elements of the protective member 180 are easily understood. FIG. 27 is a schematic view for illustrating the connection of the semiconductor device 20, the capacitor C1, and each of the bus bars 130, 140, and 150.

The semiconductor device 20 has the 1-in-1 package structure. The power module 110 includes two semiconductor devices 20. One semiconductor device 20 configures the upper arm 10U, and the other configures the lower arm 10L. That is, the semiconductor devices 20 are a semiconductor device 20U configuring the upper arm 10U and a semiconductor device 20L configuring the lower arm 10L. The basic configurations of the semiconductor devices 20U and 20L are almost the same as each other. Each of the semiconductor devices 20U and 20L includes seven main terminals 70, specifically, three main terminals 70C and four main terminals 70E. The main terminals 70C and 70E are alternately arranged in the X direction. Hereinafter, the semiconductor chip 40 included in the semiconductor device 20U and configuring the upper arm 10U is referred to as a semiconductor chip 40U. The semiconductor chip 40 included in semiconductor device 20L and configuring the lower arm 10L is referred to as a semiconductor chip 40L.

The semiconductor device 20L has the same structure shown in FIG. 12. The main terminal 70C has the longer protrusion length from the sealing resin body 30 than that of the main terminal 70E. The configuration of the semiconductor device 20U is opposite to that of the semiconductor device 20L. The main terminal 70E has the longer protrusion length from the sealing resin body 30 than that of the main terminal 70C. In such a manner, in the semiconductor device 20U, the main terminal 70E is longer. In the semiconductor device 20L, the main terminal 70C is longer. The main terminal 70C of the semiconductor device 20U and the main terminal 70E of the semiconductor device 20L have the same length. The main terminal 70E of the semiconductor device 20U and the main terminal 70C of the semiconductor device 20L have the same length.

The semiconductor devices 20U and 20L are arranged in the X direction, the predetermined gap is provided between the semiconductor devices 20U and 20L. That is, the semiconductor devices 20U and 20L are arranged in the plate thickness direction of the semiconductor chip 40, that is, the direction orthogonal to the Z direction. The first surfaces 31 of the sealing resin bodies 30 of the semiconductor devices 20U and 20L are arranged on the same side in the Z direction. The second surfaces 32 are arranged on the same side. The first surfaces 31 of the semiconductor devices 20U and 20L have a substantially flush positional relationship in the Z direction with each other, and the second surfaces have the substantially flush positional relationship in the Z direction with each other.

For each of the semiconductor devices 20U and 20L, the protrusion portion of the signal terminal 80 from the sealing resin body 30 has a substantially L shape. The protrusion portion of the signal terminal 80 has one bent portion of approximately 90 degrees. In the protrusion portion of the signal terminal 80, a portion from the root of the sealing resin body 30 to the bent portion extends in the Y direction. A portion from the bent portion to the protrusion tip extends in the Z direction and extends towards the side opposite to the capacitor C1.

The cooler 120 mainly cools the semiconductor device 20. The cooler 120 is formed of a material having excellent thermal conductivity, for example, an aluminum-based material. The cooler 120 includes a supply pipe 121, a discharge pipe 122, and a heat exchange portion 123. The cooler 120 is also referred to as an in-module cooler since the cooler 120 is placed in the power module 110.

The heat exchange portion 123 is configured by a pair of plates 124 and 125. The plates 124 and 125 are formed of the metal plate having the substantially rectangular plane shape. At least one of the plate 124 or 125 is pressed to have a shape bulging in the Z direction, for example, have a pot bottom shape having a shallow bottom. In the present example, the plate 124 has the pot bottom shape. Outer peripheral edges of the plates 124 and 125 are fixed by swage or the like, and the entire circumference are joined to each other by brazing or the like. Thereby, a flow path 126 is formed between the plates 124 and 125.

The heat exchange portion 123 has a flat tubular body as a whole. The cooler 120 has two heat exchange portions 123. The heat exchange portions 123 are arranged in two stages in the Z direction. The two semiconductor devices 20U and 20L are sandwiched by the two heat exchange portions 123 in a state where the two semiconductor devices 20U and L are arranged in the X direction. The two heat exchange portions 123 are placed so that the plates 124 face each other. One of the heat exchange portions 123 is placed close to the first surface 31 of the semiconductor device 20. The other of the heat exchange portions 123 is placed close to the second surface 32. In a configuration in which the heat radiation surfaces 54C and 54E are exposed from the sealing resin body 30, an electric insulation member such as a grease, a ceramic plate, a resin member, or the like is placed between the semiconductor device 20 and the plate 124 of the heat exchange portion 123.

The supply pipe 121 is a tubular body including a flow path therein, and extends in the Z direction. The supply pipe 121 is placed at, in the X direction, one end of the heat exchange portion 123 having the substantially rectangular plane shape and, in the Y direction, the end close to the main terminal 70. The supply pipe 121 communicates with each heat exchange portion 123, and the flow path of the supply pipe 121 continues from the flow path 126 of the heat exchange portion 123. In the Z direction, one end of the supply pipe 121 opens, and the other end is connected to the heat exchange portion 123 of the second stage. The flow path 126 of the heat exchange portion 123 of the first stage is connected to the flow path of the supply pipe 121 in the middle of the extension of the supply pipe 121. The first stage is on the side near the open ends of the supply pipe 121 and the discharge pipe 122, and the second stage is the side far from the open ends. A part of the supply pipe 121 protrudes from the open end of the supply pipe 121 to the outside of the protective member 180.

The discharge pipe 122 is a tubular body including a flow path therein, and extends in the Z direction. The discharge pipe 122 is placed at, in the X direction, an end opposite to the supply pipe 121 with respect to the heat exchange portion 123 having the substantially rectangular plane shape, and the end is close to the signal terminal 80 in the Y direction. The discharge pipe 122 communicates with each heat exchange portion 123, and the flow path of the discharge pipe 122 continues from the flow path 126 of the heat exchange portion 123. The discharge pipe 122 is open similarly to the supply pipe 121 in the Z direction. The end opposite to the open end is connected to the second stage heat exchange portion 123. The flow path 126 of the heat exchange portion 123 of the first stage is connected to the flow path of the discharge pipe 122 in the middle of the extension of the discharge pipe 122. A part of the discharge pipe 122 protrudes from the open end of the discharge pipe 122 to the outside of the protective member 180.

As shown by a long dashed double-dotted line arrow in FIG. 26, the refrigerant flowing in from the supply pipe 121 expands the flow path 126 in the heat exchange portion 123, and is discharged from the discharge pipe 122. The supply pipe 121 and the discharge pipe 122 are placed at diagonal positions in the substantially rectangular plane shape. In such a manner, by providing the supply pipe 121 and the discharge pipe 122 at the diagonal positions, it may be possible to effectively cool the semiconductor chips 40U and 40L placed between the supply pipe 121 and the discharge pipe 122 in the X direction and the Y direction. Although not shown, an inner fin is placed inside the flow path 126 of the heat exchange portion 123. The inner fin is a metal plate that is bent and formed in a wavy shape. By placing the inner fin, it may be possible to promote the heat transfer between each of the plates 124 and 125 and the refrigerant flowing through the flow path 126.

As the refrigerant flowing through the flow path 126, a phase transition refrigerant such as water or ammonia or a non-phase transition refrigerant such as ethylene glycol can be used. The cooler 120 mainly cools the semiconductor device 20. However, in addition to the cooling function, the cooler 120 may have a warming function when the environmental temperature is low. Then, the cooler 120 may be referred to as a temperature adjusting instrument. The refrigerant is referred to as a heat medium.

The capacitor C1 is placed in the vicinity of a set of the semiconductor devices 20U and 20L of the power module 110. It is sufficient that the capacitor C1 has, at least, a function of supplying the electric charge necessary for the switching. Therefore, the capacitance of the capacitor C1 is set to, for example, 10 µF to 20 µF. The capacitor C1 has the substantially rectangular parallelepiped shape. The capacitor C1 has a flat shape. The thickness, that is, a length in the Z direction is set to be sufficiently smaller than a length in the X direction and a length in the Y direction. In such a manner, the capacitor C1 is set to be small. As the capacitor C1, for example, a film capacitor can be used.

In the present example, the capacitor has a plane rectangular shape in which the length the in the X direction is longer than that in the Y direction. In a projection view in the Z direction, most of the capacitor C1 is placed at a position overlapping with the heat exchange portion 123 of the cooler 120. In the same projection view, most of the capacitor C1 overlaps with most of the semiconductor devices 20U and 20L, specifically, a portion other than the projection portion of the main terminal 70 and the projection portion of the signal terminal 80. Accordingly, the capacitor C1 and the semiconductor devices 20U and 20L are arranged in the Z direction. The capacitor C1 having the flat rectangular shape is placed at a position where the both ends in the X direction do not overlap with the cooler 120, that is, outside the cooler 120.

The capacitor C1 is placed so that the heat exchange portion 123 is sandwiched by the capacitor C1 and the semiconductor device 20. The capacitor C1 is placed on the opposite side to the semiconductor device 20 with respect to the heat exchange portion 123. In the present example, the capacitor C1 is placed on the opposite side to the semiconductor device 20 with respect to the heat exchange portion 123 of the first stage. That is, the capacitor C1 is placed close to the open ends of the supply pipe 121 and the discharge pipe 122. The capacitor C1 is placed at a position closer to the semiconductor device 20 than the open ends of the supply pipe 121 and the discharge pipe 122 in the Z direction. In the capacitor C1, a surface close to the heat exchange portion 123 in the Z direction has a positive electrode terminal (not shown) for external connection, and a surface opposite to the positive electrode terminal has a negative electrode (not shown).

The P bus bar 130, the N bus bar 140, and the output bus bar 150 are metal plate materials including a metal having excellent conductivity such as copper, for example. In the present example, the thickness of each bus bar is almost uniform. The P bus bar 130, the N bus bar 140, and the output bus bar 150 have substantially the same thickness. As the metal plate material, a plate material of which thicknesses is partially different can be used. The P bus bar 130, the N bus bar 140, and the output bus bar 150 are electrically separated from the cooler 120.

The P bus bar 130 includes a connection portion 131, a common wiring portion 132, and a parallel wiring portion 133. The connection portion 131 is a portion connected to the positive electrode terminal of the capacitor C1. In the present example, in the projection view of the Z direction, the entire portion overlapping with the capacitor C1 is the connection portion 131. Although not shown, the connection portion 131 may be placed at the portion overlapping with the capacitor C1 in the projection view in the X direction or the Y direction, that is, the lateral surface of the capacitor C1.

The common wiring portion 132 extends from one end, in the Y direction, of the connection portion 131. The common wiring portion 132 is a portion that functions as the common wiring 11P in the P bus bar 130. Thereby, the set of upper-lower arm circuits 10 in the power module 110 and the capacitor C1 are not individually connected to the VH line 12H but also are commonly connected. In the X direction, a length of the common wiring portion 132, that is, a width is shorter than that of the connection portion 131. In the X direction, the common wiring portion 132 continues from a central portion of the connection portion 131. The common wiring portion 132 is substantially flush with the connection portion 131 and extends in the Y direction. A part of the common wiring portion 132 protrudes to the outside of the protective member 180.

The parallel wiring portion 133 functions as, at least, a wiring electrically connecting the positive electrode terminal of the capacitor C1 and the upper arm 10U of the upper-lower arm circuit 10, that is, a wiring connecting the upper-lower arm circuit 10 and the capacitor C1 in parallel. Further, in the present embodiment, the parallel wiring portion 133 also functions as a wiring electrically connecting the upper arm 10U to the common wiring 11P, that is, the common wiring portion 132. The parallel wiring portion 133 extends from an end of the connection portion 131 and the end is opposite to the common wiring portion 132.

A width of the parallel wiring portion 133 is narrower than that of the connection portion 131. The parallel wiring portion 133 is extended with a constant width. The parallel wiring portion 133 is placed on one side with respect to a center line CL1 so as not to straddle the center line CL1 bisecting the capacitor C1 in the X direction (see FIG. 23). The parallel wiring portion 133 continues from the connection portion 131 at a position close to the semiconductor device 20U (semiconductor chip 40U) in the arrangement direction of the semiconductor devices 20U and 20L.

The parallel wiring portion 133 is substantially L-shaped. The parallel wiring portion 133 includes a parallel portion 134 extending from a boundary portion with the connection portion 131 along the Y direction and a bent portion 135 that is bent with respect to the parallel portion 134 and extend along the Z direction. Therefore, the parallel portion 134 is also referred to as a Y direction extension portion. The bent portion 135 is also referred to as a Z direction extension portion. The parallel portion 134 extends in the Y direction towards the opposite side to the common wiring portion 132. The parallel portion 134 is substantially flush with the connection portion 131 and extends in the Y direction.

In the projection view in the Z direction, the parallel portion 134 overlaps with at least a part of each of the seven main terminals 70C and 70E of the semiconductor device 20U. The parallel portion 134 extends to substantially the same position as the protrusion tip of the main terminal 70C of the semiconductor device 20U, and overlaps with the entire protrusion portion of the three main terminals 70C in the projection view. The four main terminals 70E extend to a position that is more far from the capacitor C1 than a position of the parallel portion 134.

The bent portion 135 extends towards the opposite side to the capacitor C1 in the Z direction. A plate thickness direction of the bent portion 135 is substantially parallel to the Y direction. In the present example, the entire of the bent portion 135 is a facing portion 135a facing the output bus bar 150 in the Y direction. The surfaces of the facing portion 135a and the output bus bar 150 in the plate thickness direction, that is, the plate surfaces face each other. At the tip of the facing portion 135a, that is, the tip of the extension of the parallel wiring portion 133, a convex portion 136 is formed so that the main terminal 70C of the semiconductor device 20U is connected. The convex portion 136 is placed for each main terminal 70C. The main terminal 70C is joined by laser welding or the like in a state where the main terminal 70C is placed on a tip surface of the corresponding convex portion 136. When the convex portion 136 is placed in such a manner, the main terminal 70E passes through a concave portion at which the convex portion 136 is not placed. Therefore, the contact between the P bus bar 130 and the main terminal 70E is prevented.

The N bus bar 140 includes a connection portion 141, a common wiring portion 142, and a parallel wiring portion 143. The connection portion 141 is a portion connected to the negative electrode terminal of the capacitor C1. In the present example, in the projection view of the Z direction, the entire portion overlapping with the capacitor C1 is the connection portion 141. Similarly to the connection portion 131, the connection portion 141 may be placed at the portion overlapping with the capacitor C1 in the projection view in the X direction or the Y direction, that is, the lateral surface of the capacitor C1. The capacitor C1 and the connection portions 131 and 141 placed on both surfaces of the capacitor C1 are electrically separated from the cooler 120. Between the capacitor C1 including the connection portions 131 and 141 and the cooler 120, an electric insulation member is placed.

The common wiring portion 142 extends from one end, in the Y direction, of the connection portion 141. The common wiring portion 142 is a portion that functions as the common wiring 11N in the N bus bar 140. Thereby, the set of upper-lower arm circuits 10 in the power module 110 and the capacitor C1 are not individually connected to the N line 13 but also are commonly connected. The width of the common wiring portion 142 is narrower than the width of the connection portion 141, and substantially same as that of the common wiring portion 132. In the X direction, the common wiring portion 142 continues from a central portion of the connection portion 141. The common wiring portion 142 is substantially flush with the connection portion 141 and extends in the Y direction. A part of the common wiring portion 132 protrudes to the outside of the protective member 180.

The common wiring portions 132 and 142 conform with each other in the projection view in the Z direction. The common wiring portions 132 and 142 are arranged so as to face each other with an interval substantially equal to the thickness of the capacitor C1 in the Z direction. Thereby, it may be possible to reduce the inductance of the main circuit wiring.

The parallel wiring portion 143 functions as, at least, a wiring electrically connecting the negative electrode terminal of the capacitor C1 and the lower arm 10L of the upper-lower arm circuit 10, that is, a wiring connecting the upper-lower arm circuit 10 and the capacitor C1 in parallel. Further, in the present embodiment, the parallel wiring portion 143 also functions as a wiring electrically connecting the lower arm 10L to the common wiring 11N, that is, the common wiring portion 142. The parallel wiring portion 143 extends from an end of the connection portion 141 and the end is opposite to the common wiring portion 142.

A width of the parallel wiring portion 143 is narrower than that of the connection portion 141. The parallel wiring portion 143 is extended with a constant width. The parallel wiring portion 143 placed on the side opposite to the parallel wiring portion 133 with respect to the center line CL1 so as not to straddle the center line CL1 of the capacitor C1. The parallel wiring portion 143 continues from the connection portion 141 at a position close to the semiconductor device 20L (semiconductor chip 40L) in the arrangement direction of the semiconductor devices 20U and 20L.

The parallel wiring portion 143 is substantially L-shaped. The parallel wiring portion 143 includes a parallel portion 144 extending from a boundary portion with the connection portion 141 along the Y direction and a bent portion 145 that is bent with respect to the parallel portion 144 and extend along the Z direction. The parallel portion 144 extends in the Y direction towards the opposite side to the common wiring portion 142. The parallel portion 144 is substantially flush with the connection portion 141 and extends in the Y direction. The parallel portions 134 and 144 are laterally arranged in the X direction with an interval for ensuring the electrical insulation. The lateral surfaces of the parallel portions 134 and 144 face each other. Thereby, it may be possible to reduce the inductance of the main circuit wiring.

In the projection view in the Z direction, the parallel portion 144 overlaps with at least a part of each of the seven main terminals 70C and 70E of the semiconductor device 20L. The parallel portion 144 extends to substantially the same position as the protrusion tip of the main terminal 70E of the semiconductor device 20L, and overlaps with the entire protrusion portion of the four main terminals 70E in the projection view. The three main terminals 70C extend to a position that is more far from the capacitor C1 than a position of the parallel portion 144. Positions of protrusion tips of the main terminal 70C of the semiconductor device 20U and the main terminal 70E of the semiconductor device 20L are substantially same position in the Y direction. Thereby, positions of the tips of the extension of the parallel portions 134 and 144 are substantially same.

The bent portion 145 extends towards the opposite side to the capacitor C1 in the Z direction. A plate thickness direction of the bent portion 145 is substantially parallel to the Y direction. A position of the extended tip of the bent portion 145 is same as that of the extended tip of the bent portion 135 of the P bus bar 130. The bent portions 135 and 145 are laterally arranged in the X direction with an interval for ensuring the electrical insulation. The lateral surfaces of the bent portions 135 and 145 face each other. Thereby, it may be possible to reduce the inductance of the main circuit wiring.

In the present example, the position of the N bus bar 140 is more far from the semiconductor device 20 in the Z direction than that of the P bus bar 130. A part of the bent portion 145 is a facing portion 145a facing the output bus bar 150 in the Y direction. The plate surfaces of the facing portion 145a and the output bus bar 150 face each other. At the tip of the facing portion 145a, that is, the tip of the extension of the parallel wiring portion 143, a convex portion 146 is formed so that the main terminal 70E of the semiconductor device 20L is connected. The convex portion 146 is placed for each main terminal 70E. The main terminal 70E is joined by laser welding or the like in a state where the main terminal 70E is placed on a tip surface of the corresponding convex portion 146. When the convex portion 146 is placed in such a manner, the main terminal 70C passes through a concave portion at which the convex portion 146 is not placed. Therefore, the contact between the N bus bar 140 and the main terminal 70C is prevented.

The parallel wiring portion 133 and the main terminal 70C of the semiconductor device 20U connects the positive electrode of the capacitor C1 to the collector electrode of the upper arm 10U. The parallel wiring portion 143 and the main terminal 70E of the semiconductor device 20L connects the negative electrode of the capacitor C1 to the emitter electrode of the lower arm 10L. In such a manner, the parallel wiring portion 133, the main terminal 70C of the semiconductor device 20U, the parallel wiring portion 143, and the main terminal 70E of the semiconductor device 20L connect the upper-lower arm circuit 10 and the capacitor C1 in parallel, and the parallel circuit 11 is configured. The common wiring portions 132 and 142 connect the parallel circuit to the VH line 12H and the N line 13 that are an electric power line.

The output bus bar 150 is a bus bar for connecting the connection point between the upper arm 10U and the lower arm 10L to a three-phase winding of the motor generator. The output bus bar 150 is also referred to as an O bus bar. The output bus bar 150 is placed, in the Y direction, not close to the signal terminal 80 but close to the main terminal 70. The output bus bar 150 extends in the X direction without having the bent portion, when the plate thickness direction is the Y direction. The output bus bar 150 configures at least a part of the output wiring 15. In the periphery of the output bus bar 150, a current sensor (not shown) can be placed.

The output bus bar 150 includes a wide width portion 151 having a wide length in the Z direction, that is, a wide width and a narrow width portion 152 having a width narrower than that of the wide width portion 151. The narrow width portion 152 continues from one end of the wide width portion 151, is substantially flush with the wide width portion 151 and extends in the X direction. The wide width portion 151 is entirely placed inside the protective member 180. The narrow width portion 152 is partially placed inside the protective member 180, and the remaining portion protrudes outside the protective member 180.

The wide width portion 151 is placed so as to substantially conform with, in the X direction, a region between an end of the parallel wiring portion 143 far from the center line CL1 and an end of the parallel wiring portion 133 far from the center line CL1. In the X direction, the supply pipe 121 is placed close to the tip of the wide width portion 151. The wide width portion 151 is provided with the predetermined interval from the bent portions 135 and 145 in the Y direction. For example, in the semiconductor device 20U, the predetermined interval substantially conforms with a length obtained by subtracting a plate thickness of the output bus bar 150 from a length between the protrusion tips of the main terminals 70C and 70E. The wide width portion 151 is placed in a region, in the Z direction, from a position overlapping with the capacitor C1 the plate 125 configuring the heat exchange portion 123 of the second stage.

In the wide width portion 151, multiple penetration holes 153 are formed. The main terminal 70E of the semiconductor device 20U and the main terminal 70C of the semiconductor device 20L are inserted into the penetration holes 153. In the inserted state, the main terminal 70 is connected to the wide width portion 151 (output bus bar 150) by the laser welding or the like. A facing portion 154p for the P bus bar 130 and a facing portion 154n for the N bus bar 140 are configured so as to avoid the penetration holes 153. The facing portion 154p of the output bus bar 150 and the facing portion 135a of the P bus bar 130 face each other with the predetermined interval in the Y direction. The facing portion 154n of the output bus bar 150 and the facing portion 145a of the N bus bar 140 face each other with the predetermined interval in the Y direction.

Since the supply pipe 121 exists, the width of the parallel wiring portion 143 is narrower than that of the parallel wiring portion 133. Thereby, the width of the facing portion 145a is narrower than that of the facing portion 135a. However, in the capacitor C1, since the negative electrode terminal is placed on the side opposite to the heat exchange portion 123, the extension length in the facing portion 145a is obtained. The length of the facing portion 145a in the Z direction is longer than that of the facing portion 135a. Thereby, the facing area of the facing portion 135a and the facing portion 154p is substantially equal to the facing area of the facing portion 145a and the facing portion 154n. It may be possible to reduce the inductance while preventing the size in the X direction from increasing.

The drive substrate 160 is formed by mounting an electronic component (not shown) on a printed substrate. The drive substrate 160 is formed with a drive circuit portion (driver) that receives the drive instruction from the control circuit portion 9. The drive substrate 160 corresponds to a circuit board. The drive substrate 160 has a substantially rectangular planar shape. In the present example, the size of the drive substrate 160 is substantially same as that of the heat exchange portion 123 of the cooler 120 in the X direction. The size is longer than that of the heat exchange portion 123 in the Y direction. In the projection view from the Z direction, the drive substrate 160 is placed so as to overlap with most of the semiconductor devices 20U and 20L. Specifically, they are placed so as to overlap with each other except for a part of the main terminal 70. In the Y direction, a part of the main terminal 70, the bent portions 135 and 145, the output bus bar 150 are placed so as not to overlap with the drive substrate 160. On the side opposite to the main terminal 70, the common wiring portions 132 and 142 protrude outward as compared with the drive substrate 160.

The drive substrate 160 is connected to the signal terminal 80 of the semiconductor device 20. In the present embodiment, multiple penetration holes (not shown) are formed in the drive substrate 160. The signal terminals 80 are inserted into the multiple penetration holes, and mounted. Thereby, a drive signal is output from the drive circuit portion formed on the drive substrate 160 via the signal terminal 80. The signal terminals 80 are arranged in the X direction. The multiple signal terminals 80 are arranged in a line in the X direction, inserted, and mounted near one end of the drive substrate 160 in the Y direction.

The external connection terminal 170 is a terminal for electrically connecting a control substrate (not shown) and the drive substrate 160. In the control substrate, the control circuit portion 9 is formed. The drive substrate 160 is connected to the multiple external connection terminals 170. In the present embodiment, multiple penetration holes (not shown) are formed in the drive substrate 160. The external connection terminals 170 are inserted into the multiple penetration holes, and mounted. A part of the external connection terminals 170 transmits the drive instruction of the control circuit portion 9 to the drive circuit portion of the drive substrate 160.

The external connection terminal 170 is substantially L-shaped. The external connection terminal 170 has one bent portion of approximately 90 degrees. Of the external connection terminal 170, a portion from the connection portion with the drive substrate 160 to the bent portion extends in the Z direction, and a portion from the bent portion to the tip extends toward the common wiring portions 132 and 142 in the Y direction. A portion of a predetermined range from the tip protrudes to the outside of the protective member 180.

The protective member 180 protects other elements configuring the power module 110. The protective member 180 forms an outer shell of the power module 110. As the protective member 180, a sealing resin body integrally sealing the other elements, a preformed housing, or the like can be used. When the case is used, in order to improve the protection, a potting material or the like may be used in combination. In the present embodiment, as the protective member 180, the sealing resin body is used. The sealing resin body is formed of a sealing material such as an epoxy resin, and is also referred to as a mold resin or a resin molded body. The sealing resin body is formed by, for example, a transfer molding method.

The protective member 180 has, in the Z direction, a first surface 181, and a second surface 182 opposite to the first surface 181. The first surface 181 and the second surface 182 are planes orthogonal to the Z direction. The protective member 180 of the present embodiment has a substantially truncated square pyramid shape. Therefore, the protective member 180 has four lateral surfaces 183 to 186. When the first surface 181 is a reference surface, each of the lateral surfaces 183 to 186 is also an inclined surface. An angle between each of the lateral surfaces 183 to 186 and the first surface 181 is an acute angle.

Components configuring the power module 110 are the connection portion 141 of the N bus bar 140, the capacitor C1, the connection portion 131 of the P bus bar 130, the heat exchange portion 123 of the first stage, the semiconductor device 20, the heat exchange portion 123 of the second stage, the drive substrate 160 that are arranged in a direction from the first surface 181 to the second surface 182 in this order. The supply pipe 121 and the discharge pipe 122 protrude from the first surface 181 to the outside of the protective member 180. Nothing protrudes from the second surface 182. Although not shown, the drive substrate 160, the heat exchange portion 123 of the first stage, the semiconductor device 20, the heat exchange portion 123 of the second stage, the connection portion 141 of the N bus bar 140, the capacitor C1, the connection portion 131 of the P bus bar 130 may be arranged in a direction from the first surface 181 to the second surface 182 in this order.

Figure 21:
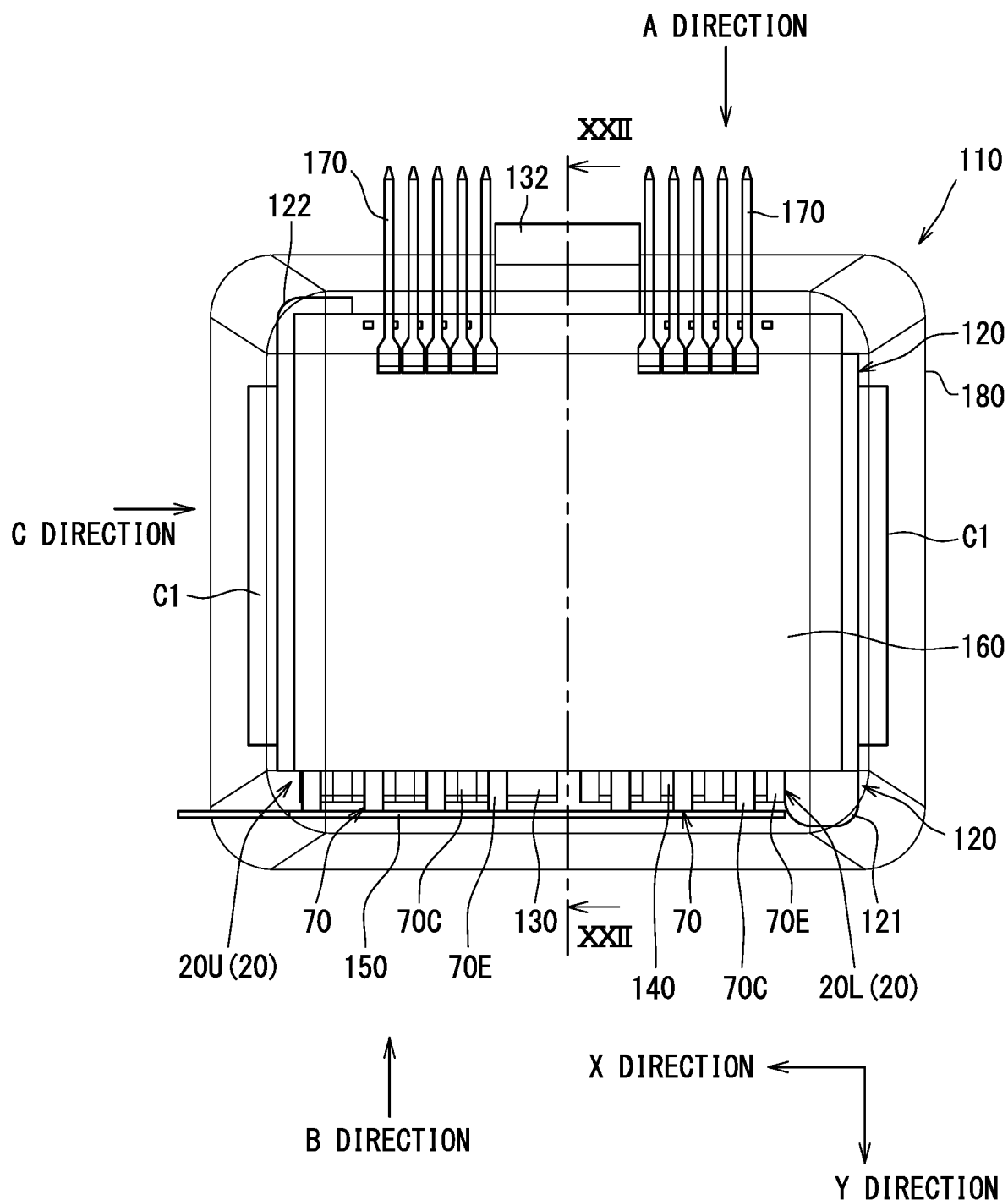
FIG. 21 is a plan view showing a power module.
Figure 22:
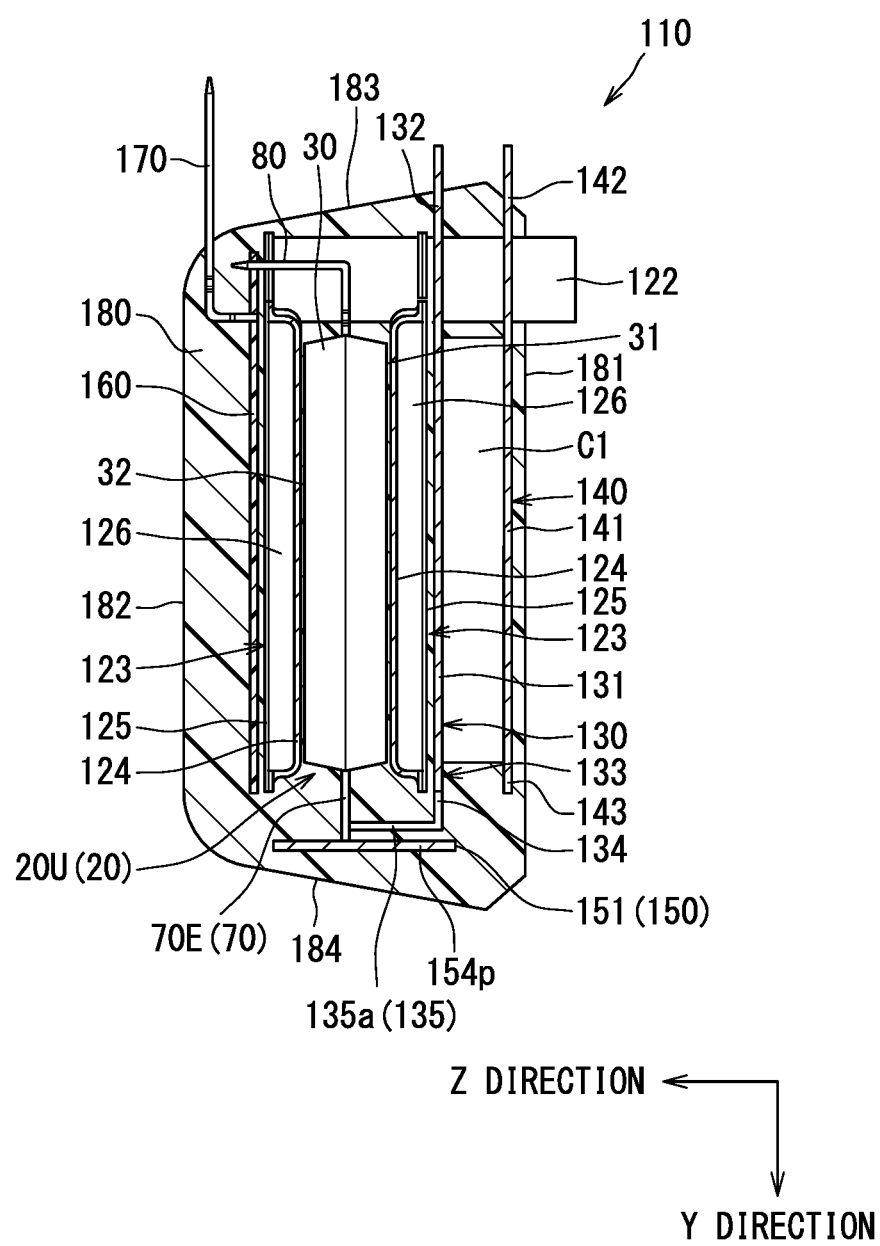
FIG. 22 is a cross-sectional view taken along a XXII-XXII line of FIG. 21.
Figure 23:
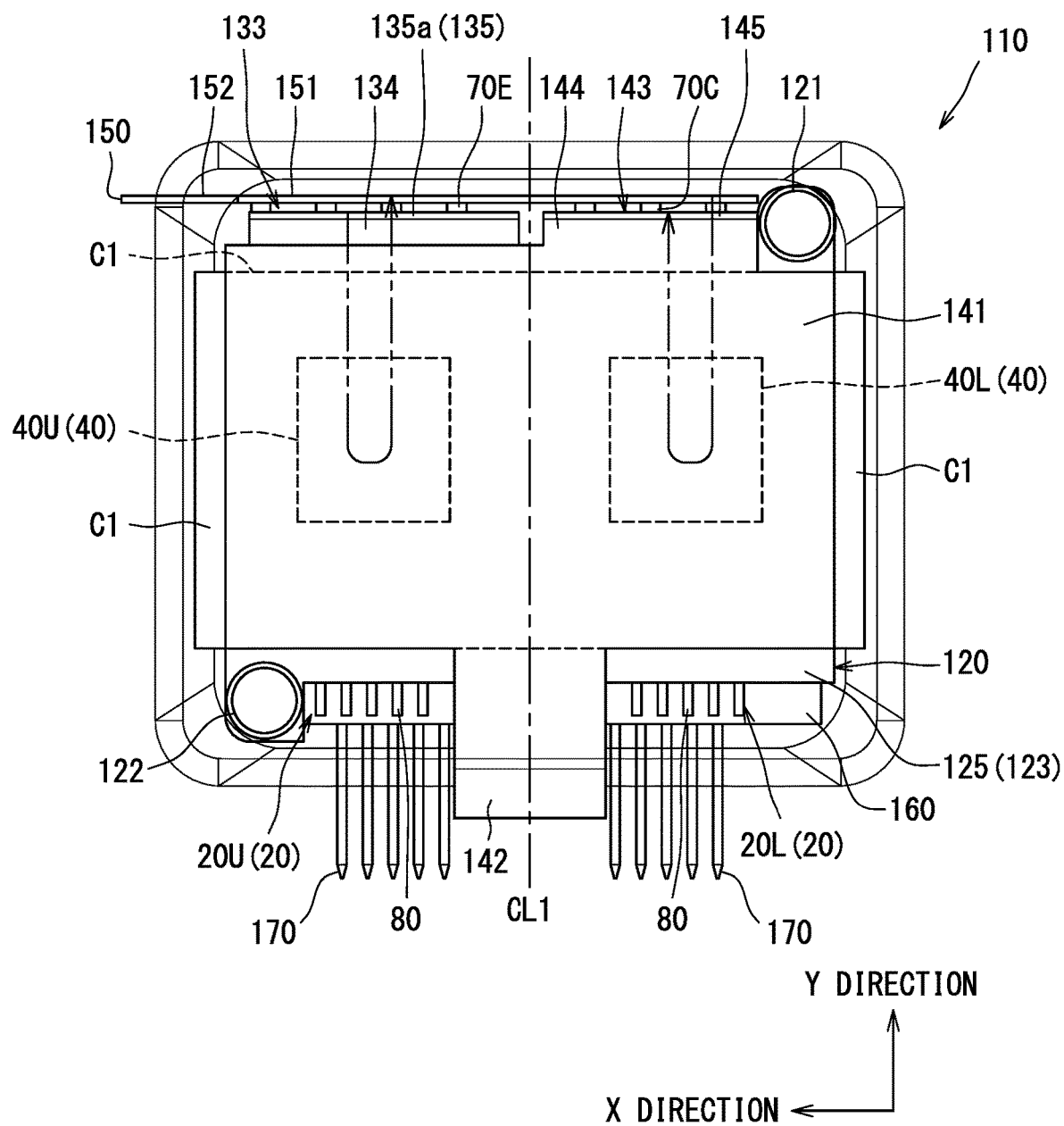
FIG. 23 is a plan view seen from a back surface in FIG. 21.
Figure 24:
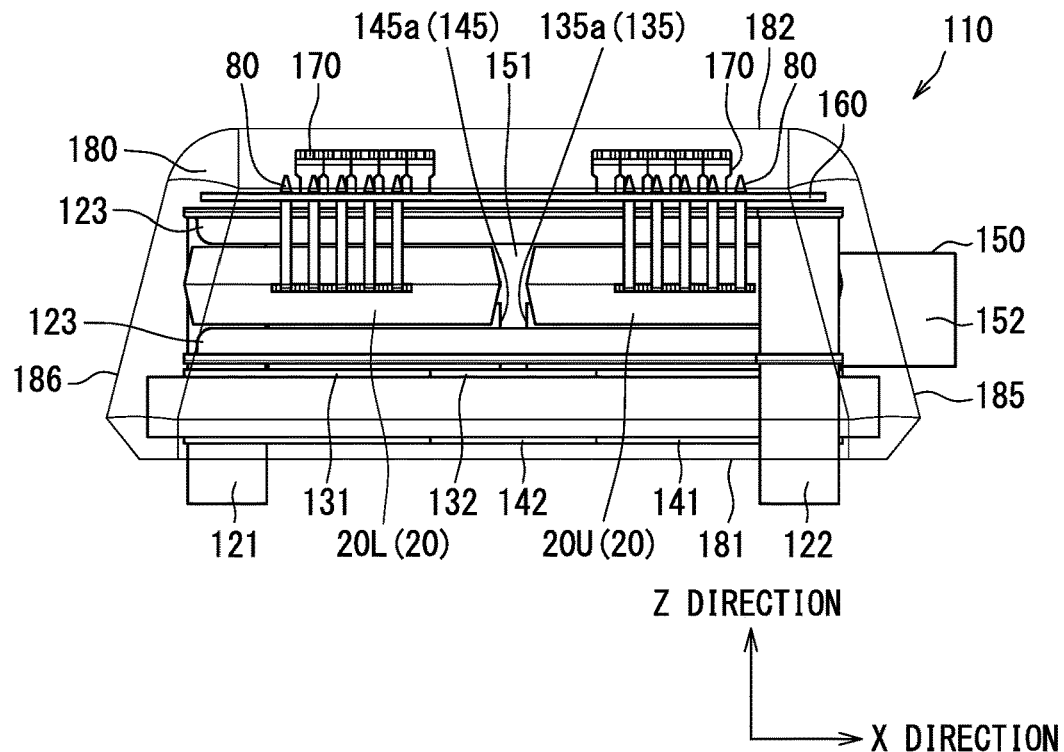
FIG. 24 is a plan view when
Figure 25:
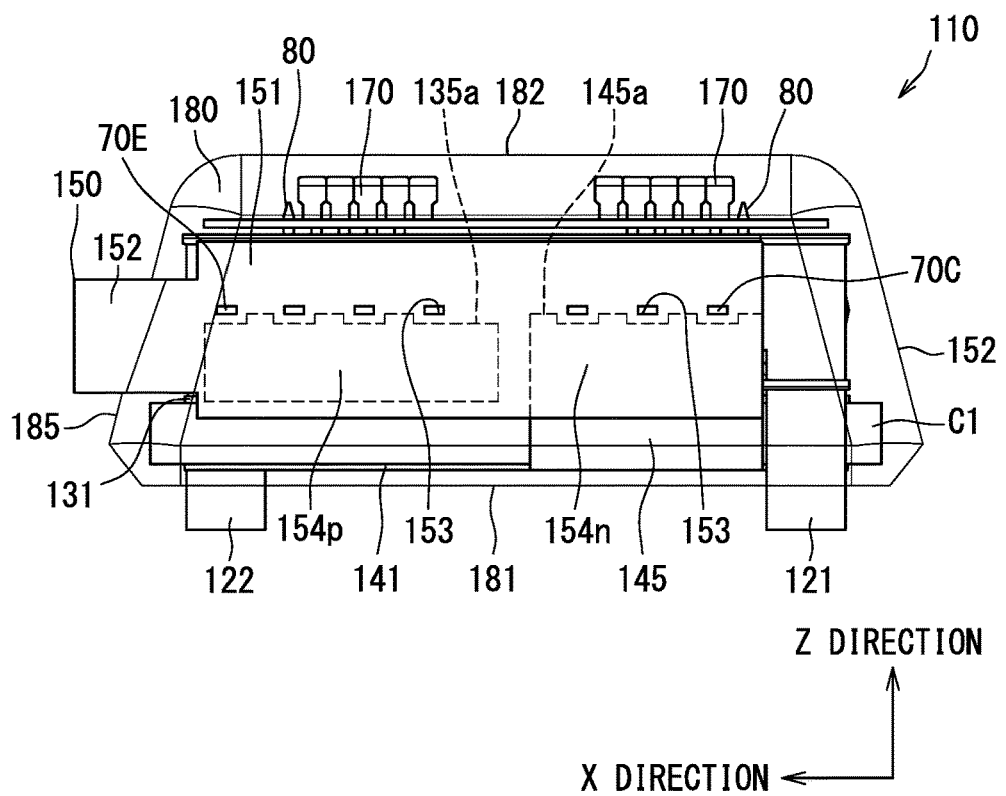
FIG. 25 is a plan view when

The common wiring portions 132 and 142 of the P bus bar 130 and the N bus bar 140 protrude, in the Y direction, from the lateral surface 183 close to the signal terminal 80 to the outside of the protective member 180. From the lateral surface 183, the external connection terminal 170 also protrudes. As shown in FIG. 21, in the X direction, the common wiring portions 132 and 142 are placed between the external connection terminal 170 close to the semiconductor device 20U and the external connection terminal 170 close to the semiconductor device 20L. As shown in FIG. 22, the external connection terminal 170 protrudes at positions close to the second surface 182, and the common wiring portions 132 and 142 protrude at positions near the first surface 181. Nothing protrudes from the lateral surface 183 and an opposite lateral surface 184, that is, the lateral surface 184 close to the main terminal 70. The narrow width portion 152 of the output bus bar 150 protrudes, in the X direction, from a lateral surface 185 close to the semiconductor device 20U to the outside of the protective member 180. Nothing protrudes from a lateral surface 186 opposite to the lateral surface 185, that is, a lateral surface close to the semiconductor device 20L.

In such a manner, only the supply pipe 121 and the discharge pipe 122 protrude from the first surface 181 of the protective member 180. Therefore, at a position close to the first surface 181, a cooler different from the power module 110 is placed. Thereby, when the power module 110 is cooled, the different cooler is easily connected to the supply pipe 121 and the discharge pipe 122. Since the lateral surface from which the common wiring portions 132 and 142 protrude is different from the lateral surface from which the output bus bar 150 protrudes, it may be possible to simplify the connection with the electric power line or the three phase winding.

Here, the surge generated by switching of the upper-lower arm circuit 10 increases as a current change amount (current change rate) per unit time increases or the wiring inductance increases. In the power module 110, the wiring inductance is reduced, and thereby the surge is reduced. Hereinafter, in the structure of the power module 110, a structure that reduces the wiring inductance to enable the surge reduction will be described.

Figure 28:
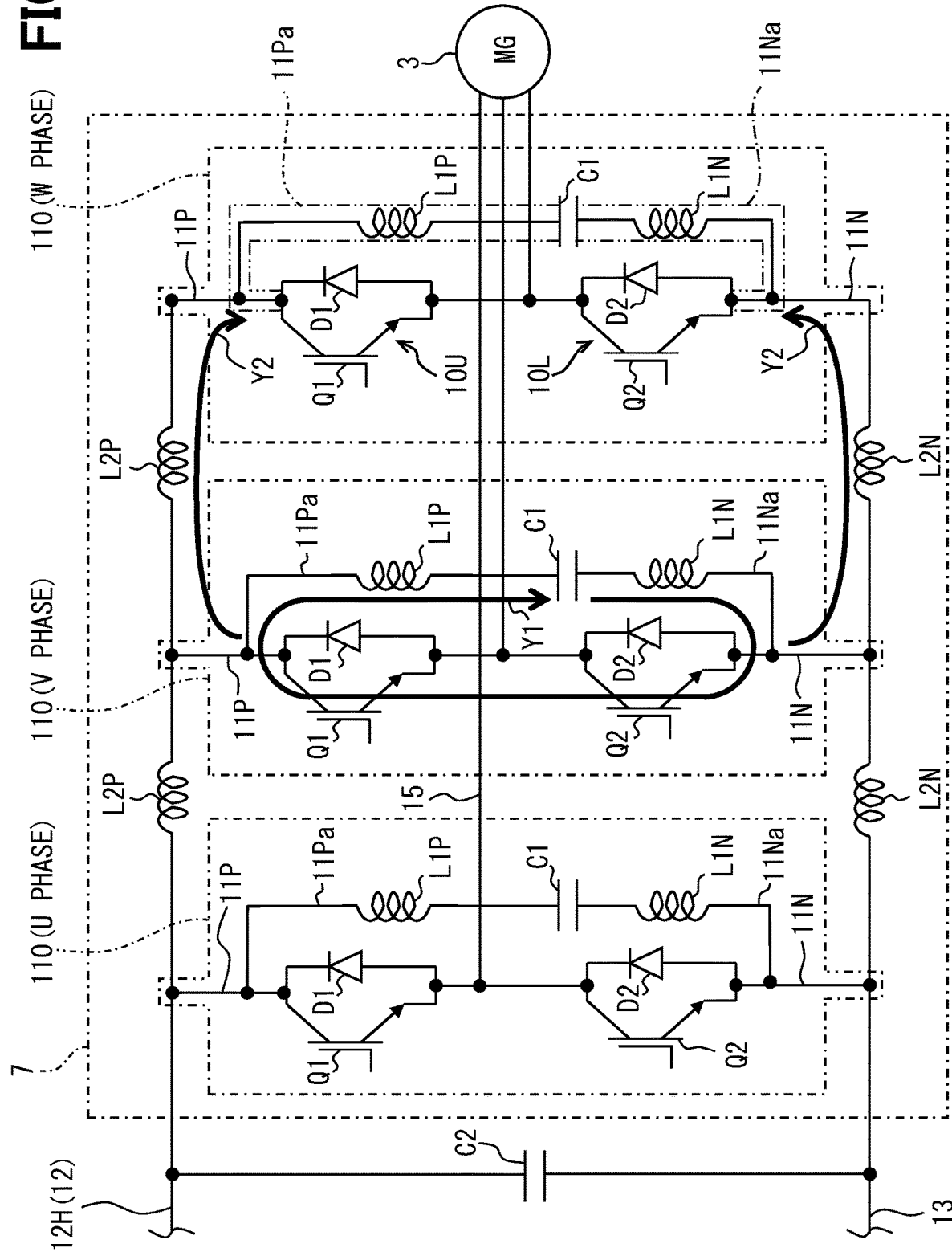
FIG. 28 is an equivalent circuit diagram including a wiring parasitic inductance.

FIG. 28 is a circuit diagram obtained by extracting the inverter 7, the smoothing capacitor C2, and the motor generator 3 from the equivalent circuit diagram of FIG. 1, and shows the wiring inductance parasitic on the circuit. As shown in a dashed dotted line of FIG. 28, the power module 110 of each phase is connected in parallel between the P line 12 and the N line 13, as described above.

The wiring inductance generated between portions connected to each power module 110 in the P line 12 is referred to as an interphase upper inductance L2P. Specifically, the wiring inductance generated at the interphase portion between a connection portion with the common wiring portion 132 for the U phase in the P line 12 and a connection portion with the common wiring portion 132 for the V phase in the P line 12 is the interphase upper inductance L2P. Further, the wiring inductance generated at an interphase portion between a connection portion with the common wiring portion 132 for the V phase in the P line 12 and the connection portion with the common wiring portion 132 for the W phase in the P line 12 is the interphase upper inductance L2P. An impedance generated in proportion to the interphase upper inductance L2P is referred to as an interphase upper impedance.

The wiring inductance generated at a portion connected to each power module 110 in the N line 13 is referred to as an interphase lower inductance L2N. Specifically, the wiring inductance generated at a connection portion with the common wiring portion 142 for the U phase in the N line 13 and the wiring inductance generated at a connection portion with the common wiring portion 142 for the V phase in the N line 13 are the interphase lower inductance L2N. The wiring inductance generated at a connection portion with the common wiring portion 142 for the V phase in the N line 13 and the wiring inductance generated at a connection portion with the common wiring portion 142 for the W phase in the N line 13 are the interphase lower inductance L2N. An impedance generated in proportion to the interphase lower inductance L2N is referred to as an interphase lower impedance.

A wiring inductance of the electric path from the positive electrode terminal of the capacitor C1 to the upper arm 10U inside the power module 110 is referred to as an in-phase upper inductance L1P. Specifically, the inductances generated at the parallel portion 134 of the P bus bar 130 and the bent portion 135 are the in-phase upper inductances L1P. A wiring of a portion where the in-phase upper inductance L1P is formed is referred to as an upper wiring 11Pa. An impedance generated in proportion to the in-phase upper inductance L1P is referred to as an in-phase upper impedance.

A wiring inductance of the electric path from the negative electrode terminal of the capacitor C1 to the lower arm 10L inside the power module 110 is referred to as an in-phase lower inductance L1N. Specifically, the wiring inductances generated at the parallel portion 144 of the N bus bar 140 and the bent portion 145 are the in-phase lower inductances L1N. A wiring of a portion where the in-phase lower inductance L1N is formed is referred to as a lower wiring 11Na. An impedance generated in proportion to the in-phase lower inductance L1N is referred to as an in-phase lower impedance.

Although each impedance has been described by taking the impedance as an example of the inverter 7 in FIG. 28, each impedance also corresponds to the inverter 8 and the converter 6 as follows. That is, the power module 110 placed at a first phase among the phases is referred to as a first power module, and the power module 110 placed at a second phase is referred to as a second power module. An impedance of an electric path from the positive electrode terminal of the capacitor C1 to the upper arm 10U in the first power module corresponds to the in-phase upper impedance. An impedance of an electric path from the positive electrode terminal of the capacitor C1 in the first power module to the upper arm 10U in the second power module corresponds to the interphase upper impedance. An impedance of an electric path from the negative electrode terminal of the capacitor C1 to the lower arm 10L in the first power module corresponds to the in-phase lower impedance. An impedance of an electric path from the negative electrode terminal of the capacitor C1 in the first power module to the lower arm 10L in the second power module corresponds to the interphase lower impedance.

A length of the wiring for forming the interphase upper inductance L2P is longer than a length of the wiring for forming the in-phase upper inductance L1P. Therefore, the interphase upper inductance L2P is larger than the in-phase upper inductance L1P, and the interphase upper impedance is larger than the in-phase upper impedance. A length of the wiring for forming the interphase lower inductance L2N is longer than a length of the wiring for forming the in-phase upper inductance L1P. Therefore, the interphase lower inductance L2N is larger than the in-phase lower inductance L1N, and the interphase lower impedance is larger than the in-phase lower impedance. Each of the interphase upper inductance L2P and the interphase lower inductance L2N is larger than a value obtained by adding the in-phase lower inductance L1N to the in-phase upper inductance L1P.

An arrow Y1 in FIG. 28 indicates a path in which the surge voltage is absorbed by the capacitor C1 in a closed loop circuit formed in the parallel circuit 11 in the V phase. This surge voltage is generated when the switching elements Q1 and Q2 in the V phase are turned on and turned off. Similarly, also in the U phase and the W phase, the surge voltage is absorbed by the capacitor C1 as shown by the arrow Y1. The surge voltage generated and absorbed in the same phase in such a manner is also referred to as a self-surge voltage in the following description.

The closed loop circuit is a circuit formed by the parallel circuit 11. In the closed loop circuit, the positive electrode terminal of the capacitor C1, the upper wiring 11Pa, the upper-lower arm circuit 10, the lower wiring 11Na, and the negative electrode of the capacitor C1 are connected in series in this order. The closed loop circuit does not include the electric power line. The closed loop circuit is referred to as a path in which the surge voltage is absorbed as described above, and is also referred to as a path in which the electric charges required for the switching of the switching elements Q1 and Q2 are supplied from the capacitor C1 to the switching elements Q1 and Q2.

The closed loop circuit is a circuit that does not include the common wirings 11P and 11N. In other words, the P bus bar 130 is branched into a portion shown by a long dashed double-dotted line in FIG. 28 for forming the upper wiring 11Pa and a portion for forming the common wiring 11P. The common wiring 11P of the P bus bar 130 is also referred to as an upper electric power wiring that connects the P line 12 and the upper wiring 11Pa. The N bus bar 140 is branched into a portion shown by a long dashed double-dotted line in FIG. 28 for forming the lower wiring 11Na and a portion for forming the common wiring 11N. The common wiring 11N of the N bus bar 140 is also referred to as a lower electric power wiring that connects the N line 13 and the lower wiring 11Na.

An arrow Y2 in FIG. 28 indicates a path when the self-surge voltage generated in the V phase propagates from the closed loop circuit in the V phase to the closed loop circuit in the W phase via the electric power line. The surge voltage that interferes with the multiple upper-lower arm circuits 10 in such a manner is also referred to as an interference surge voltage in the following description. Similarly to the interference surge voltage propagating between the V phase and the W phase, the interference voltage may occur between the V phase and the U phase or between the W phase and the U phase. However, since the interphase upper inductance L2P is sufficiently larger than the in-phase upper inductance L1P, the interference surge voltage propagated from another phase to the own phase hardly occurs. The interference surge voltage is extremely smaller than the self-surge voltage.

When the electric charge is supplied to the upper-lower arm circuit 10 connected in parallel, the electric charge is instantaneously supplied from the smoothing capacitor C2 to the capacitor C1. Thereby, the capacitor C1 can supply the electric charge again.

Next, the effect of the power module 110 will be described.

The power module 110 includes the upper-lower arm circuit 10, the capacitor C1, the upper wiring 11Pa, the lower wiring 11Na, the common wiring 11P as the upper electric power wiring, and the common wiring 11N as the lower electric power wiring. The upper wiring 11Pa connects the positive electrode terminal of the capacitor C1 and the upper arm 10U. The lower wiring 11Na connects the negative electrode of the capacitor C1 and the lower arm 10L. The common wirings 11P and 11N respectively connect the upper wiring 11Pa and the lower wiring 11Na to the electric power lines.

Accordingly, the power module 110 forms the closed loop circuit that does not include the electric power line. Therefore, when the electric charge required for the switching of the upper-lower arm circuit 10 is supplied from the capacitor C1, the electric charge supply path does include the electric power line. Therefore, the wirings of the path, that is, the upper wiring 11Pa and the lower wiring 11Na can be shortened. On the other hand, when the capacitor C1 is abolished contrary to the present embodiment, the electric charge required for the switching is supplied from the smoothing capacitor C2. Then, since the electric power path for supplying the electric charges from the smoothing capacitor C2 to the upper-lower arm circuit 10 includes the electric power line, the electric path may not be able to be sufficiently shortened.

As described above, according to the power module 110, it may be possible to easily shorten the wiring length that is one factor of the surge voltage occurrence as compared with the configuration in which the capacitor C1 is abolished. Therefore, the wiring inductances LIP and LIN related to the self-surge voltage can be reduced, and the self-surge voltage generated at the upper-lower arm circuit 10 can be reduced. Moreover, since the closed loop circuit does not include the electric power line, it is difficult for the self-surge voltage to be superimposed on the self-surge voltage. Therefore, it may be possible to prevent the other upper-lower arm circuits 10 from interfering with the self-surge voltage via the electric power line.

The power module 110 capable of reducing the surge voltage as described above is placed in each phase. Therefore, it may be possible to promote the prevention of the self-surge voltage interference between the upper-lower arm circuits 10 via the electric power line.

Further, in the present example, the upper arm 10U has the multiple main terminals 70C connected to the upper wiring 11Pa. The lower arm 10L has the multiple main terminals 70E connected to the lower wiring 11Na. Therefore, the self-surge voltages of the adjacent main terminals 70C and 70E act so as to cancel each other, and it may be possible to reduce the in-phase upper inductance L1P and the in-phase lower inductance L1N. Thereby, the reduction of the self-surge voltage is promoted.

Further, in the present example, the output bus bar 150 (that is, output wiring 15) connecting the main terminal 70E of the upper arm 10U and the main terminal 70C of the lower arm 10L is provided. The output bus bar 150 has the facing portions 154p and 154n facing the upper wiring 11Pa and the lower wiring 11Na. Therefore, the self-surge voltages act so as to cancel each other between the facing portions 154p and 154n of the output bus bar 150 and the upper wiring 11Pa and the lower wiring 11Na, and it may be possible to reduce the in-phase upper inductance LIP and the in-phase lower inductance LIN. Thereby, the reduction of the self-surge voltage is promoted. In particular, in the present example, in the configuration in which the semiconductor device 20 has the 1-in-1 package structure, the P bus bar 130 and the N bus bar 140 face the output bus bar 150 in the Y direction. In the projection view in the Y direction, the output bus bar 150 and the semiconductor device 20 overlap each other. In the Y direction, the facing portion 135a of the P bus bar 130 is placed between the semiconductor chip 40U and the output bus bar 150. Similarly, in the Y direction, the facing portion 145a of the N bus bar 140 is placed between the semiconductor chip 40L and the output bus bar 150. Accordingly, the current path from the P bus bar 130 to the output bus bar 150 via the semiconductor chip 40U and the current path from the output bus bar 150 to the N bus bar 140 via the semiconductor chip 40L are shown by the long dashed double-dotted line arrow in FIG. 23. Accordingly, it may be possible to reduce the area of a current loop as compared with a 2-in-1 package in which two semiconductor chips configuring the upper-lower arm circuit 10 are provided in one package. Thereby, it may be possible to further reduce the self-surge voltage.

Further, in the present example, the interphase upper impedance is larger than the in-phase upper impedance. The interphase lower impedance is larger than the in-phase lower impedance. Therefore, as shown by an arrow Y2 of FIG. 28, it may be possible to prevent the surge voltage from propagating over the closed loop circuit of each phase and interfering with the circuit.

Further, in the present example, the smoothing capacitor C2 is connected to the upper-lower arm circuit 10 in parallel, and smooths the voltage of the electric power line. According to this, it may be possible to prevent the voltage of the electric power line from fluctuating. Since the electric charge is instantaneously supplied from the smoothing capacitor C2 to the capacitor C1, it may be possible to suppress the capacitance of the capacitor C1. Thereby, it may be possible to reduce the size of the capacitor C1.

As the semiconductor device 20, the example in which two semiconductor devices 20 having the 1-in-1 package structure has been shown. However, the semiconductor device 20 is not limited to this. A semiconductor device having the 2-in-1 package structure in which the two arms (upper arm 10U and lower arm 10L) configuring the upper-lower arm circuit 10 is packaged in element units can be used.

The arrangement of the main terminals 70 is not limited to the example. When the semiconductor device 20 has the 1-in-1 package, it is sufficient that the main terminals 70 includes at least one main terminal 70C and at least one main terminal 70E. The main terminals 70 having the same potential may be divided into multiple terminals. For example, the main terminal 70C may be divided into multiple terminals. By parallelizing the multiple terminals. it may be possible to reduce the entire inductance of the divided terminals. When the semiconductor device 20 has the 2-in-1 package, it is sufficient that at least one main terminal 70C close to the upper arm 10U, at least one main terminal 70E close to the lower arm 10L, and at least one output terminal are provided.

Figure 29:
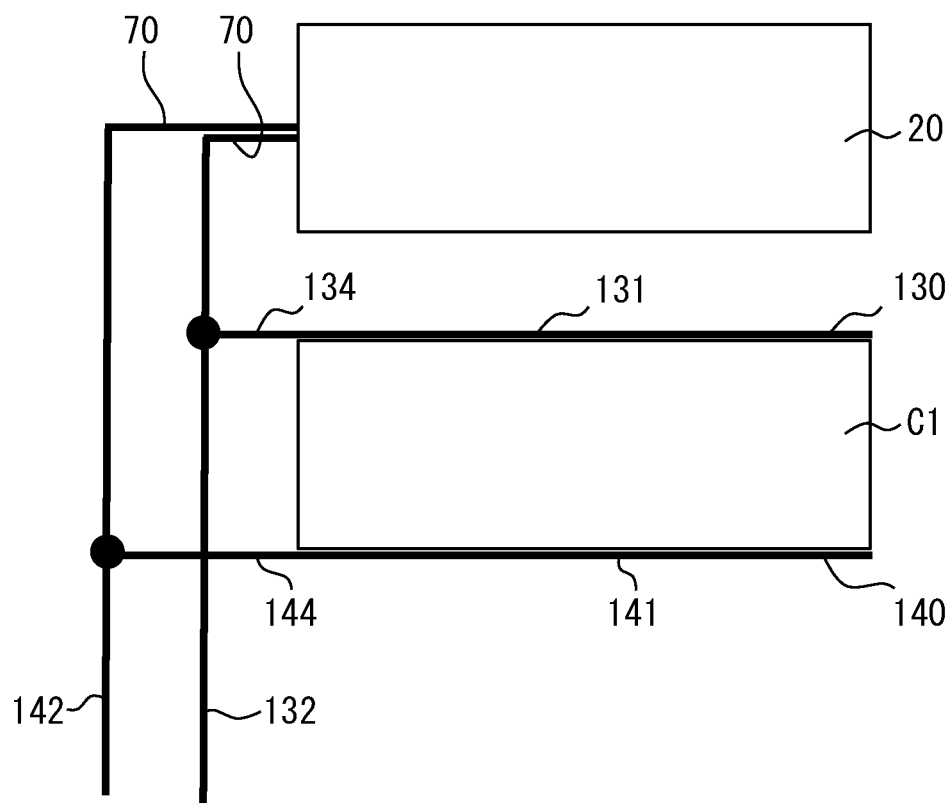
FIG. 29 is a schematic diagram showing another example of FIG. 27.

In an example shown in FIG. 27, the common wiring portions 132 and 142 extend to the opposite sides of the connection portions 131 and 141 with respect to the parallel portions 134 and 144. On the other hand, as shown in FIG. 29, the common wiring portions 132 and 142 may extend to the parallel portions 134 and 144 with respect to the connection portions 131 and 141. The upper arm 10U and the lower arm 10L have the different extension directions of the common wiring portions 132 and 142. For example, the common wiring portions 132 and 142 may not be placed so as to face each other.

Although, in the example shown in FIG. 27, the upper arm 10U and the lower arm 10L have the multiple main terminals 70C and 70E, the upper arm 10U and the lower arm 10L may include one main terminal 70C and one main terminal 70E. Although, in the example shown in FIG. 27, the main terminal 70C and the main terminal 70E are alternately arranged, the multiple main terminals 70C may be arranged or the multiple main terminals 70E may be arranged.

Contrary to the example shown in FIG. 27, the interphase upper impedance may be smaller than the in-phase upper impedance. The interphase lower impedance may be smaller than the in-phase lower impedance.

As another example of the power module 110, at least one of the cooler 120 of the power module 110, the drive substrate 160, or the protective member 180 may be abolished. The smoothing capacitor C2 may be the abolished electric power conversion device 5. The capacitor C1 may be placed outside the protective member 180. The structure of the cooler 120 may not be limited to the example. A part of the semiconductor device 20 configuring the upper-lower arm circuit 10 may be inserted into the flow path 126 inside the cooler 120, and immersed in the refrigerant. In this configuration, the capacitor C1 may be placed on the cooler 120, and connected to the semiconductor device 20. By immersion, it may be possible to suppress the surge voltage while cooling the semiconductor device 20 from both sides.

Second Embodiment

This embodiment is a modification example which is based on the preceding embodiment. In the embodiment, as the protective member 180, the example of the sealing resin body has been shown. Instead of this, in this embodiment, as the protective member 180, a case 187 and a sealing member 188 are used.

Figure 30:
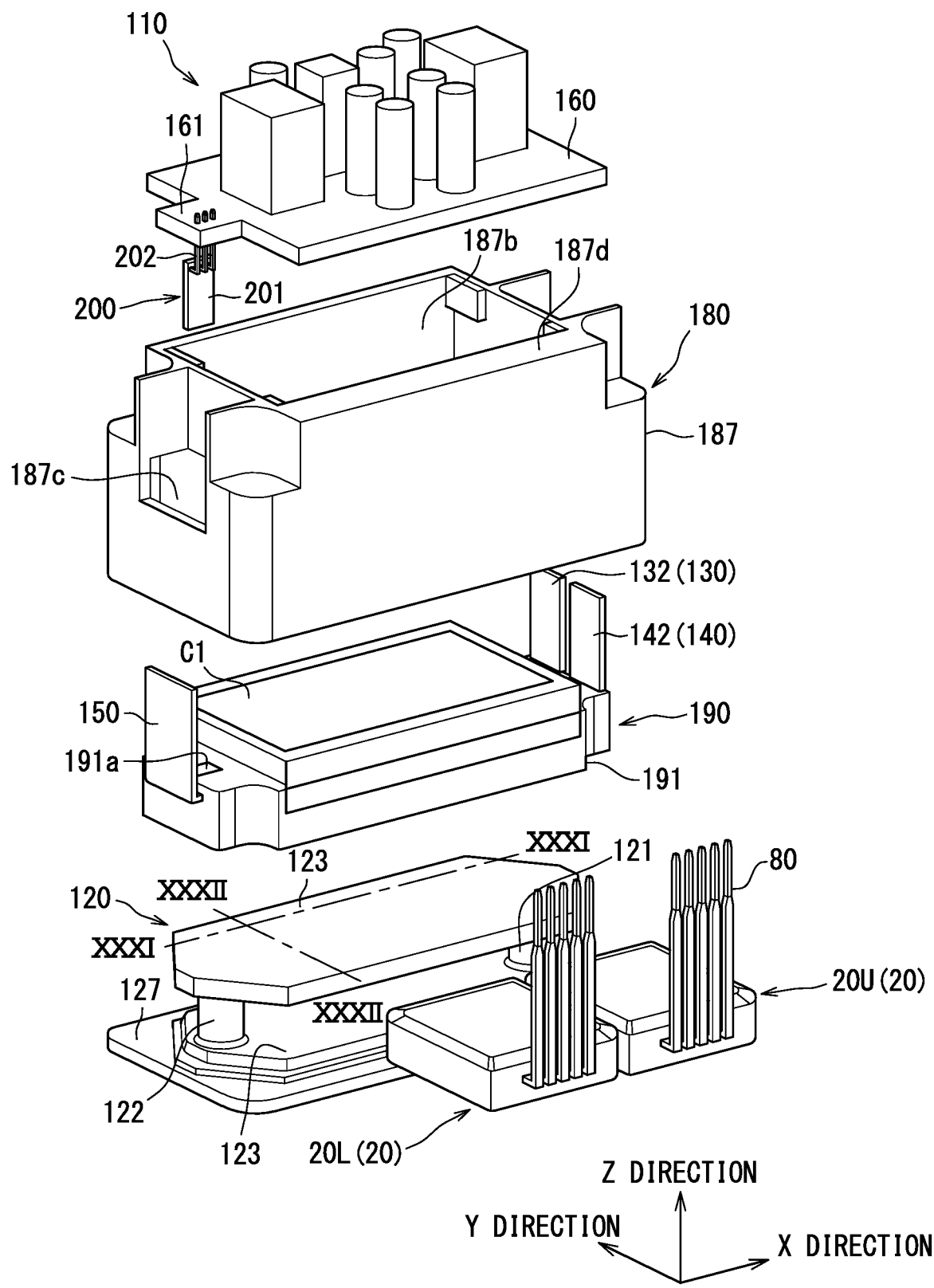
FIG. 30 is an exploded perspective view showing a power module according to a second embodiment.
Figure 31:
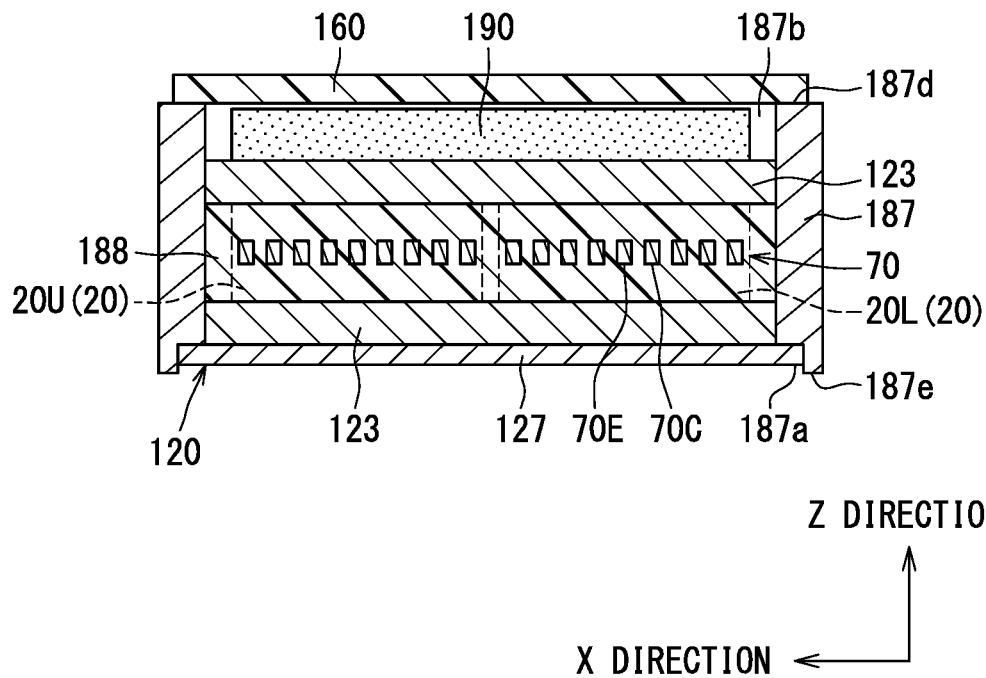
FIG. 31 is a cross-sectional view taken along a XXXI-XXXI line of FIG. 30.
Figure 32:
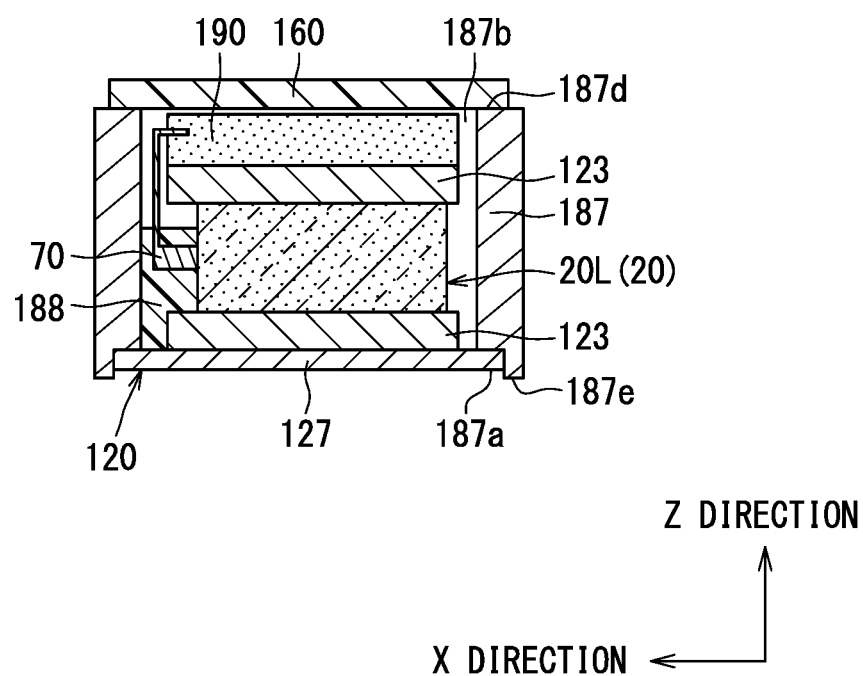
FIG. 32 is a cross-sectional view taken along a XXXII-XXXII line of FIG. 30.

As shown in FIGS. 30 to 32, the power module 110 of the present embodiment includes the semiconductor device 20, the cooler 120, the capacitor C1, a P bus bar 130, an N bus bar 140, an output bus bar 150, the drive substrate 160, and the protective member 180. In FIG. 30, for convenience, the main terminal 70 of the semiconductor device 20 and the sealing member 188 are omitted. In FIG. 31 and FIG. 32, the drive substrate 160 is omitted. Further, the elements configuring the power module 110 are shown in a simplified manner.

The case 187 configuring the protective member 180 has a tubular shape. The case 187 has a substantially rectangular annular plane shape. The case 187 may be formed of the resin material or may be formed of the metal material. For example, a resin molded body formed by injection molding or a metal molded body formed by a die-casting method can be employed. An insert molded body using a metal component can be also employed.

The case 187 extends in the Z direction. The case 187 has openings 187a and 187b at both ends in the Z direction. The case 187 has a penetration hole 187c. The penetration hole 187c opens on an end surface 187d close to the opening 187b, and communicates with a space of the tubular shaped inside. The penetration holes 187c are placed at both ends of the case 187 in the X direction. In the case 187, at least, a part of the semiconductor device 20, a part of the cooler 120, the capacitor C1, a part of each of the bus bars 130, 140, and 150 are placed.

Similarly to the preceding embodiment, the cooler 120 has the supply pipe 121, a discharge pipe, and the heat exchange portions 123 in multiple stages. The semiconductor device 20 is placed between the heat exchange portions 123. Also in the present embodiment, the semiconductor device 20U configuring the upper arm 10U and the semiconductor device 20L configuring the lower arm 10L are arranged in the X direction. The two semiconductor devices 20U and 20L are sandwiched by the two heat exchange portions 123. In the present embodiment, a direction in which the supply pipe 121 and the discharge pipe 122 are arranged is along the X direction. Between the supply pipe 121 and the discharge pipe 122, the semiconductor device 20 is placed.

At one of the heat exchange portions 123, a closing plate 127 is integrally placed. The closing plate 127 is plate so as to close the opening 187a of the case 187. The closing plate 127 is placed, for example, in a flat shape. The closing plate 127 is fixed to a surface of the heat exchange portion 123, and the surface is opposite to a surface close to the semiconductor device 20. As shown in FIG. 31 and FIG. 32, the cooler 120 is assembled to the case 187 so that the closing plate 127 closes the opening 187a. The closing plate 127 is fixed to the case 187 such adhesion, screw fastening, or the like. The closing plate 127 functions as a bottom of the case 187.

In the present embodiment, a step having a low inner periphery is placed at the end surface 187e close to the opening 187a. An outer peripheral edge of the closing plate 127 is placed at a step portion of the end surface 187e. In this placement state, the cooler 120 is fixed to the case 187. The opening 187a corresponds to an opening end.

The capacitor C1 forms a capacitor unit 190 together with the P bus bar 130, the N bus bar 140, and the output bus bar 150. The capacitor unit 190 has a case 191. The case 191 functions as a housing accommodating the capacitor C1. The case 191 functions as a terminal block holding each of the bus bars 130, 140, and 150 so that the outside is connectable. In such a manner, the capacitor C1, the P bus bar 130, the N bus bar 140, and the output bus bar 150 are integrally held. Similarly to the preceding embodiment, the P bus bar 130 is electrically connected to the main terminal 70C of the semiconductor device 20U. The N bus bar 140 is electrically connected to the main terminal 70E of the semiconductor device 20L. The output bus bar 150 is electrically connected to the main terminal 70E of the semiconductor device 20U and the main terminal 70C of the semiconductor device 20L.

The capacitor unit 190 is placed on the cooler 120 in the case 187. The capacitor unit 190 is placed on the heat exchange portion 123 on which the closing plate 127 is not placed, on the opposite side to the semiconductor device 20. The common wiring portions 132 and 142 of the P bus bar 130 and the N bus bar 140 protrude to the outside of the case 187 via the penetration hole 187c on one end side in the X direction. The common wiring portions 132 and 142 extend to the opposite side to the heat exchange portion 123 in the Z direction. The output bus bar 150 protrudes to the outside of the case 187 via the penetration hole 187c at an end opposite to the P bus bar 130 and the N bus bar 140. The protrusion portion of the output bus bar 150 extends to the opposite side to the heat exchange portion 123 in the Z direction.

The power module 110 further includes a current sensor 200. The current sensor 200 detects the current flowing through the output bus bar 150. Therefore, the current sensor 200 is placed in the vicinity of the output bus bar 150. In the present embodiment, the current sensor 200 has a sensor main portion 201 and a lead 202. At the sensor main portion 201, an electromagnetic conversion element is formed. As the electromagnetic conversion element, for example, a magnetoresistive effect element such as a hole element, a GMR element, a TMR element, or the like can be employed. The lead 202 of the current sensor 200 is mounted on the drive substrate 160, for example, inserted to be mounted. The case 191 has a recess 191a on a surface close to the drive substrate 160. The sensor main portion 201 detects the current (phase current) flowing through the bus bar 150 in a state where the current sensor 200 is inserted in the recess 191a and placed.

The drive substrate 160 is placed on the opposite side to the cooler 120 with respect to the capacitor unit 190. In the present embodiment, the drive substrate 160 is placed so as to close the opening 187b of the case 187. The drive substrate 160 is fixed to the case 187 in a state of being placed on the end surface 187d close to the opening 187b. The current sensor 200 is mounted on one end of the drive substrate 160 in the X direction. The drive substrate 160 has a convex 161 at an end close to the output bus bar 150. The convex 161 protrudes to the opposite side to the opening 187b, that is, the outside.

The current sensor 200 is mounted on the convex 161. The current sensor 200 extends in the Z direction in a state of being mounted on the drive substrate 160. Outside the case 187, the current sensor 200 is placed in the vicinity of the protrusion portion of the output bus bar 150.

The sealing member 188 configuring the protective member 180 seals at least a part of elements accommodated in the case 187. As the sealing member 188, the electric insulation material, for example, a resin or gel can be employed. The sealing member 188 may be referred to as a potting material. The sealing member 188 seals at least a part of the semiconductor device 20 and the capacitor C1. The sealing member 188 is preferably placed between members having different potentials.

In the present embodiment, the closing plate 127 is placed as the bottom side, and the sealing member 188 is filled. The sealing member 188 is placed only in the periphery of the main terminals 70 so as to integrally cover all the main terminals 70 of the semiconductor device 20. The sealing member 188 is placed between the main terminals 70C and 70E.

In such a manner, in the present embodiment, the cooler 120 closes the opening 187a of the case 187. Therefore, in addition to the effects described in the preceding embodiment, it may be possible to simplify the configuration together with the sealing using the sealing member 188.

The case 187 including the cooler 120 has a bottomed tubular shape. Accordingly, the sealing member 188 is filled in the case 187 close to the opening 187b. Thereby, the sealing member 188 is held in the case 187, and the insulation between the main terminals 70C and 70E can be ensured. The different potentials insulated by the sealing member 188 is not limited to the potentials of the main terminals 70C and 70E. The different potentials may be potentials of the bus bars 130, 140, and 150. The sealing member 188 may be placed between the main terminal 70 and the bus bar having a different potential from the main terminal 70. In particular, in the present embodiment, since the sealing member 188 is placed on the periphery of the main terminal 70, it may be possible to secure the insulation between the main terminals 70C and 70E while reducing the used amount of the sealing member 188.

The example in which the cooler 120 closes the opening 187a of the case 187 has been shown. However, it is not limited to this. The drive substrate 160 may close the opening 187a of the case 187.

The example in which the drive substrate 160 is placed close to the opening 187a has been shown. However, it is not limited to this. The drive substrate 160 may be placed on the opposite side to the capacitor unit 190 with respect to the cooler 120. In this case, both of the drive substrate 160 and the cooler 120 may close the opening 187a.

Figure 33:
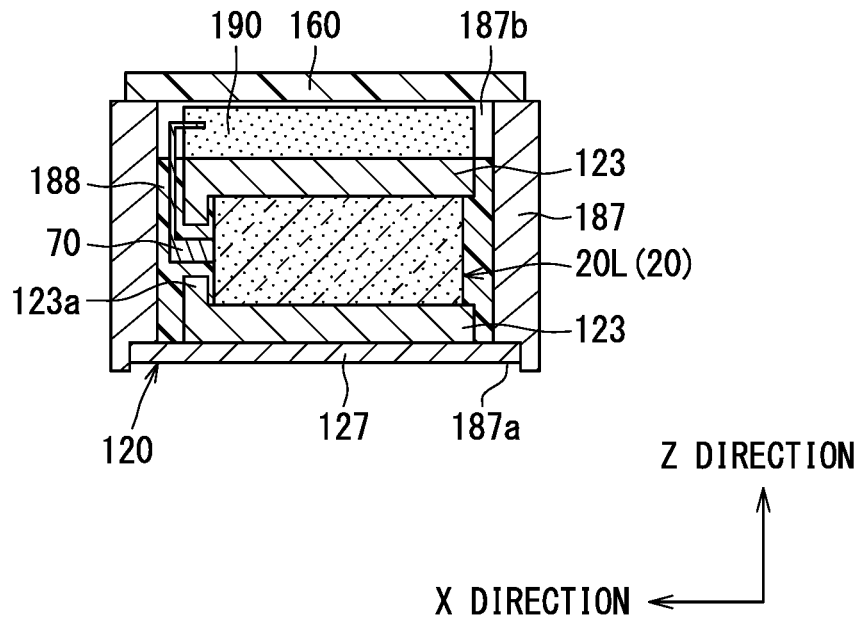
FIG. 33 is a cross-sectional view showing another example of the power module and corresponding to FIG. 32.

The arrangement of the sealing member 188 in the case 187 is not limited to the example. For example, as shown in FIG. 33, the sealing member 188 may be filled so as to completely seal also the heat exchange portion 123 close to the capacitor unit 190. In this case, the electrically insulating sealing member 188 is placed between the heat exchange portion 123 and the main terminal 70. Accordingly, it may be possible to reduce the distance between the heat exchange portion 123 (cooler 120) and the main terminal 70.

In FIG. 33, a protrusion portion 123a is placed at the end close to the main terminal 70 in the heat exchange portion 123. The protrusion portion 123a protrudes in the Z direction with respect to the arrangement portion of the semiconductor device 20 in the heat exchange portion 123. The metal heat exchange portion 123 (protrusion portion 123a) approaches the main terminal 70, and thereby the inductance of the main terminal 70 can be reduced. Thereby, it may be possible to reduce the surge voltage. The case 187 may be filled with the sealing member 188.

The length of the case 187 in the Z direction is not particularly limited. The metal case 187 functions as a shielding plate against noise. When the metal case 187 is employed, the length of the case 187 in the Z direction may be longer than a laminate of the semiconductor device 20, the cooler 120, and the capacitor unit 190. Thereby, it may be possible to effectively shield the external noise with use of the case 187. Further, it may be possible to prevent the noise generated at the semiconductor device 20 from propagating to the outside.

Figure 34:
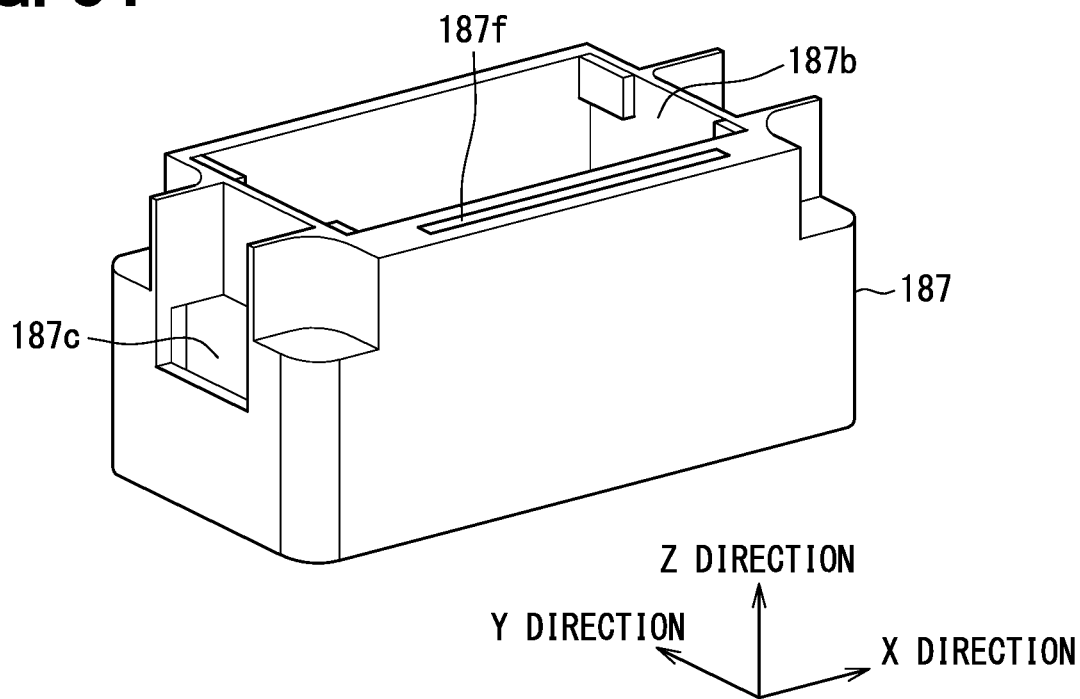
FIG. 34 is a perspective view showing another example of a case.
Figure 35:
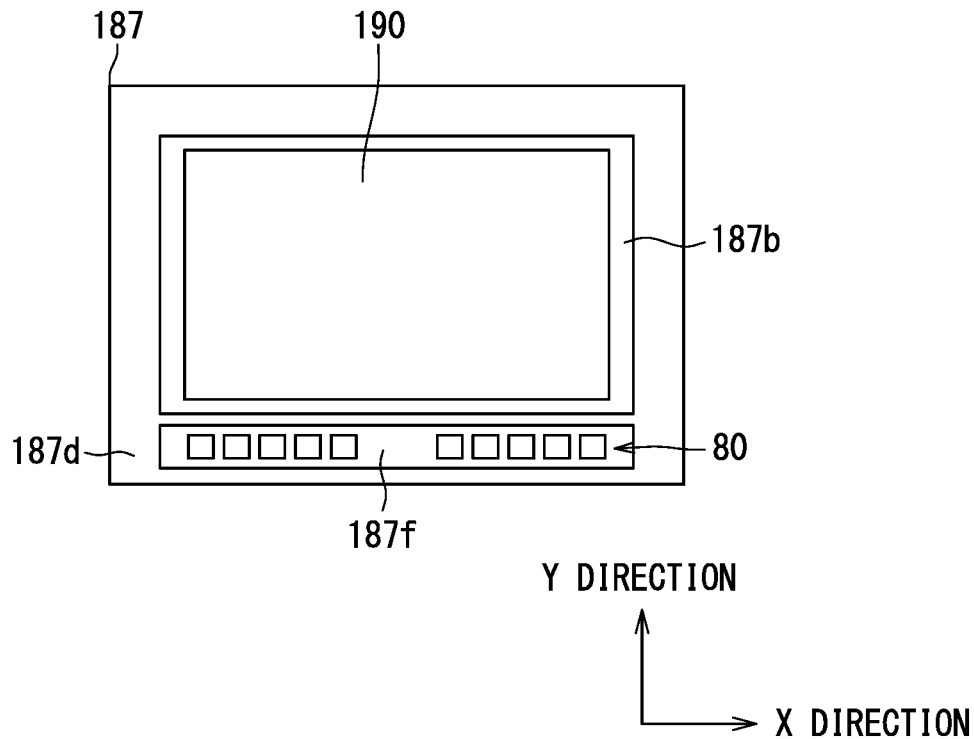
FIG. 35 is a plan view showing the power module corresponding to FIG. 34.
Figure 36:
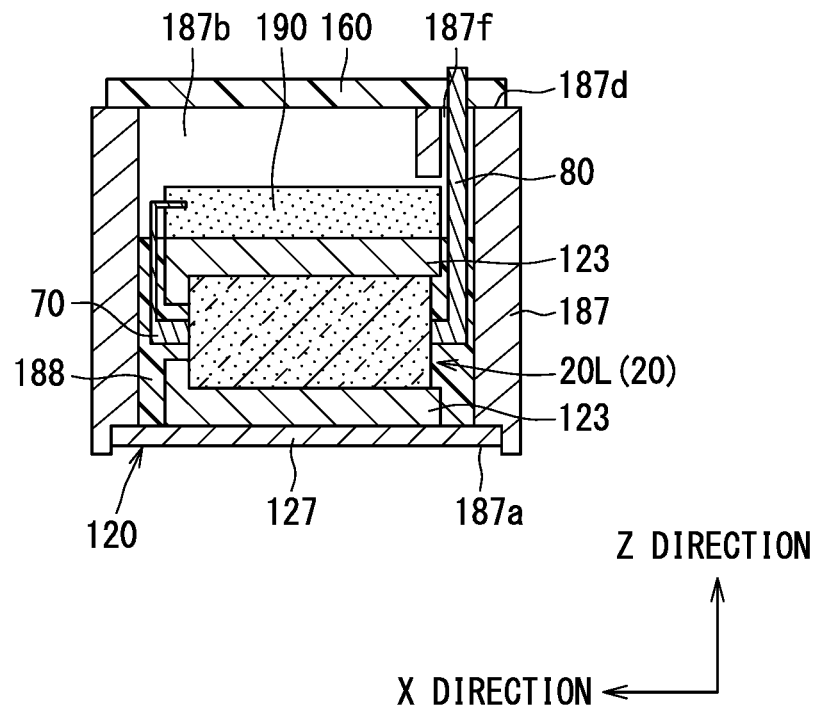
FIG. 36 is a cross-sectional view showing the power module corresponding to FIG. 34.

In the examples shown in FIGS. 34 to 36, the metal case 187 further has a penetration hole 187f corresponding to the signal terminal 80. The penetration hole 187f opens on a portion close to the signal terminal 80 in an end surface 80d, and communicates with the space of the tubular inside. The penetration hole 187f extends in the Z direction. The penetration hole 187f opens on one of four ends of the end surface 187d having a substantially rectangular annular plane. The penetration hole 187f opens on the edge different from the penetration hole 187c. In the present embodiment, all the signal terminals 80 are inserted through one penetration hole 187f. For each semiconductor device 20, the penetration hole 187f may be separated. In FIG. 35, for convenience, the drive substrate 160 is omitted.

The signal terminal 80 has a bent portion, and has a substantially L-shape in the ZX plane. In the signal terminal 80, a portion extending in the Z direction is inserted in the penetration hole 187f. A part of the signal terminal 80 protrudes from the end surface 187d. Since a part of the signal terminal 80 is surrounded by the metal case 187, the case 187 can effectively shield the noise. The penetration hole opening on the side of the end surface 187e may be placed in the case 187, and the signal terminal 80 may protrude to the side of the end surface 187e.

Third Embodiment

This embodiment is a modification example which is based on the preceding embodiments. In the embodiments, a branch structure from the electric power wirings (common wirings 11N, 11P) to the upper wiring 11Pa and the lower wiring 11Na is not particularly described. In this embodiment, in consideration of the heat influence, the branch structure is determined.

Figure 37:
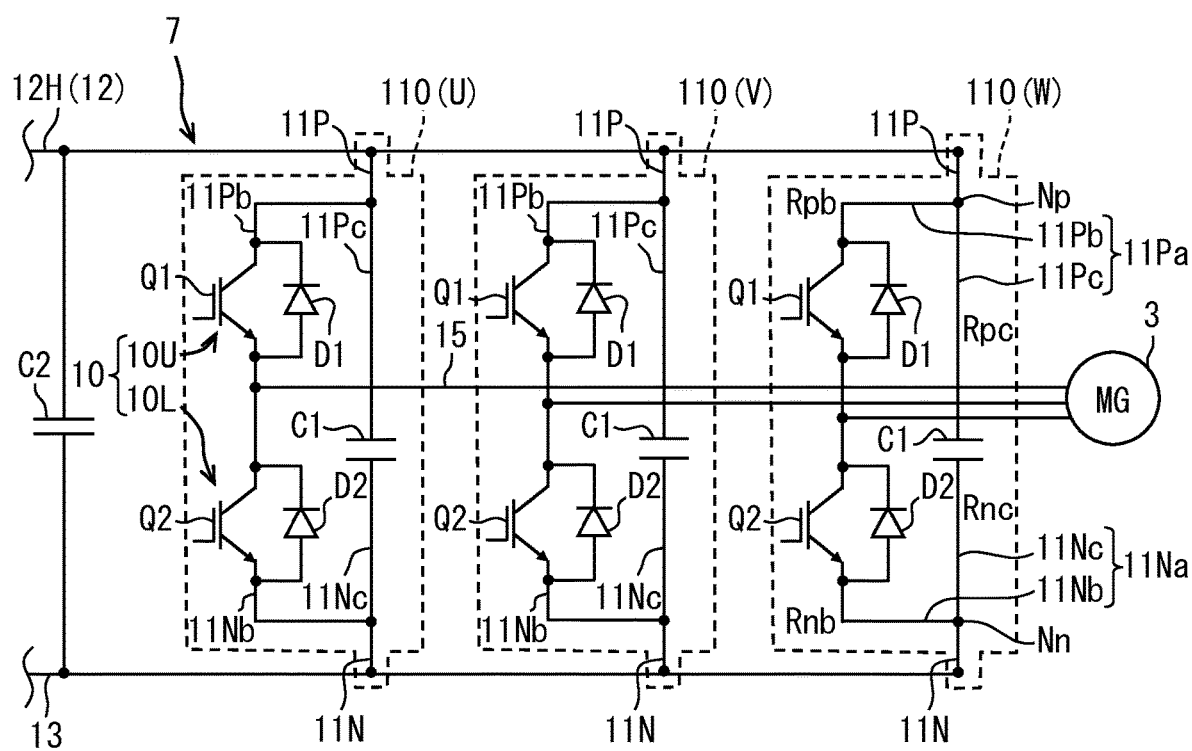
FIG. 37 is an equivalent circuit diagram showing a power module according to a third embodiment.

FIG. 37 shows an equivalent circuit diagram of the power module 110 according to the present embodiment. FIG. 37 shows a circuit diagram obtained by extracting the inverter 7, the smoothing capacitor C2, and the motor generator 3 from the equivalent circuit diagram in FIG. 1.

As shown in FIG. 37, the upper wiring 11Pa is divided into two portions based on a connection point Np with the common wiring 11P (upper electric power wiring). The upper wiring 11Pa is branched into two from the connection point Np. The upper wiring 11Pa has a first wiring portion 11Pb and a second wiring portion 11Pc. The first wiring portion 11Pb is a wiring portion electrically connecting the collector electrode of the upper arm 10U and the connection point Np. The second wiring portion 11Pc is a wiring portion electrically connecting the positive electrode terminal of the capacitor C1 and the connection point Np. Each phase of the inverter 7 has the similar configuration.

The lower wiring 11Na is divided into two portions based on a connection point Nn with the common wiring 11N (lower electric power wiring). The lower wiring 11Na is branched into two from the connection point Nn. The lower wiring 11Na has a first wiring portion 11Nb and a second wiring portion 11Nc. The first wiring portion 11Nb is a wiring portion electrically connecting the emitter electrode of the lower arm 10L and the connection point Nn. The second wiring portion 11Pc is a wiring portion electrically connecting the negative electrode terminal of the capacitor C1 and the connection point Nn. Each phase of the inverter 7 has the similar configuration.

In such a manner, the upper wiring 11Pa and the lower wiring 11Na have first wiring portions 11Pb and 11Na from the connection points Np and Nn with the corresponding common wirings 11P and 11N (electric power wirings) to the corresponding arms. The upper wiring 11Pa and the lower wiring 11Na have second wiring portions 11Pc and 11Nc from the connection points Np and Nn to the corresponding terminals of the capacitor C1.

In at least one of the upper wiring 11Pa or the lower wiring 11Na, the wiring resistances of the first wiring portions 11Pb and 11Nb are smaller than wiring resistances of the second wiring portions 11Pc and 11Nc.

Here, in the upper wiring 11Pa, a wiring resistance of the first wiring portion 11Pb is Rpb and a wiring resistance of the second wiring portion 11Pc is Rpc. In the lower wiring 11Na, a wiring resistance of the first wiring portion 11Nb is Rnb, and a wiring resistance of the second wiring portion 11Nc is Rnc. For example, when the upper wiring 11Pa satisfies the relationship, a wiring resistance Rpb (wiring resistance Rpc) is set. When the lower wiring 11Na satisfies the relationship, a wiring resistance Rnb (wiring resistance Rnc) is set.

Figure 38:
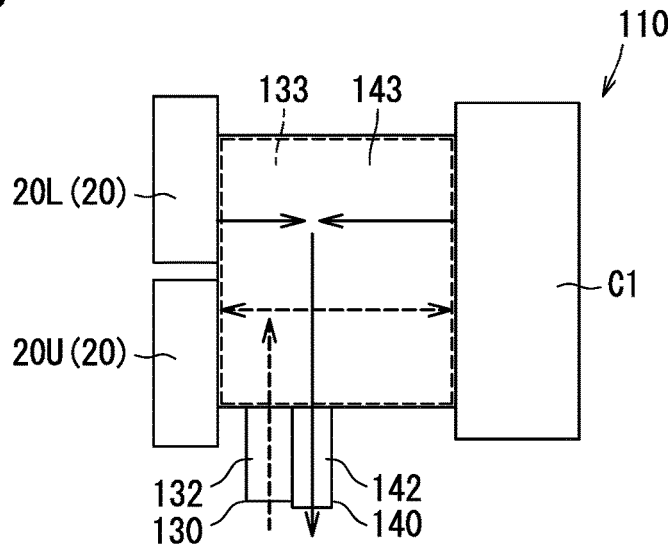
FIG. 38 is a schematic view showing the power module.

FIG. 38 is a schematic diagram showing the power module 110 that satisfies the relationship. FIG. 38 shows the power module 110 in a simplified manner. FIG. 38 shows the semiconductor devices 20 (20U, 20L), the P bus bar 130, the N bus bar 140, and the capacitor C1 as elements configuring the power module 110. Similarly to the preceding embodiments, the power module 110 may include at least one of the cooler 120, the output bus bar 150, the drive substrate 160, or the protective member 180 in addition to the elements.

When the power module 110 includes the protective member 180, a sealing resin body, a molded resin case, a metal case, or the like can be used. When the case is used, the case is filled with a sealing material. Further, the protective member 180 may be configured with use of a film in which a metal is laminated on the resin surface. Such a film includes, for example, a laminated film in which a metal foil is attached to the resin, and a vapor deposition film in which a metal is vapor-deposited on the resin surface. As the metal, for example, aluminum can be used.

The common wiring 11P and the upper wiring 11Pa are provided as the P bus bar 130. The common wiring 11N and the lower wiring 11Na are provided as the N bus bar 140. The P bus bar 130 includes the common wiring portion 132 and the parallel wiring portion 133. The N bus bar 140 has the common wiring portion 142 and the parallel wiring portion 143. In FIG. 38, the common wiring portions 132 and 142 are connected to the corresponding parallel wiring portions 133 and 143. The common wiring portion 132 corresponds to the common wiring 11P. The common wiring portion 142 corresponds to the common wiring 11N.

In the direction in which the semiconductor device 20 and the capacitor C1 are arranged, the parallel wiring portions 133 and 143 are placed between the semiconductor device 20 and the capacitor C1. The parallel wiring portions 133 and 143 are placed so that the plate surfaces face each other. In the arrangement direction, the connection portion 131 (not shown) is placed at one end of the parallel wiring portion 133, and a connection portion with the semiconductor device 20U is placed at the other end. In the arrangement direction, the connection portion 141 (not shown) is placed at one end of the parallel wiring portion 143, and a connection portion with the semiconductor device 20L is placed at the other end.

In each of the parallel wiring portions 133 and 143, the thickness is substantially uniform. In each of the parallel wiring portions 133 and 143, the width in a direction orthogonal to the arrangement direction is substantially constant. The common wiring portion 132 is connected to the parallel wiring portion 133 at a position close to, in the arrangement direction, the semiconductor device 20. The connection point corresponds to a connection point Np. The current path between the common wiring portion 132 and the semiconductor device 20U and the current path between the common wiring portion 132 and the capacitor C1 are branched from the common wiring portion 132 to both ends in the width direction as shown by broken line arrows. The current path of the semiconductor device 20U is shorter than that of the capacitor C1. The wiring length of the semiconductor device 20U from the connection point Np is shorter than that of the capacitor C1. Thereby, a wiring resistance Rpb (wiring resistance Rpc) is obtained.

Similarly, the common wiring portion 142 is connected to the parallel wiring portion 143 at a position close to, in the arrangement direction, the semiconductor device 20. The connection point corresponds to a connection point Nn. The current path between the common wiring portion 142 and the semiconductor device 20L and the current path between the common wiring portion 142 and the capacitor C1 are branched from the common wiring portion 142 to both ends in the width direction as shown by solid line arrows. The current path of the semiconductor device 20L is shorter than that of the capacitor C1. The wiring length of the semiconductor device 20L from the connection point Nn is shorter than that of the capacitor C1. Thereby, a wiring resistance Rnb (wiring resistance Rnc) is obtained.

Here, the AC current and the DC current flow through the bus bars 130 and 140. The AC current is a current at the time of switching the switching element. The DC current is a current in a steady state where the switching element is turned on. The capacitor C1 ideally passes only the AC current. Accordingly, in the current path shown in FIG. 38, mainly, the AC current flows on the side of the capacitor C1. The DC current and the AC current flow on the side of the semiconductor device 20. The heat amount generated by the DC current is larger than the heat amount generated by the AC current.

In the present embodiment, the wiring length of the semiconductor device 20U from the common wiring portion 132 is shorter than that of the capacitor C1. Thereby, the wiring resistance Rpb (wiring resistance Rpc) is obtained. Since the wiring resistance Rpb of the path through which the DC current flows is small, the heat amount generated by the DC current can be reduced. Thereby, it may be possible to result the heat transferred to the capacitor C1.

Similarly, the wiring length of the semiconductor device 20L from the common wiring portion 142 is shorter than that of the capacitor C1. Thereby, a wiring resistance Rnb (wiring resistance Rnc) is obtained. Since the wiring resistance Rnb of the path through which the DC current flows is small, the heat amount generated by the DC current can be reduced. Thereby, it may be possible to reduce the heat transferred to the capacitor C1.

The example in which the conditions of both of the wiring resistance Rpb (wiring resistance Rpc) and the wiring resistance Rnb (wiring resistance Rnc) are satisfied has been shown. However, it is not limited to this. It is sufficient that at least one condition is satisfied. When one of the conditions is satisfied, it may be possible to reduce the heat amount generated by the DC current as compared with a configuration that satisfies none of the conditions.

The heat amount generated by the DC current is larger than the heat amount generated by the AC current. At least a part of the bus bars 130 and 140 is exposed, and thereby it may be possible to effectively dissipate the heat generated by the DC current. In the bus bars 130 and 140, a part of portions through which the DC current flows, that is, portions corresponding to the first wiring portions 11Pb and 11Nb may be exposed from the sealing resin body or the sealing material.

The present embodiment has shown the example in which the wiring length is shortened and the wiring resistance to the semiconductor device 20 is smaller than the wiring resistance to the capacitor C1. The cross-sectional area of the current path, for example, the thickness or the width may be changed, and thereby the wiring resistance to the semiconductor device 20 can be made smaller than the wiring resistance to the capacitor C1.

Hereinafter, a more specific configuration example of the power module 110 is shown below. Also in each shown below, FIG. 38 shows the semiconductor devices 20 (20U, 20L), the P bus bar 130, the N bus bar 140, and the capacitor C1 as elements configuring the power module 110. The power module 110 may include at least one of the cooler 120, the output bus bar 150, the drive substrate 160, or the protective member 180 in addition to the elements.

Figure 39:
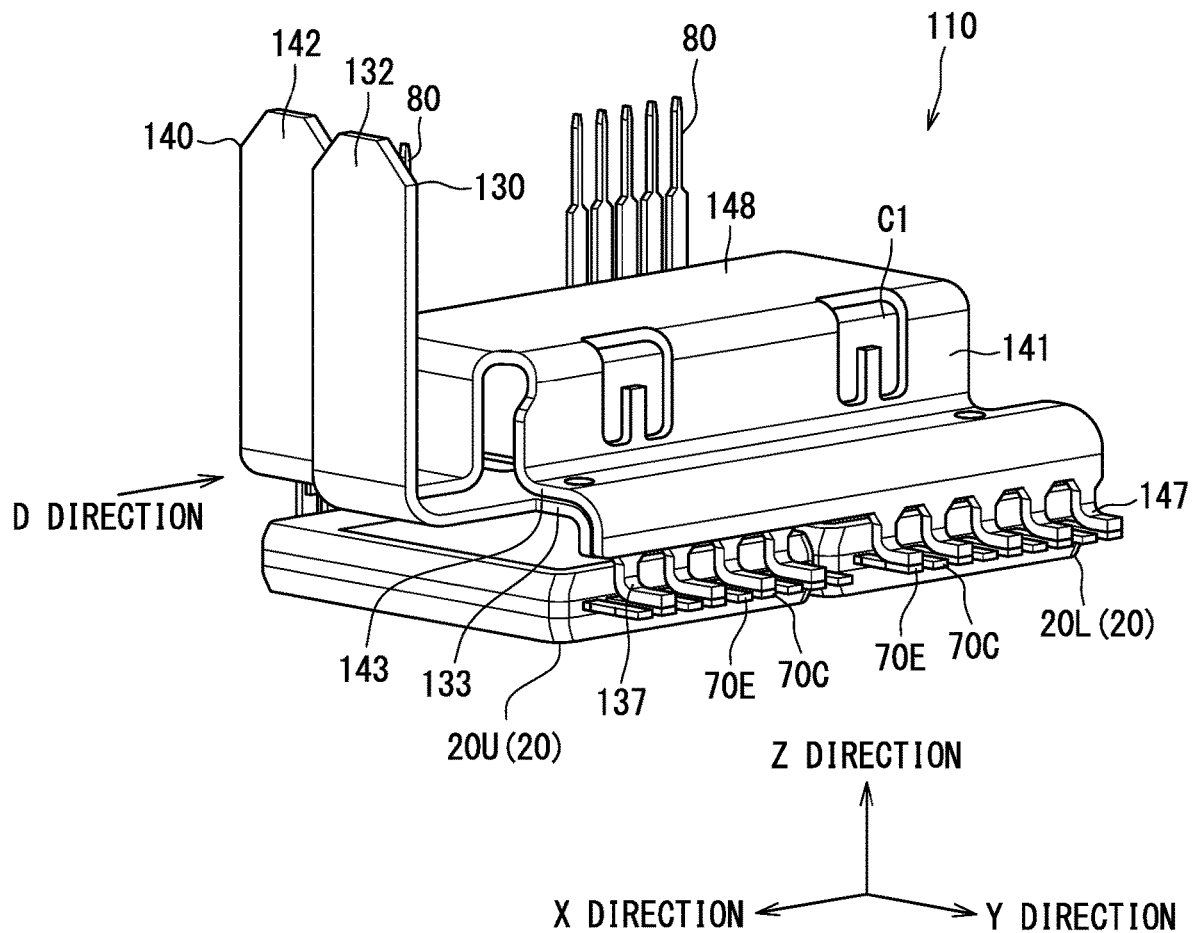
FIG. 39 is a perspective view showing a specific example of the power module.
Figure 40:
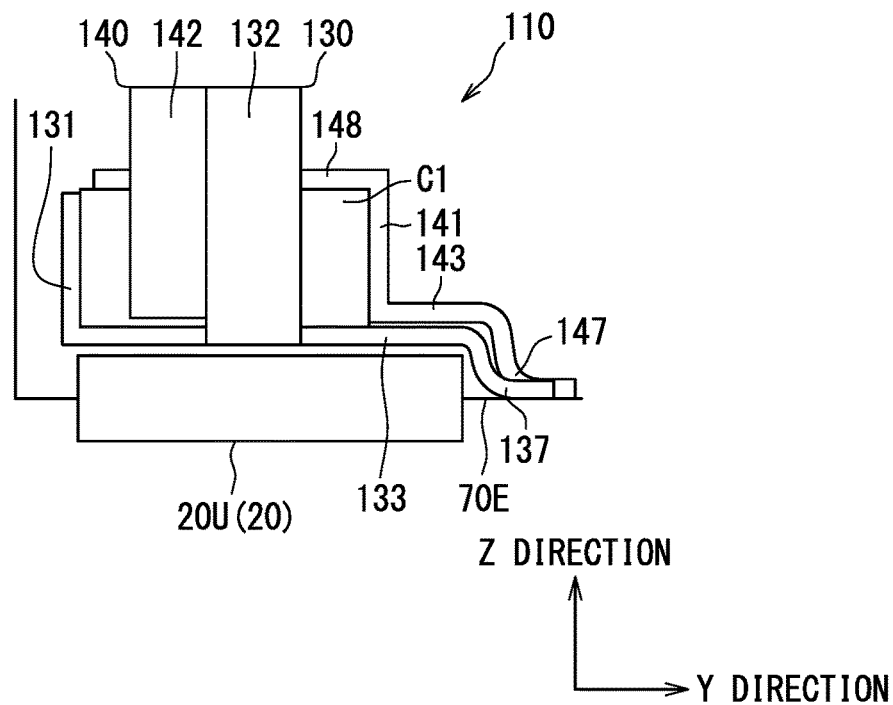
FIG. 40 is a plan view when

The power module 110 shown in FIG. 39 and FIG. 40 corresponds to the power module 110 shown in the preceding embodiment (see FIG. 30). The positive electrode terminal of the capacitor C1 is placed at the lateral surface close to the signal terminal 80 in the Y direction. The negative electrode terminal is placed at the lateral surface close to the main terminal 70 in the Y direction.

The P bus bar 130 includes the connection portion 131, the common wiring portion 132, the parallel wiring portion 133, and a connection portion 137. The common wiring portion 132 is placed close to one end of the capacitor C1 in the X direction that is the longitudinal direction of the capacitor C1. The common wiring portion 132 is connected to the parallel wiring portion 133. The common wiring portion 132 has one bent portion, and has a substantially L-shape in the ZX plane. The common wiring portion 132 has a portion of which thickness direction is substantially parallel to the Z direction and which extends from the parallel wiring portion 133 in the X direction, and a portion of which thickness direction is the X direction and which extends in the Z direction.

The parallel wiring portion 133 is placed close to the lower surface that is the facing surface of the capacitor C1 with the semiconductor device 20. The parallel wiring portion 133 is placed between the capacitor C1 and the semiconductor device 20. The parallel wiring portion 133 extends in the Y direction. In the Y direction, on the one end side of the parallel wiring portion 133, specifically, at a position close to the signal terminal 80, the connection portion 131 is connected. The connection portion 131 is bent with respect to the parallel wiring portion 133. The connection portion 131 is connected to the positive electrode terminal of the capacitor C1 in the Y direction. In the parallel wiring portion 133, an end opposite to the connection portion 131 is bent toward the main terminal 70. The parallel wiring portion 133 has a substantially L-shape in the YZ plane. The connection portion 137 is connected to a bent tip of the parallel wiring portion 133. The connection portion 137 has one bent portion, and has a substantially L-shape in the YZ plane. The connection portion 137 is connected to the main terminal 70C of the semiconductor device 20U. The P bus bar 130 has the connection portions 137. The number of connection portions 137 is same as the number (four) of main terminals 70C. The P bus bar 130 is formed of one metal plate without welding.

The N bus bar 140 includes the connection portion 141, the common wiring portion 142, the parallel wiring portion 143, a connection portion 147, and a join portion 148. The common wiring portion 142 is placed on the same side as the common wiring portion 132. The common wiring portion 142 has one bent portion, and has a substantially L-shape in the ZX plane. The common wiring portion 142 is not connected to the parallel wiring portion 143, and is connected to the join portion 148. The common wiring portion 142 has a portion of which thickness direction is substantially parallel to the Z direction and which extends from the join portion 148, and a portion of which thickness direction is the X direction and which extends in the Z direction. The extension portion of the common wiring portion 142 in the Z direction and the extension portion of the common wiring portion 132 in the Z direction are arranged in the Y direction. The extension portion of the common wiring portion 142 in the Z direction is placed at a position closer to, in the Z direction, the capacitor C1 than the extension portion of the common wiring portion 132 in the X direction. The lateral surface of a part of the common wiring portion 142 and the lateral surface of the extension portion of the common wiring portion 132 in the X direction face each other.

The join portion 148 is placed on the lateral surface of the capacitor C1 close to the common wiring portions 132 and 142, and is placed on an upper surface of the capacitor C1 opposite to a surface close to the semiconductor device 20. The common wiring portion 142 is connected to a lateral surface placement portion of the join portion 148, and the connection portion 141 is connected to an upper surface placement portion. The join portion 148 joins the common wiring portion 142 and the connection portion 141. The join portion 148 can be a part of the common wiring portion 142. The connection portion 141 is bent with respect to the upper surface placement portion of the join portion 148, and the negative electrode terminal of the capacitor C1 is connected. The parallel wiring portion 143 is connected to an end of the connection portion 141 opposite to the join portion 148.

The parallel wiring portion 143 extends in the Y direction. In the parallel wiring portion 143, an end opposite to the connection portion 141 is bent toward the main terminal 70. The parallel wiring portion 143 has a substantially L-shape in the YZ plane. The parallel wiring portion 143 is placed to face the parallel wiring portion 133. The connection portion 147 is connected to a bent tip of the parallel wiring portion 143. The connection portion 147 has one bent portion, and has a substantially L-shape in the YZ plane. The connection portion 147 is connected to the main terminal 70E of the semiconductor device 20L. The N bus bar 140 has the connection portions 147. The number of connection portions 147 is same as the number (five) of main terminals 70E. The N bus bar 140 is formed of one metal plate without welding.

In such a manner, in examples shown in FIG. 39 and FIG. 40, on the side of the P bus bar 130, the wiring resistance Rpb (wiring resistance Rpc) is satisfied. Thereby, it may be possible to reduce the heat amount generated by the DC current. In the N bus bar 140, a position of the connection portion 141 is closer to the common wiring portion 142 than that of the connection portion 147.

The N bus bar 140 is placed on the upper surface of the capacitor C1. The P bus bar 130 is placed on the lower surface. Thereby, it may be possible to improve the heat dissipation of the capacitor C1.

The output bus bar 150 (not shown) has the similar configuration to the preceding embodiment (FIG. 30). The connection portion of the output bus bar 150 to the outside is placed on the opposite side to the common wiring portions 132 and 142 in the X direction so as to sandwich the capacitor C1 between the output bus bar 150 and the common wiring portions 132 and 142. The output bus bar 150 extends so as to face (stack on) the join portion 148, the connection portion 141, and the parallel wiring portion 143. A connection portion is placed at the extension tip of the output bus bar 150. The connection portion connects the main terminal 70E of the semiconductor device 20U and the main terminal 70C of the semiconductor device 20L.

The cooler 120 (not shown) is placed so as to cool the semiconductor device 20 from both surfaces in the Z direction. One of the heat exchange portions 123 of the cooler 120 is placed between the semiconductor device 20 and the capacitor C1 via the parallel wiring portion 133 of the P bus bar 130.

Figure 41:
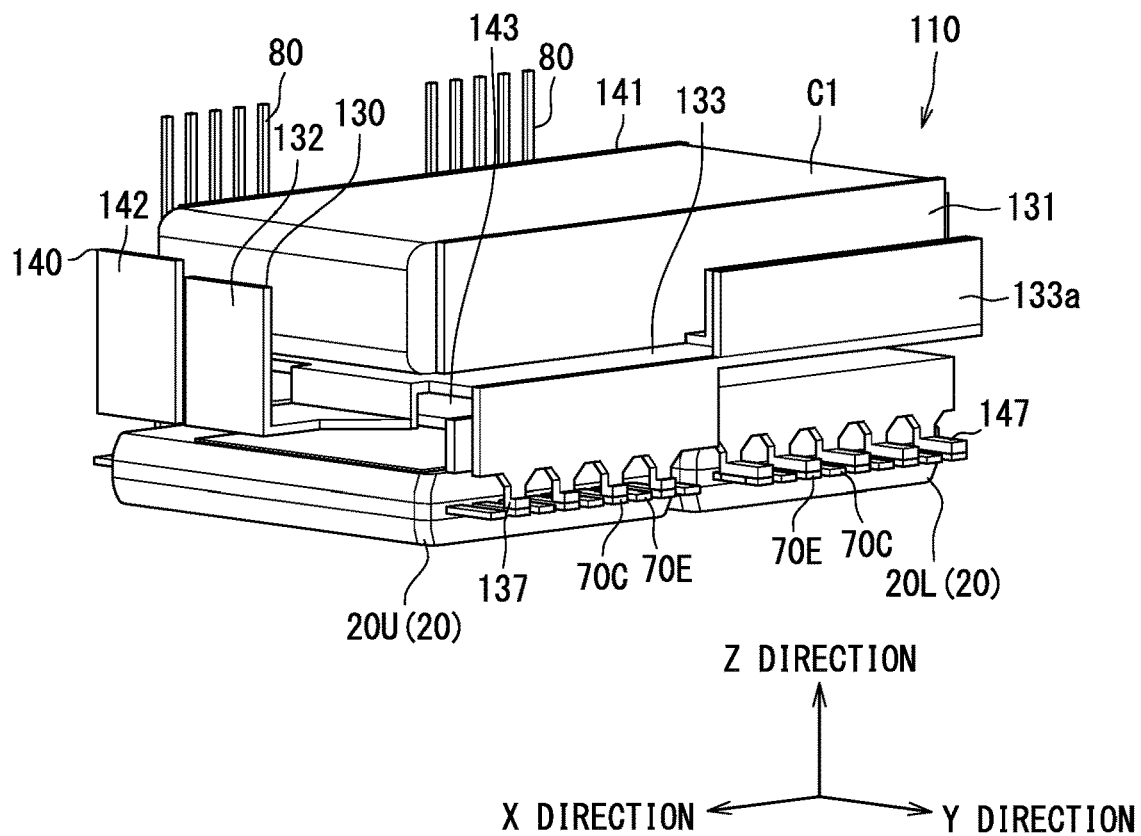
FIG. 41 is a perspective view showing another example of the power module.

In an example shown in FIG. 41, the placement of the terminal of the capacitor C1 is opposite to the configuration shown in FIG. 39. The negative electrode terminal of the capacitor C1 is placed on the lateral surface close to the signal terminal 80 in the Y direction. The positive electrode terminal is placed on the lateral surface close to the main terminal 70. The N bus bar 140 has the similar configuration to the P bus bar 130 of the example shown in FIG. 39. The N bus bar 140 includes the connection portion 141, the common wiring portion 142, the parallel wiring portion 143, and the connection portion 147. The common wiring portion 142 is connected to the parallel wiring portion 143. The parallel wiring portion 143 is placed between the lower surface of the capacitor C1 and the semiconductor device 20. The parallel wiring portion 143 extends in the Y direction, and is connected to the connection portion 141 on the side of the signal terminal 80. On the opposite side to the connection portion 141, the parallel wiring portion 143 is bent toward the main terminal 70. The connection portion 147 is connected to a bent tip of the parallel wiring portion 143.

The P bus bar 130 includes the connection portion 131, the common wiring portion 132, the parallel wiring portion 133, and the connection portion 137. The common wiring portion 132 is close to the positive electrode terminal in the Y direction, and is connected to the parallel wiring portion 133. The parallel wiring portion 133 is placed between the lower surface of the capacitor C1 and the semiconductor device 20. The parallel wiring portion 133 is placed between the parallel wiring portion 143 and the capacitor C1. The parallel wiring portion 133 extends in the Y direction. The end of the parallel wiring portion 133 close to the main terminal 70 is connected to the connection portions 131 and 137. In the X direction, in the end of the parallel wiring portion 133, a part close to the common wiring portions 132 and 142 is bent toward the main terminal 70. The bent tip of the parallel wiring portion 133 is connected to the connection portion 137. In the X direction, the remaining portion of the parallel wiring portion 133 extends in the Z direction, and is welded to be connected to a portion extending from the side of the connection portion 131. In the following, the welded portion of the parallel wiring portion 133 may be referred to as a welded portion 133a.

In a configuration shown in FIG. 41, the welded portion 133a is placed at the current path between the common wiring portion 132 and the connection portion 131, and a folded portion of the welded portion 133a is long. Thereby, the P bus bar 130 satisfies the wiring resistance Rpb (wiring resistance Rpc). In the N bus bar 140, a position of the connection portion 141 is closer to the common wiring portion 142 than that of the connection portion 147.

Instead of the configuration shown in FIG. 39 and FIG. 41, the wiring resistance Rnb (wiring resistance Rnc) may be satisfied in the N bus bar 140 and the connection portion 131 may be closer to the common wiring portion 132 than the connection portion 137 in the P bus bar 130.

Figure 42:
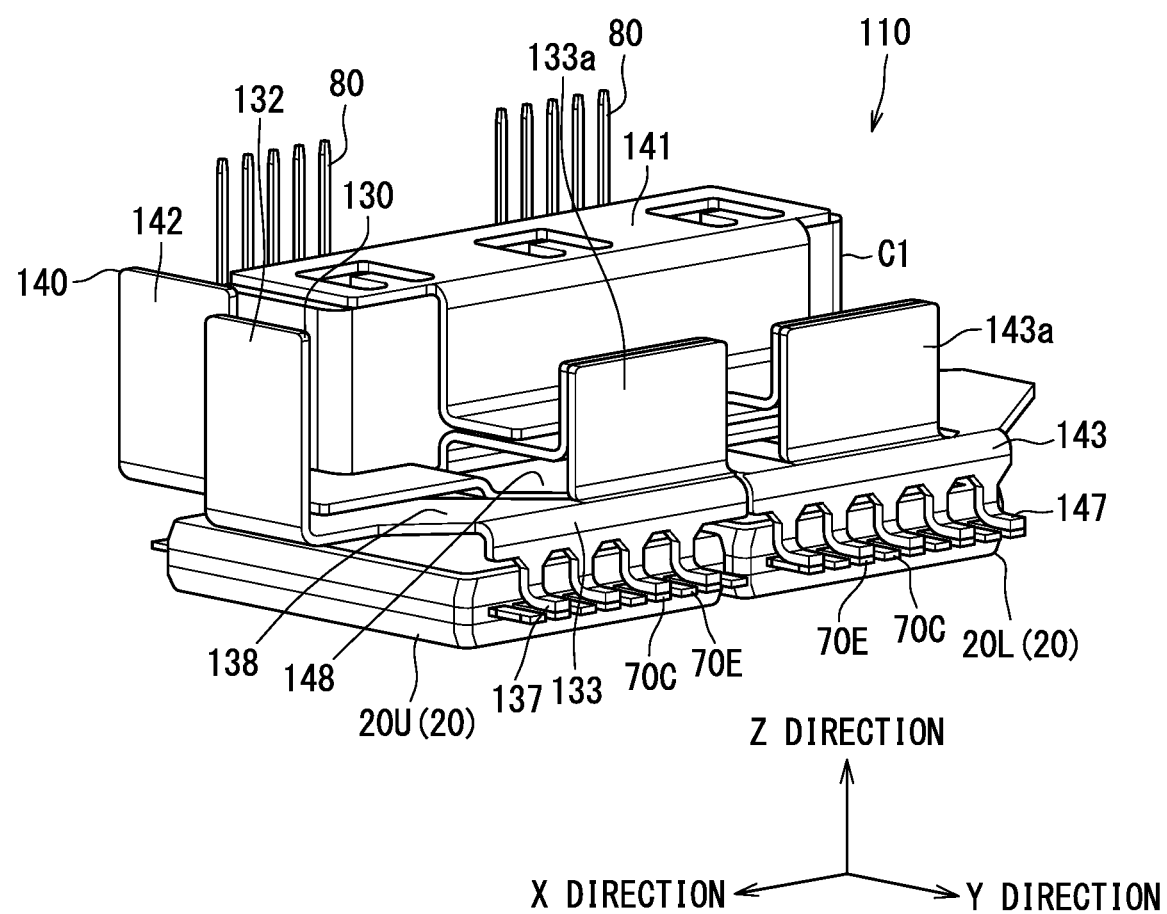
FIG. 42 is a perspective view showing another example of the power module.

In an example shown in FIG. 42, the positive electrode terminal of the capacitor C1 is placed on the lower surface close to the semiconductor device 20 in the Z direction. The negative electrode is placed on the upper surface opposite to the lower surface. The P bus bar 130 includes the connection portion 131 (not shown), the common wiring portion 132, the parallel wiring portion 133, the connection portion 137, and a join portion 138. The join portion 138 joins the common wiring portion 132 and the parallel wiring portion 133. The join portion 138 may be also referred to as a part of the common wiring portion 132. The join portion 138 extends in the XY plane. One end is connected to the common wiring portion 132. The other end is connected to the parallel wiring portion 133. The parallel wiring portion 133 has a bent portion similarly to FIG. 39. The bent tip is connected to the connection portion 137. The parallel wiring portion 133 has the welded portion 133a extending in the Z direction. The parallel wiring portion 133 extends from the welded portion 133a toward the capacitor C1 in the Y direction, and extends toward the lower surface of the capacitor C1 via the bent portion. The tip of the parallel wiring portion 133 is connected to the connection portion 131.

The N bus bar 140 includes the connection portion 141, the common wiring portion 142, the parallel wiring portion 143, the connection portion 147, and the join portion 148. The join portion 148 joins the common wiring portion 142 and the parallel wiring portion 143. A part of the join portion 148 faces the join portion 138. The parallel wiring portion 143 has a bent portion similarly to FIG. 39. The bent tip is connected to the connection portion 147. In the X direction, the bent portion of the parallel wiring portion 143 and the bent portion of the parallel wiring portion 133 are arranged. The parallel wiring portion 143 has a welded portion 143a extending in the Z direction. The parallel wiring portion 143 extends from the welded portion 143a toward the capacitor C1 in the Y direction, and extends toward the upper surface of the capacitor C1 via the bent portion. The tip of the parallel wiring portion 143 is connected to the connection portion 141. A part of the parallel wiring portion 143 faces the parallel wiring portion 133.

In such a manner, in the example shown in FIG. 42, on the side of the P bus bar 130, the wiring resistance Rpb (wiring resistance Rpc) is satisfied. On the side of the N bus bar 140, the wiring resistance Rnb (wiring resistance Rnc) is satisfied. The N bus bar 140 is placed on the upper surface of the capacitor C1. The P bus bar 130 is placed on the lower surface.

Figure 43:
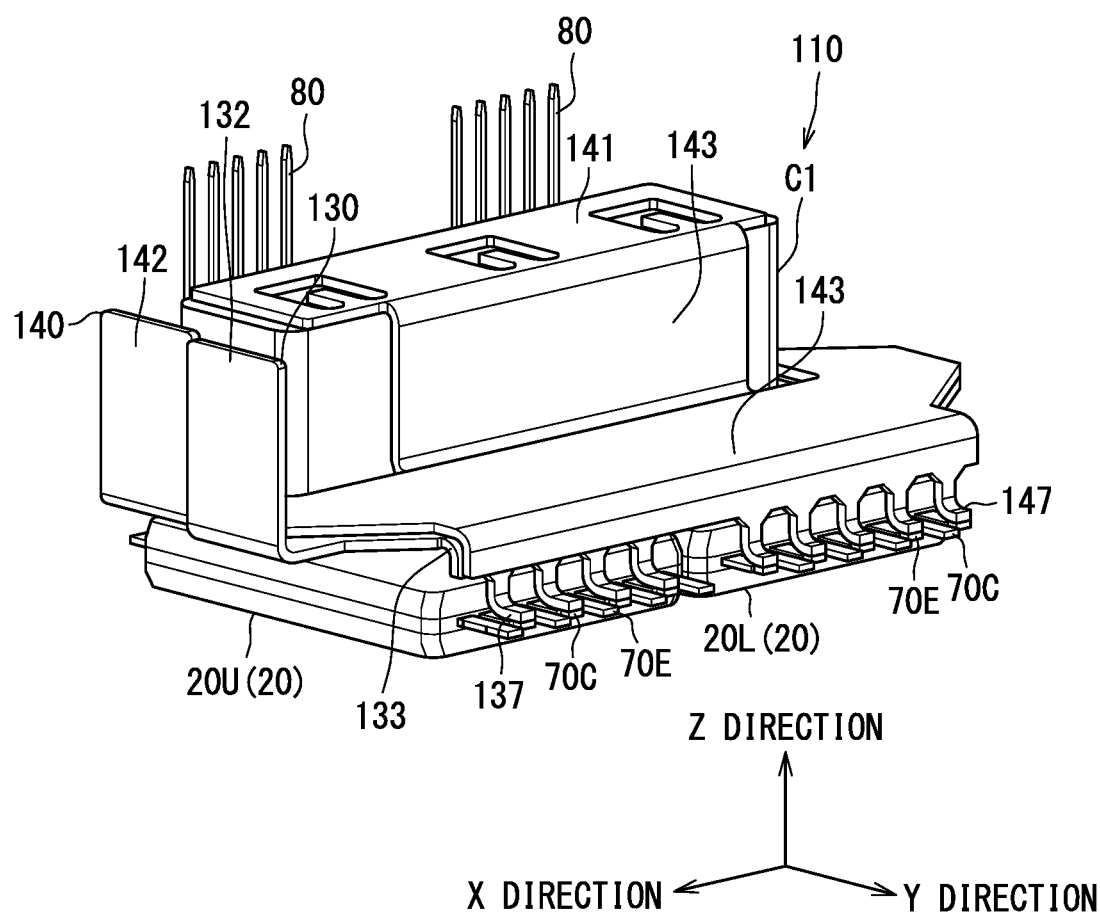
FIG. 43 is a perspective view showing another example of the power module.

In an example shown in FIG. 43, similarly to FIG. 42, the positive electrode terminal of the capacitor C1 is placed on the lower surface close to the semiconductor device 20 in the Z direction. The negative electrode is placed on the upper surface opposite to the lower surface. It differs from FIG. 42 in that the bus bars 130 and 140 do not have the weld portion. Similarly to the configuration shown in FIG. 39, the substantially entire lengths, in the X direction, of the bent portions of the parallel wiring portions 133 and 143 face each other. Thereby, in a region wider than that of the example shown in FIG. 42, the parallel wiring portions 133 and 143 face each other.

In the example shown in FIG. 43, on the side of the P bus bar 130, the wiring resistance Rpb (wiring resistance Rpc) is satisfied. On the side of the N bus bar 140, the wiring resistance Rnb (wiring resistance Rnc) is satisfied. The N bus bar 140 is placed on the upper surface of the capacitor C1. The P bus bar 130 is placed on the lower surface. Instead of the configurations shown in FIG. 42 and FIG. 43, the negative electrode terminal of the capacitor C1 may be placed on the lower surface and the positive electrode terminal may be placed on the upper surface.

Figure 44:
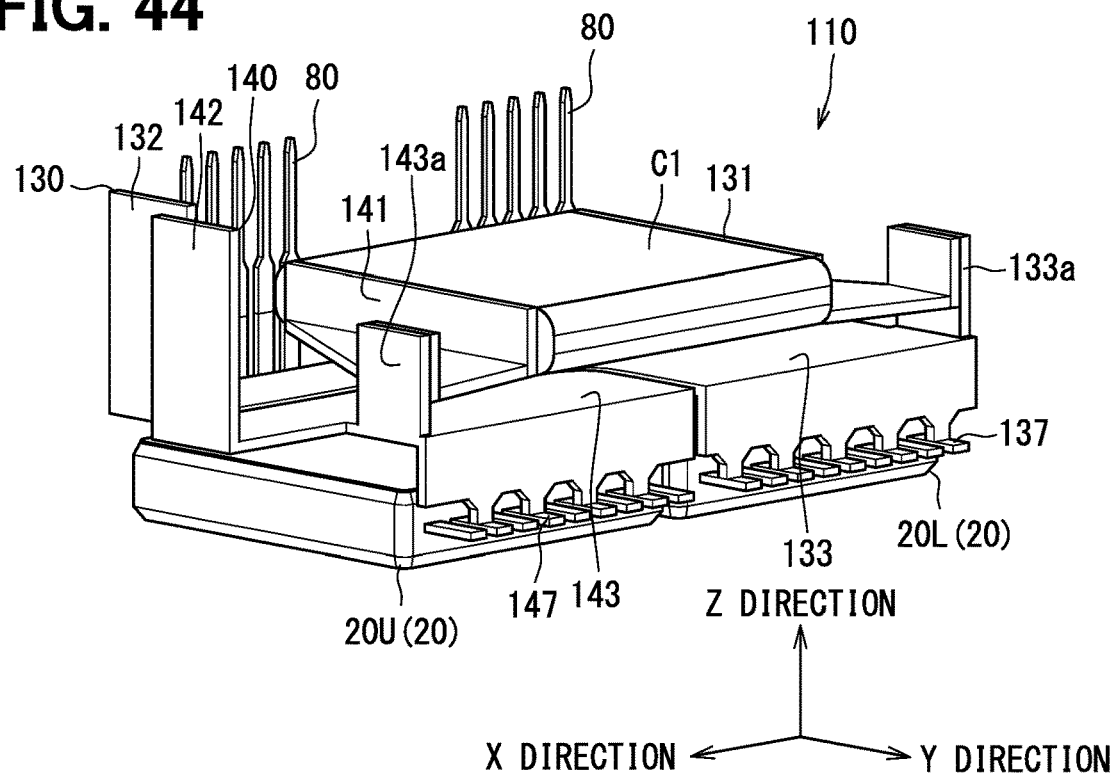
FIG. 44 is a perspective view showing another example of the power module.

In an example shown in FIG. 44, the negative electrode of the capacitor C1 is placed on the lateral surface close to the common wiring portions 132 and 142 in the X direction. The positive electrode terminal is placed on the lateral surface opposite to the negative electrode. In FIG. 44, for convenience, the main terminals 70C and 70E are omitted. In FIG. 44, similarly to FIG. 42, in the X direction, the bent portions of the parallel wiring portions 133 and 143 are arranged. The bent portion of the parallel wiring portion 133 is placed on the side farther from the common wiring portions 132 and 142. The bent tip of the parallel wiring portion 133 is connected to the connection portion 137. The parallel wiring portion 133 has the welded portion 133a. The parallel wiring portion 133 has a Z direction extension portion including the welded portion 133a and a portion extending toward the positive electrode terminal in the XY plane.

The bent portion of the parallel wiring portion 143 is placed on the side closer to the common wiring portions 132 and 142. The bent tip of the parallel wiring portion 143 is connected to the connection portion 147. The parallel wiring portion 143 has the welded portion 143a. The parallel wiring portion 143 has a Z direction extension portion including the welded portion 143a and a portion extending toward the negative electrode terminal in the XY plane.

In the example shown in FIG. 44, on the side of the P bus bar 130, the wiring resistance Rpb (wiring resistance Rpc) is satisfied. On the side of the N bus bar 140, the wiring resistance Rnb (wiring resistance Rnc) is satisfied. Instead of the configuration shown in FIG. 44, the positive electrode terminal of the capacitor C1 may be placed on the lateral surface close to the common wiring portions 132 and 142. The negative electrode may be placed on the lateral surface opposite to positive electrode terminal.

Fourth Embodiment

This embodiment is a modification example which is based on the preceding embodiments. The second embodiment has shown the example in which the power module 110 includes the current sensor 200. In this embodiment, a configuration capable of improving an accuracy of the current detection by the current sensor 200 will be described.

Figure 46:
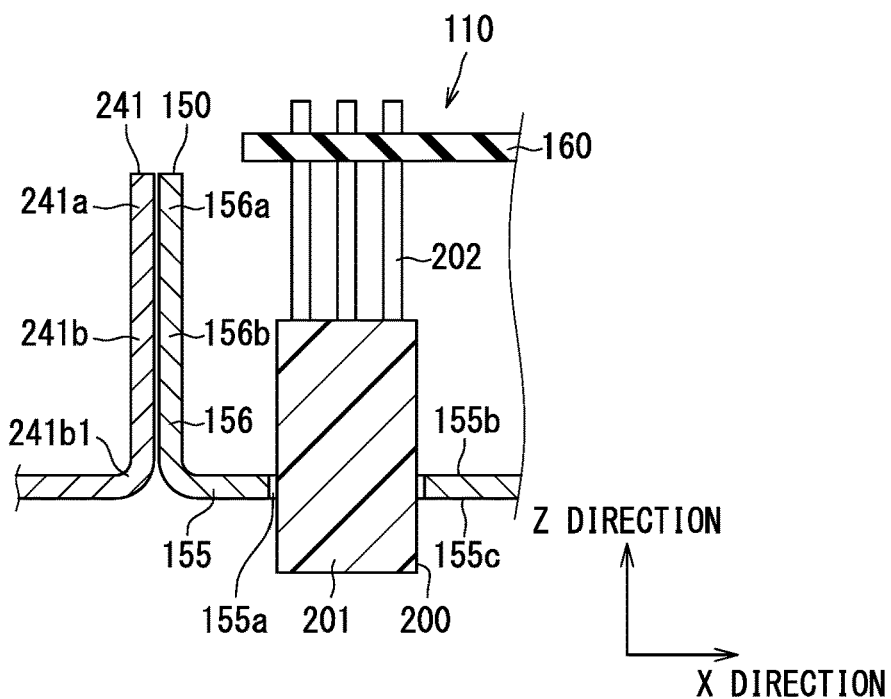
FIG. 46 is a cross-sectional view showing a periphery of a current sensor and an output bus bar in a power module according to a fourth embodiment.

As shown in FIG. 46, the power module 110 of the present embodiment includes the output bus bar 150, the drive substrate 160, and the current sensor 200. The output bus bar 150 corresponds to an output wiring. The power module 110 has the substantially similar structure to that of the second embodiment (see FIG. 30).

Although not shown, the power module 110 includes the semiconductor devices 20 (20U, 20L) configuring the upper-lower arm circuit 10. The main terminal 70E of the semiconductor device 20U configuring the upper arm 10U and the main terminal 70C of the semiconductor device 20L configuring the lower arm 10L are connected to the output bus bar 150.

Further, the power module 110 includes the capacitor C1, the cooler 120, the P bus bar 130, and the N bus bar 140. The capacitor C1, the P bus bar 130, the N bus bar 140, and the output bus bar 150 are integrated as the capacitor unit 190.

The output bus bar 150 has a detected portion 155 and a bent portion 156, as shown in FIG. 46. The detected portion 155 is a portion of the output bus bar 150 where the current sensor 200 detects the current. The main portion 201 of the current sensor 200 is placed so as to detect the current flowing through the detected portion 155.

The detected portion 155 extends in one direction. In the present embodiment, the detected portion 155 extends in the X direction. In the detected portion 155, a penetration portion 155a is formed. The penetration portion 155a penetrates between, in the detected portion 155, a first surface 155b and a second surface 155c that are plate surfaces. The penetration portion 155a is provided as a notch opening on the lateral surface. In the present embodiment, as the penetration portion 155a, a penetration hole is employed.

As shown in FIG. 30, the current sensor 200 is mounted on the drive substrate 160. The current sensor 200 extends from the drive substrate 160 toward the detected portion 155 in the Z direction. The main portion 201 is inserted into the recess 191a (see FIG. 30) of the case 191, and inserts the penetration portion 155a of the output bus bar 150. The main portion 201 is placed on the sides of both of the first surface 155b and the second surface 155c via the penetration portion 155a Although not shown, the electromagnetic conversion elements are arranged on the side of each of the first surface 155b and the second surface 155c.

The bent portion 156 is bent with respect to the detected portion 155. One end of the bent portion 156 is connected to the detected portion 155. The bent portion 156 extends in a direction different from the detected portion 155. The bent portion 156 of the present embodiment is the bent portion 156 at an angle of approximately 90 degrees with respect to the detected portion 155, and extends in the Z direction. The bent portion 156 has a terminal portion 156a and a facing portion 156b.

The terminal portion 156a is placed on an end opposite to one end connected to the detected portion 155 in the bent portion 156. The terminal portion 156a is a portion connected to a different member, that is, a member different from the elements configuring the power module 110. In the present embodiment, at the end of the output bus bar 150, the terminal portion 156a is placed.

The facing portion 156b extends from the terminal portion 156a towards the detected portion 155, and faces a different member together with the terminal portion 156a. The end of the facing portion 156b, specifically, the end farther from the detected portion 155 is connected to the terminal portion 156a. The facing portion 156b is a portion in a predetermined range from the terminal portion 156a in the bent portion 156. At least a part of the bent portion 156 other than the terminal portion 156a is the facing portion 156b.

In FIG. 46, as the different member, a bus bar 241 is exemplified. As described later, bus bars 241 and 251 correspond to different members. FIG. 46 shows a connection structure between the output bus bar 150 of the power module 110 and the bus bar 241. As described later, the bus bar 241 is an element configuring the electric power conversion device 5 together with the power module 110. The bus bar 241 has a terminal portion 241a and an extension portion 241b. The terminal portion 241a corresponds to a connection portion of the bus bar.

The terminal portion 241a is a portion of the terminal portion 156a of the output bus bar 150 in the bus bar 241. The terminal portion 156a and the terminal portion 241a are connected by welding or the like. The terminal portions 156a and 241a are connected in a preferable state where the plate surfaces face each other. The output bus bar 150 and the bus bar 241 are connection portions of the terminal portions 156a and 241a, and are mechanically and electrically connected. In the present embodiment, the terminal portion 241a is placed at the end of the bus bar 241. An extension length of the terminal portion 241a is substantially equal to an extension length of the terminal portion 156a.

The extension portion 241b is a portion extending from the terminal portion 241a. One end of the extension portion 241b is connected to the terminal portion 241a. A part of the extension portion 241b and the terminal portion 241a are placed to face the terminal portion 156a of the output bus bar 150 and the facing portion 156b. In the extension portion 241b, a predetermined portion from the terminal portion 241a is placed to face the facing portion 156b.

In the present embodiment, the extension portion 241b is bent at an angle of approximately 90 degrees in the middle of the path. The extension portion 241b has a bent portion 241b1. In the bus bar 241, a portion from the bent portion 241b1 towards the terminal portion 241a extends in the Z direction. A portion from the bent portion 241b1 to the opposite side extends in the X direction and in a direction away from the detected portion 155.

The output bus bar 150 and the bus bar 241 have the substantially same extension length including the corresponding terminal portions 156a and 241a in the Z direction. Specifically, the extension lengths of the extension portion 241b closer to the terminal portion 241a than the bent portion 241b1 and the terminal portion 241a are substantially equal to the extension lengths of the facing portion 156b and the terminal portion 156a. In the output bus bar 150 and the bus bar 241, portions extending in the Z direction due to bending substantially entirely face each other. It is preferable that the plate surfaces of the output bus bar 150 and the bus bar 241 face each other. The bus bar 251 has the similar configuration to the bus bar 241.

Figure 47:
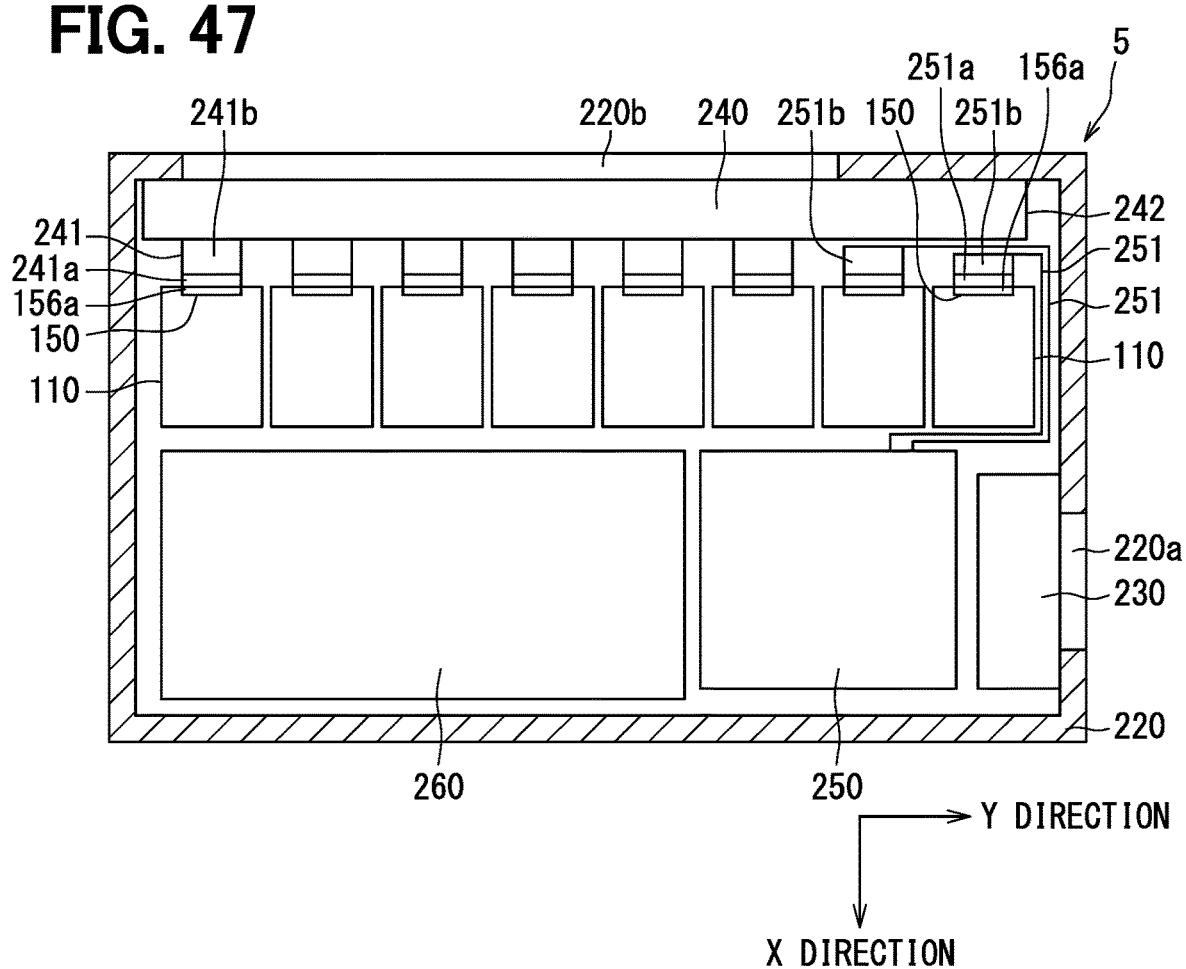
FIG. 47 is a partial cross-sectional diagram showing a schematic configuration of an electric power conversion device to which the power module is applied.

FIG. 47 schematically shows the electric power conversion device 5 of the power module 110 shown in FIG. 46. This electric power conversion device 5 has a connection structure between the output bus bar 150 and the bus bar 241 (and bus bar 251) shown in FIG. 46.

The electric power conversion device 5 includes a housing 220, an input terminal block 230, an output terminal block 240, a reactor module 250, and a capacitor module 260 in addition to the power module 110. Although the bus bar 251 is omitted to be shown, the electric power conversion device 5 further includes a control substrate on which a wiring member (for example, bus bar), a cooler, the control circuit portion 9 are formed. The wiring member electrically connects the elements configuring the electric power conversion device 5. The cooler cools the elements in the housing 220, for example, the power module 110, the reactor module 250, and the capacitor module 260.

The electric power conversion device 5 configures to eight upper-lower arm circuits 10 shown in the first embodiment (see FIG. 1). Therefore, the electric power conversion device 5 includes eight power modules 110. The electric power conversion device 5 includes the two power modules 110 configuring the converter 6, and the six power modules 110 configuring the inverters 7 and 8. The multiple power modules 110 are arranged in the Y direction, for example. The power module 110 are placed so that the output bus bars 150 are placed on the same side in the X direction.

The housing 220 accommodates the different elements configuring the power module 110. The housing 220 is configured by assembling multiple members. A typical example is a combination of a case and a cover. As the members configuring the housing 220, only metal members, only resin members, or a combination of the metal member and the resin member can be used. The housing 220 has a substantially rectangular plane shape.

The input terminal block 230 is a portion for electrically connecting the direct current power source 2 and the electric power conversion device 5. Although not shown, the input terminal block 230 has a positive electrode terminal, a negative electrode, and a housing holding the terminals. The positive electrode terminal is connected to the wiring member configuring the wiring member configuring the VL line 12L. The negative electrode terminal is connected to the wiring member configuring the N line 13. The input terminal block 230 is placed in the vicinity of one of the four corners of the housing 220. In a wall surface of the housing 220, an opening 220a is formed. The input terminal block 230 can be electrically connected to the direct current power source 2 via the opening 220a.

The output terminal block 240 is a portion for electrically connecting the motor generators 3 and 4 and the electric power conversion device 5. The output terminal block 240 has the multiple bus bars 241 connected to the multiple power modules 110 configuring the inverters 7 and 8 and a housing 242 holding these bus bars 241. The bus bar 241 may be referred to as an output terminal. The bus bar 241 configures at least a part of the output wiring 15. The output terminal block 240 is placed adjacent to one lateral wall, in the Y direction, of the housing 220. In this lateral wall, an opening 220b is formed. The output terminal block 240 can be electrically connected to the three-phase windings of the motor generators 3 and 4 via the opening 220b.

The bus bar 241 protrudes from the housing 242 to the opposite side to the lateral wall having the opening 220b. The protrusion portion of the bus bar 241 has a substantially L-shape in the ZX plane, as shown in FIG. 46. Each bus bar 241 is connected to the output bus bar 150 of the corresponding power module 110 in the connection manner.

The reactor module 250 configures the reactors R1 and R2 of the converter 6. The reactor module 250 and the capacitor module 260 are arranged in the Y direction. The reactor module 250 is placed adjacent to, for example, the input terminal block 230 in the Y direction. In the X direction, the power module 110 is placed between the reactor module 250 and the capacitor module 260, and the output terminal block 240.

The reactor module 250 has multiple terminals (not shown). The reactor module 250 is electrically connected to the wiring member configuring the VL line 12L via one terminal. The reactor module 250 is electrically connected to the output bus bar 150 of the power module 110 configuring the converter 6 via a bus bar 251 configuring another terminal and the boost wiring 14. The connection manner between the bus bar 251 and the output bus bar 150 is similar to that between the bus bar 241 and the output bus bar 150. The bus bar 251 has a terminal portion 251a and an extension portion 251b. The terminal portion 251a is connected to the terminal portion 156a of the output bus bar 150. The extension portion 251b has a bent portion in the middle of the path. A portion from the bent portion to the terminal portion 251a extends in the Z direction. The bus bars 241 and 251 correspond to the conductive members of the electric power conversion device 5.

The capacitor module 260 configures the smoothing capacitor C2 and the filter capacitor C3. The capacitor module 260 accommodates, for example, a film capacitor in the case. In the X direction, the reactor module 250 is placed between the capacitor module 260 and the input terminal block 230. In the Y direction, the power module 110 is placed between the capacitor module 260 and the output terminal block 240.

The capacitor module 260 has multiple terminals (not shown). The capacitor module 260 has terminals corresponding to the VH line 12H, the VL line 12L, and the N line 13. The capacitor module 260 is electrically connected to the wiring member configuring the VH line 12H via one terminal. The capacitor module 260 is electrically connected to the wiring member configuring the VL line 12L via another terminal. The capacitor module 260 is electrically connected to the wiring member configuring the N line 13 via another terminal.

In such a manner, in the present embodiment, the output bus bar 150 of the power module 110 is connected to the detected portion 155, and has the bent portion 156 extending in a direction different from the detected portion 155. Accordingly, as compared with a configuration excluding the bent portion, that is, a configuration extending from the detection portion in the X direction, it may be possible to prevent the size of the power module 110, thus, the electric power conversion device 5 from increasing.

Figure 48:
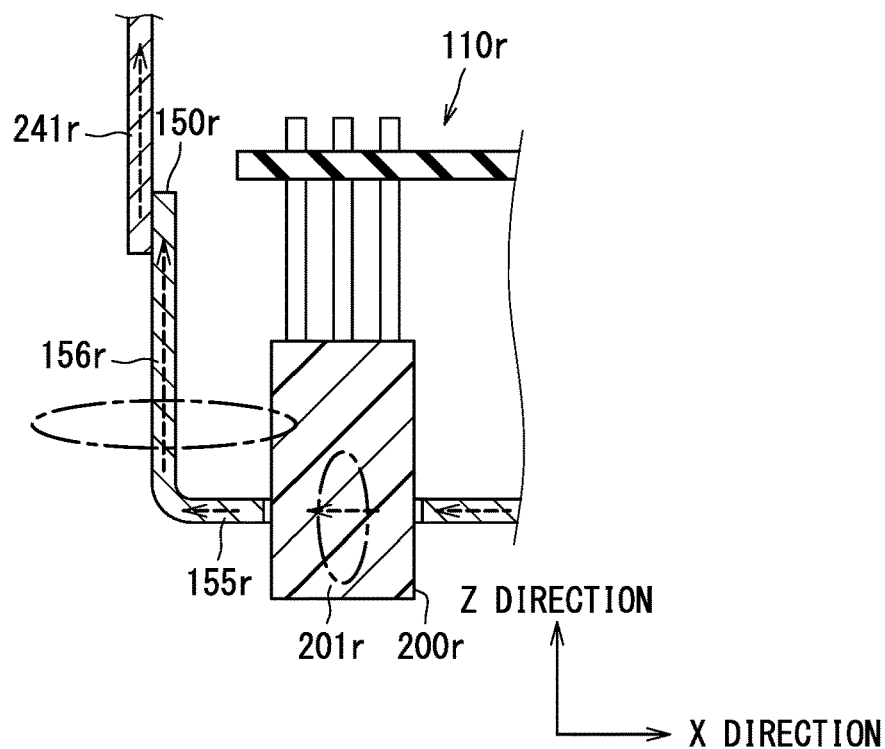
FIG. 48 is a cross-sectional view showing a reference example of the power module.

FIG. 48 is a cross-sectional view showing a reference example of the power module. In FIG. 48, the elements identical or related to the present embodiment are denoted by adding "r" to the tails of the reference numerals in the present embodiment. In FIG. 48, a current flow at a certain time is indicated by a broken arrow. A magnetic field due to the current is indicated by a dashed dotted line. Although the magnetic field is generated concentrically around the current, in FIG. 48, the concentric circles are shifted for easy understanding.

Also in a power module 110r shown in FIG. 48, an output bus bar 150r has a detected portion 155r and a bent portion 156r. A tip of the bent portion 156r is connected to a bus bar 241r. The bus bar 241r extends in the Z direction and in a direction away from the detected portion 155. Accordingly, not only a magnetic field due to the current flowing through the detected portion 155r but also a current flowing through the bent portion 156r act on an electromagnetic conversion element (not shown) of a current sensor 200. Therefore, the current detection accuracy by the current sensor 200 may be reduced.

Figure 49:
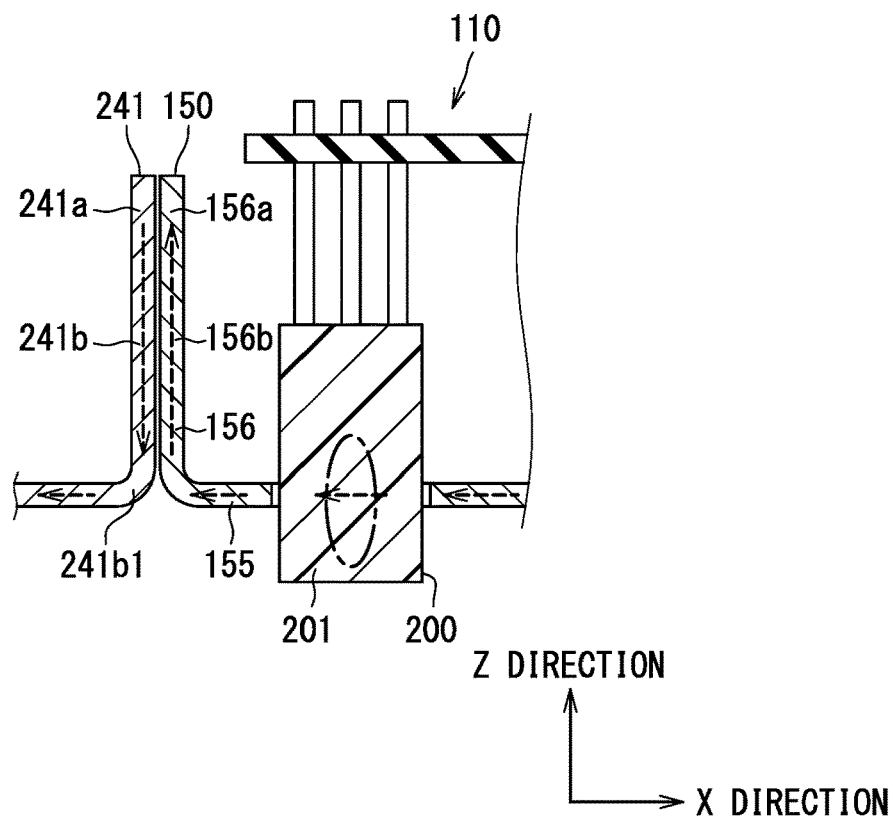
FIG. 49 is a cross-sectional diagram for illustrating an effect of the configuration shown in FIG. 46.

On the other hand, in the present embodiment, the bent portion 156 extends from the terminal portion 156a toward the detected portion 155 together with the terminal portion 156a connected to the bus bar 241, and has the facing portion 156b facing the bus bar 241 together with the terminal portion 156a. As shown in FIG. 49, in a state where the terminal portion 156a is connected to the terminal portion 241a, the terminal portion 156a and the facing portion 156b, and the terminal portion 241a and a part of the extension portion 241b have a folded structure. Therefore, the currents flow in the substantially opposite directions to each other.

Accordingly, the magnetic field due to the current flowing through the terminal portion 156a and the facing portion 156b can be canceled by the magnetic field due to the current flowing through the terminal portion 241a and a part of the extension portion 241b. As the result, it may be possible to prevent the magnetic field due to the current flowing to the bent portion 156 from acting on the current sensor 200 while having the bent portion 156. Accordingly, the current sensor 200 can accurately detect the current flowing through the detected portion 155. Although the bus bar 241 has been described, the similar applies to the bus bar 251. In FIG. 49, similarly to FIG. 48, the current is indicated by a broken arrow, and the magnetic field is indicated by a dashed dotted line.

As decrease above, according to the power module 110 and the electric power conversion device 5 of the present embodiment, it may be possible to prevent the size from increasing and prevent the reduction in the current detection accuracy that may be caused by the prevention of the increase.

Figure 50:
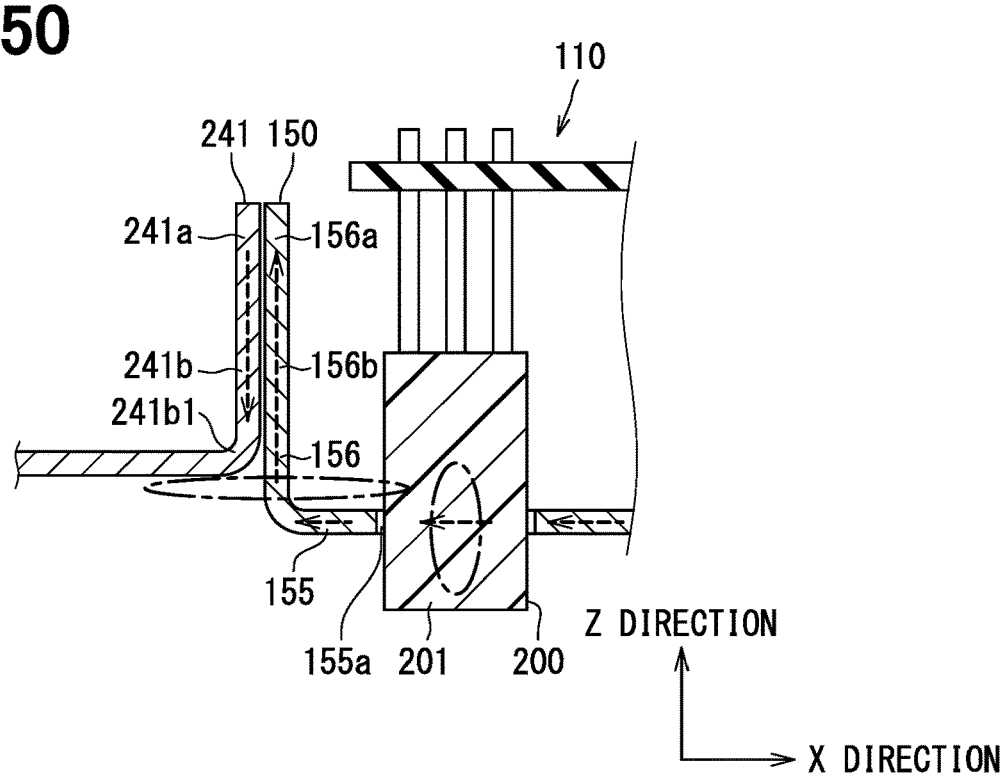
FIG. 50 is a cross-sectional view showing another example of the power module.

The facing portion 156b may be placed at at least a part of portion other than the terminal portion 156a in the bent portion 156. For example, an example shown in FIG. 50 may be employed. In FIG. 50, only a part of the bent portion 156 other than the terminal portion 156a is the facing portion 156b. The output bus bar 150 and the bus bar 241 have different extension lengths including the corresponding terminal portions 156a and 241a in the Z direction. Specifically, the extension lengths of the facing portion 156b and the terminal portion 156a are longer than the extension lengths of the extension portion 241b closer to the terminal portion 241a than the bent portion 241b1 and the terminal portion 241a. Also in the configuration shown in FIG. 50, at the facing portion between the output bus bar 150 and the bus bar 241, the magnetic fields can be canceled. Thereby, as compared with the configuration shown in FIG. 48, it may be possible to prevent the reduction in the current detection accuracy by the current sensor 200.

However, a part of the bent portion 156 does not face the Z direction extension portion of the bus bar 241. Therefore, it may be conceivable that the magnetic field by the current flowing through the non-facing portion of the bent portion 156 acts on the current sensor 200. Accordingly, as shown in FIG. 46 and FIG. 49, it is preferable that the output bus bar 150 and the bus bar 241 have the substantially same extension length including the corresponding terminal portions 156a and 241a in the Z direction. Specifically, it is preferable that the extension length of the extension portion 241b closer to the terminal portion 241a than the bent portion 241b1 and the terminal portion 241a is substantially equal to the extension length of the facing portion 156b and the terminal portion 156a. According to this, the Z direction extension portions of the output bus bar 150 and the bus bar 241 substantially entirely face each other. There is not the non-facing portion or is the slight non-facing portion. Accordingly, it may be possible to effectively prevent the magnetic field other than the detection target from acting on the current sensor 200. Thereby, it may be possible to further improve the current detection accuracy.

FIG. 50 has shown the bus bar 241. However, the similar configuration can apply to the bus bar 251. FIG. 50 has shown the example in which the Z direction extension portion of the output bus bar 150 (bent portion 156) is longer than that of the bus bar 241. However, it is not limited to this. The portion closer to the terminal portion 241a than the bent portion 241b1 may have the extension length longer than the extension length of the bent portion 156.

As the example to which the power module 110 is applied, the electric power conversion device 5 has been shown.

However, it is not limited to this. That is, the different member connected to the output bus bar 150 is not limited to the elements configuring the electric power conversion device 5. The different member is an element different from the power module 110 in a device including the power module 110.

Figure 51:
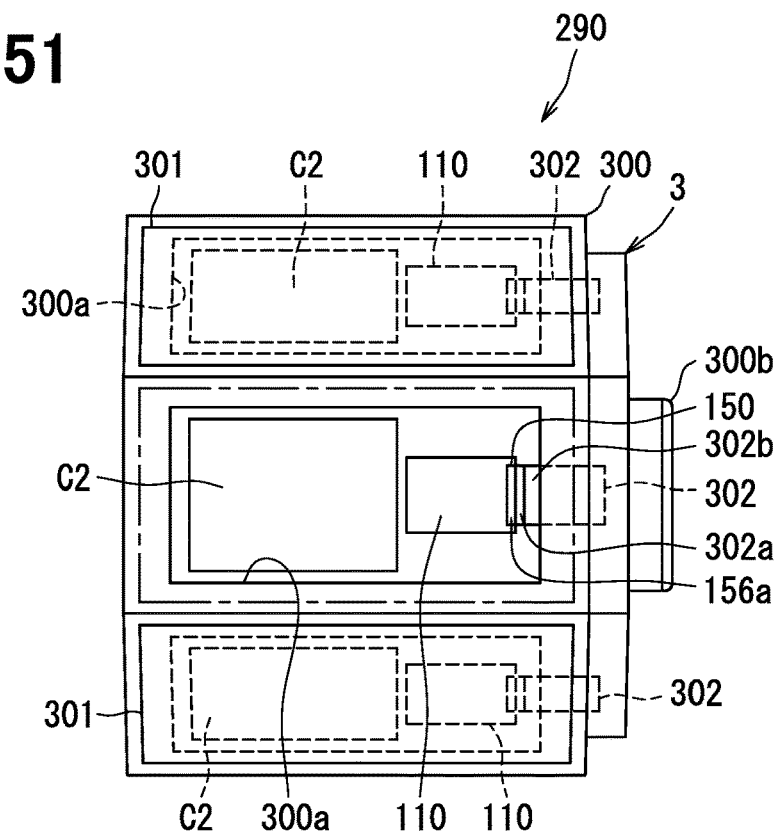
FIG. 51 is a diagram showing another example of a device to which the power module is applied.

For example, in an example shown in FIG. 51, the power module 110 is applied to a rotary electric machine unit 290. The rotary electric machine unit 290 includes, for example, three power modules 110 configuring the motor generator 3, the smoothing capacitor C2, and the inverter. The rotary electric machine unit 290 includes the converter 6 and the filter capacitor C3. The smoothing capacitor C2 and the power module 110 configure the electric power conversion device, and this electric power conversion device is integrated with the motor generator 3. The power module 110 has the structure shown in FIG. 46.

The motor generator 3 includes a housing 300 accommodating a stator (not shown) and a rotor (not shown) and a cover 301. At an outer surface of the housing 300, a recess 300*a* is formed. The recess 300*a* accommodates the smoothing capacitor C2 and the power module 110. In a state where the smoothing capacitor C2 and the power module 110 are accommodated, the recess 300*a* is closed by the cover 301. A reference number 300*b* indicates, in the housing 300, a tubular portion placed around the end of a rotation shaft of the motor generator 3.

In the present embodiment, the smoothing capacitor C2 is separated for each phase. The recess 300*a* is formed for each phase. One recess 300*a* of the housing 300 accommodates the smoothing capacitor C2 and the power module 110 configuring the upper-lower arm circuit 10 of the U phase. Another recess 300*a* accommodates the smoothing capacitor C2 and the power module 110 configuring the upper-lower arm circuit 10 of the V phase. Another recess 300*a* accommodates the smoothing capacitor C2 and the power module 110 configuring the upper-lower arm circuit 10 of the W phase. In FIG. 51, in order to show a structure in the recess 300*a*, for convenience, a dashed dotted line indicates the cover 301 corresponding to the power module 110 of the V phase placed in the center. For the remaining two phases, a solid line indicates the cover 301.

The motor generator 3 includes a wiring member electrically connecting a wiring of the stator accommodated in the housing and the output bus bar 150 of the power module 110. This wiring member includes a bus bar 302. The bus bar 302 is held by the housing 300, and one end protrudes into the recess 300*a*. In the recess 300*a*, the bus bar 302 is connected to the output bus bar 150. The connection manner between the output bus bar 150 of the power module 110 and the bus bar 302 is same as the connection manner between the output bus bar 150 and the bus bars 241 and 251.

The bus bar 302 protrudes, for example, from the lateral surface of the recess 300*a* into the recess 300*a*. The protrusion portion of the bus bar 302 has a substantially L-shape. Similarly to the bus bar 241, the bus bar 302 has a terminal portion 302*a* placed at the end and an extension portion 302*b* extending from the terminal portion 302*a*. The terminal portion 302*a* is connected to the terminal portion 156*a* of the output bus bar 150. The extension portion 302*b* has a bent portion (not shown), a portion closer to the terminal portion 302*a* than the bent portion extends in one direction, and the extension portion 302*b* faces the terminal portion 156*a* and the facing portion 156*b*. Accordingly, by canceling the magnetic fields, it may be possible to prevent the reduction in the current detection accuracy while preventing the increase in the size.

Similarly to FIG. 46, the extension length of the extension portion 302*b* and the terminal portion 302*a* closer to the terminal portion 302*a* than the bent portion in the bus bar 302 is substantially equal to the extension length of the facing portion 156*b* and the terminal portion 156*a*, and thereby it may be possible to further improve the current detection accuracy.

Other Embodiment

In the electric power conversion device 5, a part of the power module 110 may be inserted into a flow path of an external cooler that is different from the cooler 120 and placed outside the power module 110, and may be immersed in the refrigerant. For example, in the Y direction, only a part of the power module 110 may be immersed. Specifically, a placement part from the lateral surface 184 to the semiconductor device 20 and the capacitor C1 may be immersed, and the lateral surface 183 may not be immersed. Then, the output bus bar 150 may be routed in the protective member 180 so as to protrude from the lateral surface 183.

The example in which the electric power conversion device 5 configures the multi-phase converter 6, the inverters 7 and 8 for the motor generators 3 and 4, the smoothing capacitor C2, and the filter capacitor C3 has been shown. However, it is not limited to this. For example, the converter 6 is not limited to the multi-converter, and may be a single phase converter.

Figure 45:
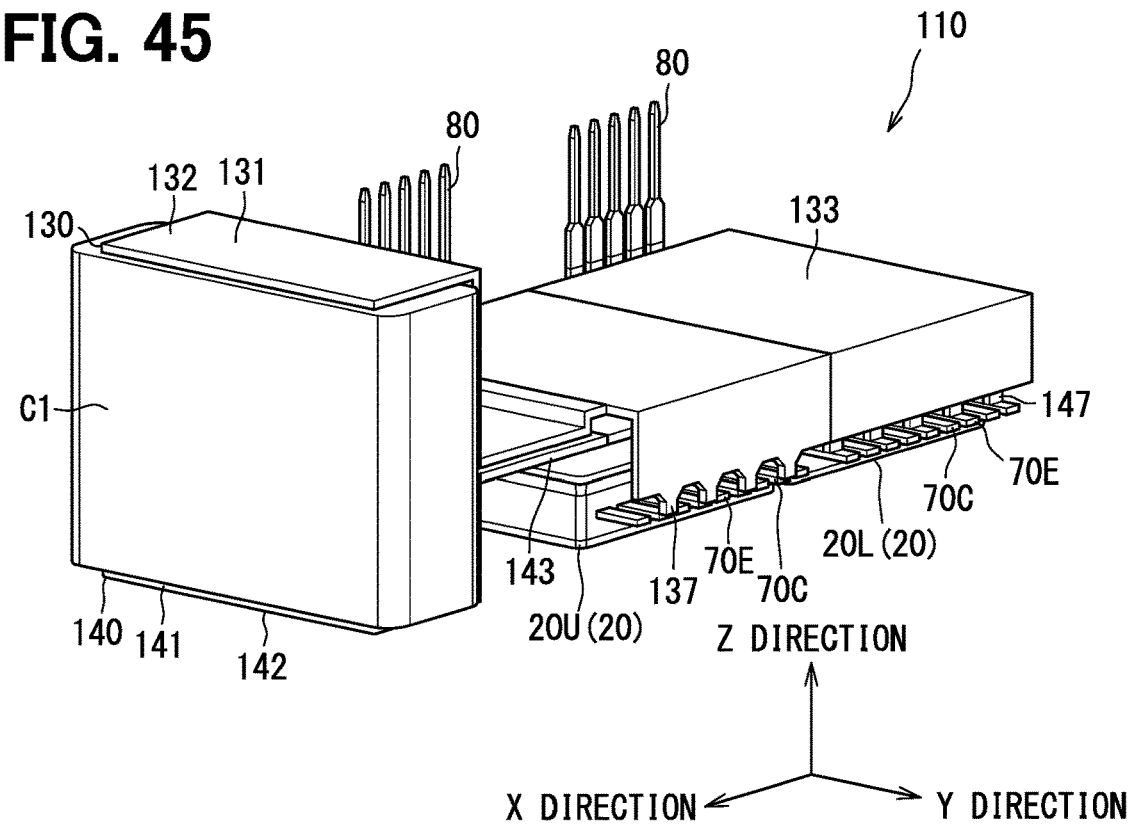
FIG. 45 is a perspective view showing another modification of the power module.

The example in which the capacitor C1, the heat exchange portion 123 of the cooler 120, the semiconductor device 20 are arranged in the Z direction has been shown. However, it is not limited to this. The capacitor C1 may be placed in the vicinity of the semiconductor device 20. For example, as shown in FIG. 45, in the X direction that is a direction in which the semiconductor devices 20U and 20L are arranged, the capacitor C1 and the semiconductor device 20 may be arranged. The capacitor C1 has the positive electrode terminal close to one surface in the Z direction, and the negative electrode close to a surface opposite to the one surface.

The P bus bar 130 includes the connection portion 131, the common wiring portion 132, the parallel wiring portion 133, and the connection portion 137. The common wiring portion 132 also serves as the connection portion 131. The parallel wiring portion 133 extends from the common wiring portion 132 along the front surface of the capacitor C1 in the Z direction. The parallel wiring portion 133 is bent in the middle of the capacitor C1 in the Z direction, and extends in the X direction and in a direction away from the capacitor C1. The parallel wiring portion 133 has a portion extending from one end of the X direction extension portion in the Y direction to the main terminals 70C and 70E in the Z direction. The connection portion 137 is placed at the tip of the parallel wiring portion 133.

The N bus bar 140 has the similar structure to the P bus bar 130. The N bus bar 140 includes the connection portion 141, the common wiring portion 142, the parallel wiring portion 143, and the connection portion 147. The common wiring portion 142 also serves as the connection portion 141. The parallel wiring portion 143 extends from the common wiring portion 142 along the front surface of the capacitor C1 in the Z direction. The parallel wiring portion 133 is bent in the middle of the capacitor C1 in the Z direction, and extends in the X direction and in a direction away from the capacitor C1. The parallel wiring portion 143 has a portion from one end of the X direction extension portion in the Y direction toward the main terminals 70C and 70E in the Z direction. The connection portion 147 is placed at the tip of the parallel wiring portion 143. The X direction extension portions of the parallel wiring portions 133 and 143 are placed to face each other. The Z direction extension portions of the parallel wiring portions 133 and 143 are connected to the connection portions 137 and 147, and face each other.

FIG. 45 also shows the semiconductor devices 20 (20U, 20L), the P bus bar 130, the N bus bar 140, and the capacitor C1 as elements configuring the power module 110. The power module 110 may include at least one of the cooler 120, the output bus bar 150, the drive substrate 160, or the protective member 180 in addition to the elements.

In the above, the embodiments, the configurations, the aspects of the power module and the electric power conversion device according to the present disclosure are exemplified. The present disclosure is not limited to the above-described embodiments, each configuration and each aspect related to the present disclosure. For example, embodiments, configurations, and aspects obtained from an appropriate combination of technical elements disclosed in different embodiments, configurations, and aspects are also included within the scope of the embodiments, configurations, and aspects of the present disclosure.

The invention claimed is:

1. A power module applied to an electric power conversion device in which a plurality of upper-lower arm circuits are connected to an electric power line in parallel, the power module comprising:
   the plurality of upper-lower arm circuits;
   a capacitor connected to each of the plurality of upper-lower arm circuits in parallel;
   an upper wiring that connects an upper arm configuring each of the plurality of upper-lower arm circuits and a positive electrode terminal of the capacitor;
   a lower wiring that connects a lower arm configuring each of the plurality of upper-lower arm circuits and a negative electrode of the capacitor;
   an upper electric power wiring that is an electric power wiring connected to the electric power line and connects a high potential line of the electric power line and the upper wiring;
   a lower electric power wiring that is an electric power wiring connected to the electric power line and connects a lower potential line of the electric power line and the lower wiring; and
   an output wiring that connects at least one of a plurality of main terminals of the upper arm and at least one of a plurality of terminals of the lower arm,
   wherein:
   the output wiring includes a facing portion that faces each of the upper wiring and the lower wiring,
   the facing portion includes a first facing portion that faces the upper wiring and a second facing portion that faces the lower wiring, and
   in the output wiring, a position of the first facing portion is different from a position of the second facing portion.

2. The power module according to claim 1, wherein:
   the upper arm includes a plurality of main terminals connected to the upper wiring; and
   the lower arm includes a plurality of main terminals connected to the lower wiring.

3. The power module according to claim 1, wherein:
   the upper electric power wiring and the lower electric power wiring are placed to face each other.

4. An electric power conversion device for a plurality of phases, comprising:
   the electric power line; and
   the power module according to claim 1,
   wherein:
   the power module is placed for each of the plurality of phases;
   the power module placed in a first phase among the plurality of phases is a first power module;
   the power module placed in a second phase among the plurality of phases is a second power module;
   in the first power module, an impedance of an electric path from the positive electrode terminal to the upper arm is an in-phase upper impedance;
   an impedance of an electric path from the positive electrode terminal corresponding to the first power module to the upper arm corresponding to the second power module is an interphase upper impedance; and
   the interphase upper impedance is higher than the in-phase upper impedance.

5. The electric power conversion device according to claim 4, further comprising:
   a smoothing capacitor that is connected to the upper-lower arm circuit in parallel, and smoothes a voltage of the electric power line.

6. The electric power conversion device according to claim 5, wherein:
   a capacity of the capacitor is smaller than a capacity of the smoothing capacitor.

7. An electric power conversion device for a plurality of phases, comprising:
   the electric power line; and
   the power module according to claim 1,
   wherein:
   the power module is placed for each of the plurality of phases;
   the power module placed in a first phase among the plurality of phases is a first power module;
   the power module placed in a second phase among the plurality of phases is a second power module;
   in the first power module, an impedance of an electric path from the negative electrode terminal to the lower arm is an in-phase lower impedance;
   an impedance of an electric path from the negative electrode terminal corresponding to the first power module to the lower arm corresponding to the second power module is an interphase lower impedance; and
   the interphase lower impedance is higher than the in-phase lower impedance.

8. The electric power conversion device according to claim 1, wherein:
   the upper arm includes at least one main terminal connected to the upper wiring;
   the lower arm includes at least one main terminal connected to the lower wiring; and
   either the at least one main terminal connected to the upper wiring or the at least one main terminal connected to the lower wiring includes a plurality of main terminals.

9. A power module applied to an electric power conversion device in which a plurality of upper-lower arm circuits are connected to an electric power line in parallel, the power module comprising:
   the plurality of upper-lower arm circuits;
   a capacitor connected to each of the plurality of upper-lower arm circuits in parallel;
   an upper wiring that connects an upper arm configuring each of the plurality of upper-lower arm circuits and a positive electrode terminal of the capacitor;

a lower wiring that connects a lower arm configuring each of the plurality of upper-lower arm circuits and a negative electrode of the capacitor;

an upper electric power wiring that is an electric power wiring connected to the electric power line and connects a high potential line of the electric power line and the upper wiring;

a lower electric power wiring that is an electric power wiring connected to the electric power line and connects a lower potential line of the electric power line and the lower wiring;

the upper-lower arm circuit includes a semiconductor device; and the power module further includes
- a case that includes a plurality of open ends and houses the semiconductor device and the capacitor,
- a cooler configured to cool the semiconductor device,
- a drive substrate configured to output a drive signal to the semiconductor device, and
- a sealing material that is filled in the case in a state where one of the plurality of ends is closed by at least one of the cooler or the drive substrate, and seals at least a part of the semiconductor device or at least a part of the capacitor.

10. A power module applied to an electric power conversion device in which a plurality of upper-lower arm circuits are connected to an electric power line in parallel, the power module comprising:

the plurality of upper-lower arm circuits;

a capacitor connected to each of the plurality of upper-lower arm circuits in parallel;

an upper wiring that connects an upper arm configuring each of the plurality of upper-lower arm circuits and a positive electrode terminal of the capacitor;

a lower wiring that connects a lower arm configuring each of the plurality of upper-lower arm circuits and a negative electrode of the capacitor;

an upper electric power wiring that is an electric power wiring connected to the electric power line and connects a high potential line of the electric power line and the upper wiring;

a lower electric power wiring that is an electric power wiring connected to the electric power line and connects a lower potential line of the electric power line and the lower wiring;

the upper wiring includes a first wiring portion from a connection point with a corresponding electric power wiring to a corresponding arm of the upper-lower arm circuit and a second wiring portion from the connection point to a terminal corresponding to the capacitor;

the lower wiring includes a first wiring portion from a connection point with a corresponding electric power wiring to a corresponding arm of the upper-lower arm circuit and a second wiring portion from the connection point to a terminal corresponding to the capacitor; and in at least one of the upper wiring or the lower wiring, a wiring resistance of the first wiring portion is smaller than a wiring resistance of the second wiring portion.

11. A power module applied to an electric power conversion device in which a plurality of upper-lower arm circuits are connected to an electric power line in parallel, the power module comprising:

the plurality of upper-lower arm circuits;

a capacitor connected to each of the plurality of upper-lower arm circuits in parallel;

an upper wiring that connects an upper arm configuring each of the plurality of upper-lower arm circuits and a positive electrode terminal of the capacitor;

a lower wiring that connects a lower arm configuring each of the plurality of upper-lower arm circuits and a negative electrode of the capacitor;

an upper electric power wiring that is an electric power wiring connected to the electric power line and connects a high potential line of the electric power line and the upper wiring;

a lower electric power wiring that is an electric power wiring connected to the electric power line and connects a lower potential line of the electric power line and the lower wiring;

the upper-lower arm circuit includes a semiconductor device;

the power module further includes
- a drive substrate configured to output a drive signal to the semiconductor device,
- an output wiring connected to an output terminal of the semiconductor device,
- a current sensor that is mounted on the drive substrate and is configured to detect a current flowing through the output wiring;

the output wiring extends in one direction, and includes
- a detected portion at which the current is detected by the current sensor and
- a bent portion that has a first end connected to the detected portion and extends in a different direction from the detection portion; and the bent portion includes
- a terminal portion that is placed on a second end opposite to the first end and is connected to a different member, and
- a facing portion that extends from the terminal portion towards the detection portion and faces the different member together with the terminal portion.

12. An electric power conversion device comprising:
the electric power line;
the power module according to claim 11; and
a conductive member that is the different member,
wherein:
the power module is placed for each of a plurality of phases;
the conductive member includes a connection portion connected to the terminal portion of the output wiring and an extension portion extending from the connection portion; and
the connection portion and a part of the extension portion in a predetermined region from the connection portion are placed to face the terminal portion of the output wiring and the facing portion.

13. The electric power conversion device according to claim 12, wherein:
the extension portion of the conductive member is bent in a middle of a path;
an extension length of the extension portion closer to the terminal portion than the bent portion and the terminal portion in the conductive member is equal to an extension length of the facing portion and the terminal portion in the output wiring.

* * * * *